(12) United States Patent
Mase et al.

(10) Patent No.: US 8,767,189 B2
(45) Date of Patent: Jul. 1, 2014

(54) SOLID STATE IMAGING DEVICE AND DISTANCE IMAGE MEASUREMENT DEVICE

(75) Inventors: Mitsuhito Mase, Hamamatsu (JP);
Seiichiro Mizuno, Hamamatsu (JP);
Mitsutaka Takemura, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 908 days.

(21) Appl. No.: 12/674,199

(22) PCT Filed: Aug. 22, 2008

(86) PCT No.: PCT/JP2008/065049
§ 371 (c)(1),
(2), (4) Date: Mar. 16, 2010

(87) PCT Pub. No.: WO2009/025373
PCT Pub. Date: Feb. 26, 2009

(65) Prior Publication Data
US 2010/0231891 A1    Sep. 16, 2010

(30) Foreign Application Priority Data
Aug. 22, 2007  (JP) ................. 2007-216517

(51) Int. Cl.
*G01C 3/08*  (2006.01)
(52) U.S. Cl.
USPC ........ 356/5.01; 356/3.01; 356/4.01; 257/225; 257/234; 257/440
(58) Field of Classification Search
USPC ................ 356/3.01–5.01; 257/225, 234, 440
See application file for complete search history.

(56) References Cited

U.S. PATENT DOCUMENTS

| 3,969,634 | A | * | 7/1976 | Su et al. ........................... 377/57 |
| 5,003,565 | A | * | 3/1991 | Yoshida ........................... 377/60 |
| 6,373,557 | B1 | | 4/2002 | Mengel et al. |
| 7,781,811 | B2 | * | 8/2010 | Kawahito et al. ............. 257/292 |
| 7,876,422 | B2 | * | 1/2011 | Hashimoto et al. .......... 356/4.07 |

(Continued)

FOREIGN PATENT DOCUMENTS

| CN | 1624929 | 6/2005 |
| JP | S63-296266 | 12/1988 |

(Continued)

OTHER PUBLICATIONS

Buttgen, B. et al., "High-Speed and High-Sensitive Demodulation Pixel for 3D-Imaging," Proceedings of SPIE, SPIE-International Society for Optical Engineering, U.S., vol. 6056, Jan. 26, 2006, pp. 605603-1-605603-12.

*Primary Examiner* — Isam Alsomiri
*Assistant Examiner* — Assres H Woldemaryam
(74) *Attorney, Agent, or Firm* — Drinker Biddle & Reath LLP

(57) ABSTRACT

A pair of first gate electrodes IGR, IGL are provided on a semiconductor substrate 100 so that potentials $\phi_{TX1}$, $\phi_{TX2}$ between a light-sensitive area SA and a pair of first accumulation regions AR, AL alternately ramp. A pair of second gate electrodes IGR, IGL are provided on the semiconductor substrate 100 so as to control the height of first potential barriers $\phi_{BG}$ each interposed between the first accumulation region AR, AL and a second accumulation region FDR, FDL, and increase the height of the first potential barrier $\phi_{BG}$ to carriers as a higher output of a background light is detected by a photodetector.

4 Claims, 37 Drawing Sheets

(56) References Cited

U.S. PATENT DOCUMENTS

| | | | |
|---|---|---|---|
| 8,134,690 B2* | 3/2012 | Tachino et al. | 356/4.01 |
| 2003/0209712 A1* | 11/2003 | Fujita et al. | 257/72 |
| 2005/0116259 A1* | 6/2005 | Komori | 257/222 |
| 2005/0168604 A1* | 8/2005 | Mishina et al. | 348/294 |
| 2005/0178946 A1* | 8/2005 | Hashimoto et al. | 250/208.1 |
| 2005/0263804 A1* | 12/2005 | Yoshihara | 257/291 |
| 2005/0280075 A1* | 12/2005 | Ema et al. | 257/315 |
| 2006/0192938 A1* | 8/2006 | Kawahito | 356/5.03 |
| 2007/0103569 A1* | 5/2007 | Kawahito | 348/241 |
| 2007/0103748 A1* | 5/2007 | Hashimoto et al. | 359/15 |
| 2007/0158770 A1* | 7/2007 | Kawahito | 257/431 |
| 2007/0200148 A1* | 8/2007 | Hirata et al. | 257/222 |
| 2008/0012975 A1* | 1/2008 | Sato et al. | 348/296 |
| 2009/0230437 A1* | 9/2009 | Kawahito et al. | 257/226 |
| 2010/0073541 A1* | 3/2010 | Kawahito | 348/311 |
| 2011/0226935 A1* | 9/2011 | Kawahito et al. | 250/208.1 |
| 2011/0298079 A1* | 12/2011 | Kawahito | 257/443 |

FOREIGN PATENT DOCUMENTS

| | | | | |
|---|---|---|---|---|
| JP | H4-268764 | 9/1992 | | |
| JP | 2005-235893 | 9/2005 | | |
| JP | 2009-047658 | 3/2009 | | |
| JP | 2009-047659 | 3/2009 | | |
| JP | 2009-047660 | 3/2009 | | |
| JP | 2009-047661 | 3/2009 | | |
| WO | 2006/010284 | 2/2006 | | |
| WO | 2007/026777 | 3/2007 | | |
| WO | WO 2007/026779 | 3/2007 | | |
| WO | WO2007/026779 | * 3/2007 | | G01S 17/10 |
| WO | 2007/055375 | 5/2007 | | |
| WO | WO2007/055375 | * 5/2007 | | G01C 3/06 |
| WO | WO 2007/119626 | 10/2007 | | |
| WO | WO 2008//069141 | 6/2008 | | |

* cited by examiner

Fig.23
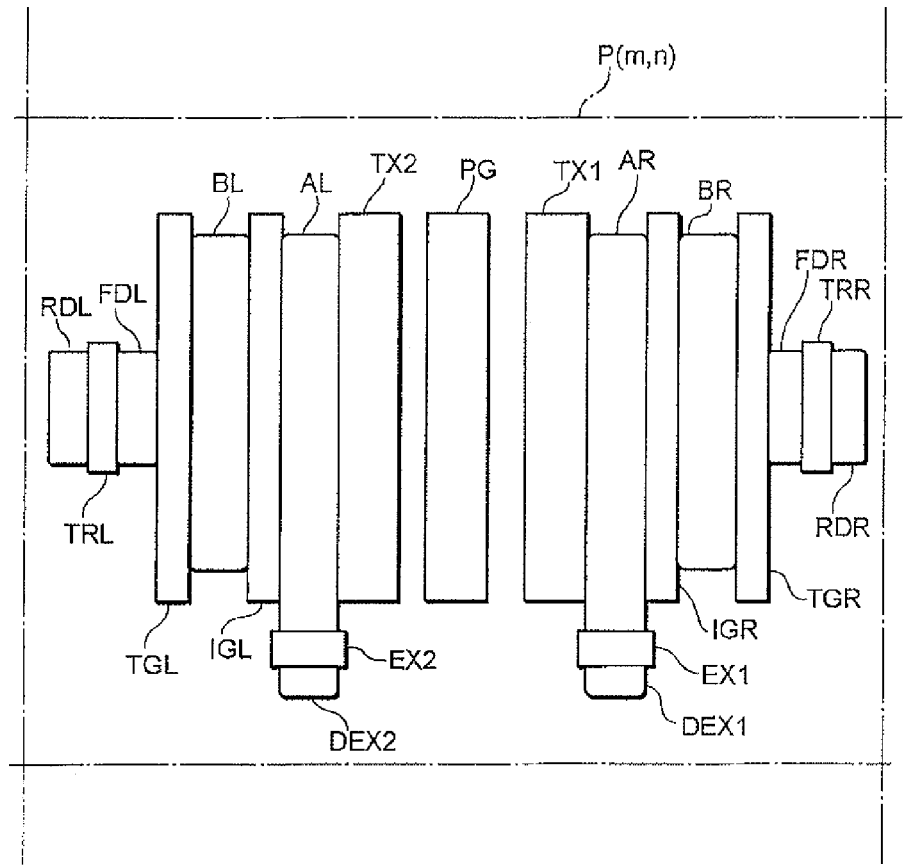
(A)
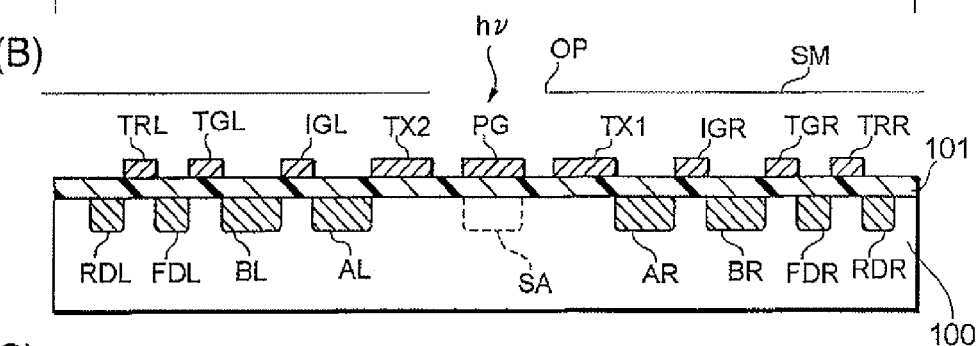
(B)
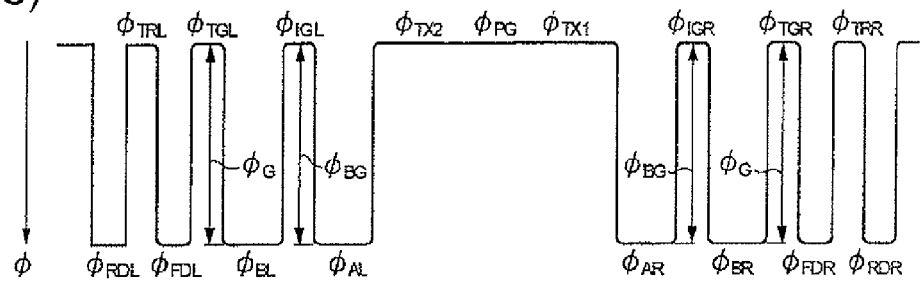
(C)

Fig.31
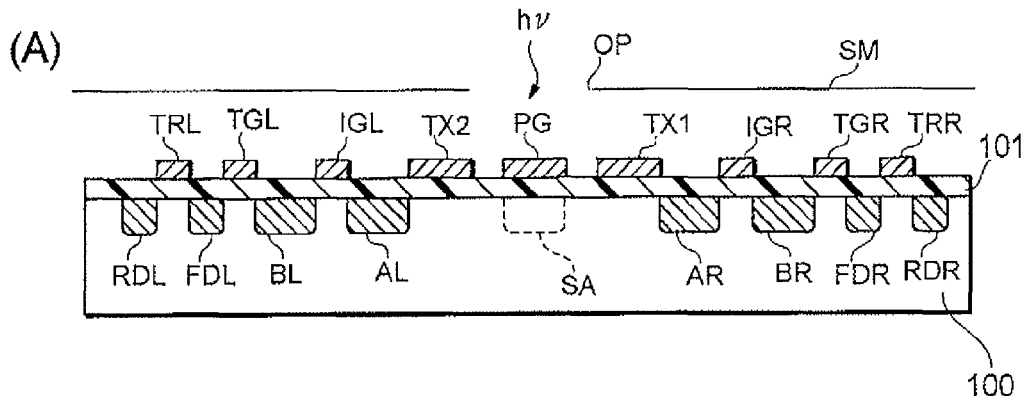
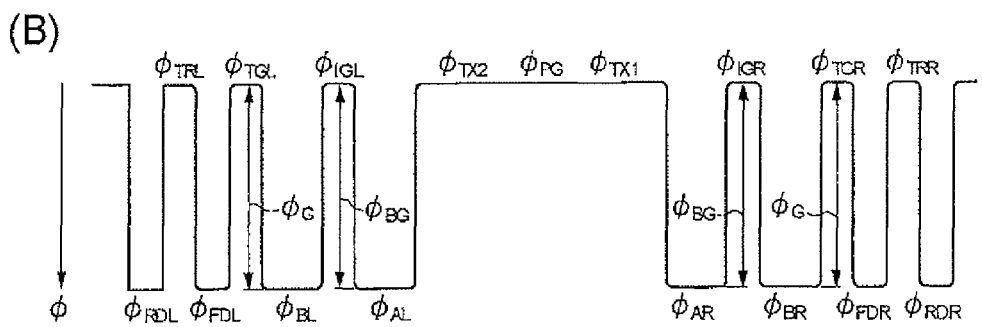
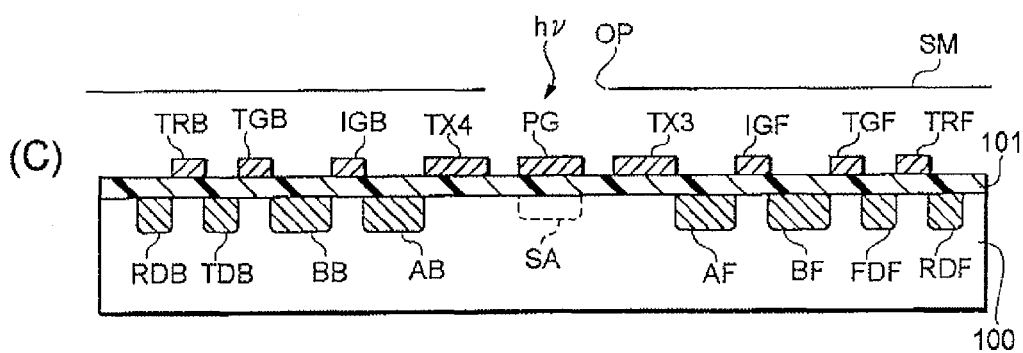
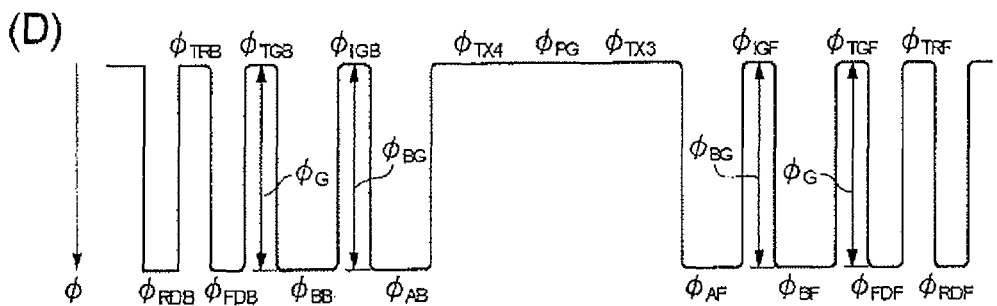

SOLID STATE IMAGING DEVICE AND DISTANCE IMAGE MEASUREMENT DEVICE

TECHNICAL FIELD

The present invention relates to a solid state imaging device and a distance image measurement device.

BACKGROUND ART

The following Patent Document 1 discloses a TOF (Time Of Flight) type distance image measurement device. This distance image measurement device repeatedly emits a probe light having a predetermined pulse width toward a subject and measures a period of time from an emission time to a return time of the probe light, that is, a time of flight of the probe light to thereby measure a three-dimensional distance image up to the subject. In this device, a phase difference between pulses at an emission and pulses at a return of a probe light is measured as a time of flight.

Time of flight measuring methods include one that determines a ratio of the amount of charge accumulated in a plurality of accumulation regions formed in each pixel. In Patent Document 2, the accumulation timings in the charge accumulation regions are differentiated. The ratio of the amount of charge generated in each accumulation region due to incidence of one reflected pulse light is proportional to the time of flight, by eliminating a background light component. For example, an accumulation timing in one accumulation region is set in accordance with the period of time from a rising time to a falling time of probe light pulses, and an accumulation timing in the other accumulation region is set in accordance with the period of time from a falling time and a rising time. In this case, with zero time of flight, if the amount of accumulated charge in one accumulation region is 100%, the amount of accumulated charge in the other accumulation region is 0%, so that the distance up to a target is zero. The longer the time of flight, the more the ratio of the amount of accumulated charge in the other accumulation region increases, and thus the distance up to a target is determined according to the ratio of the charge amount.

Patent Document 1: U.S. Pat. No. 6,373,557 specification
Patent Document 2: International Publication No. WO 2006/010284 pamphlet

DISCLOSURE OF THE INVENTION

Problem to be Solved by the Invention

However, in the distance image measurement device described in Patent Document 2, four potential depths within individual pixels are simultaneously controlled, and at a point in time where carriers have flooded from all potential wells, the ratio of the charge amount of flooded carriers is calculated, so that there is a problem of complicating the device.

The present invention has been made in view of such problems, and an object thereof is to provide a solid state imaging device and a distance image measurement device capable of a distance image measurement with a simple configuration.

Means for Solving the Problem

In order to solve the above-described problems, a solid state imaging device according to the present invention is a solid state imaging device including photo-detection means for detecting a background light, and an imaging region consisting of a plurality of pixels, in which each of the pixels includes a light-sensitive area provided in a semiconductor substrate, a pair of first accumulation regions provided in the semiconductor substrate, a pair of first gate electrodes provided on the semiconductor substrate so that potentials between the light-sensitive area and a pair of the first accumulation regions alternately ramp, a pair of second accumulation regions provided in the semiconductor substrate, and a pair of second gate electrodes that are provided on the semiconductor substrate so as to control the height of first potential barriers each interposed between the first accumulation region and the second accumulation region, and increase the height of the first potential barrier to carriers as a higher output of a background light is detected by the photo-detection means.

In addition, the height of the potential barrier is, when the carriers are electrons, increased relative to a potential where electrons exist, by decreasing the potential, and reduced by increasing the potential. Alternatively, when the carriers are holes, the height of the potential barrier is, relative to a potential where holes exist, increased by increasing the potential, and is reduced by decreasing the potential.

When a pulsed probe light for distance detection is irradiated onto a target and voltages where the foregoing potential ramp alternately occurs are applied to the first gate electrodes, the charge amount of carriers to be accumulated in one first accumulation region is reduced, and the charge amount of carriers to be accumulated in the other first accumulation region is increased, in proportion to a delay at the incidence of a reflected light of a probe light. More specifically, the ratio of these charge amounts of accumulated carriers depends on the delay time, that is, time of flight (TOF). As a matter of course, when the number of first accumulation regions is three or more, the ratio of carriers flowing in each first accumulation regions from the light-sensitive area depends on the phases of application voltages to potential ramping electrodes interposed between these, and the carrier accumulation changes in amount by a shift in phase. In addition, the charge amount of carriers accumulated in the first accumulation region contains a carrier component generated in response to a background light component, so that the ratio of carriers after elimination of carriers corresponding to the background light component indicates the distance. Moreover, the probe light is not limited to be pulsed but may also be sinusoidal. In that case, the voltages to be applied to the first gate electrodes are also made sinusoidal.

Here, if output of a background light detected by the photo-detection means is high, the second gate electrode increases the height of the first potential barrier to carriers. The first potential barrier is interposed between the first accumulation region and the second accumulation region, the number of carriers flowing in the second accumulation region from the first accumulation region is reduced as the background light becomes higher. More specifically, appropriately controlling the voltage to be applied to the second gate electrode according to the size of a background light makes it possible to simply block carriers corresponding to the background light by the first potential barrier and allow only a reflected light component of a probe light from the target to flow in the second accumulation region. The height of the first potential barrier may be reduced (1) after performing this measurement (accumulation period of time of carriers into the first accumulation region) after detecting a background light, or may be reduced in advance (2) before performing this measurement (accumulation period of time of carriers into the first accumulation region) after detecting a background light.

Moreover, the solid state imaging device according to the present invention includes a pair of third accumulation regions provided in the semiconductor substrate, and a pair of third gate electrodes provided on the semiconductor substrate so as to control the height of second potential barriers each interposed between the second accumulation region and the third accumulation region, and in which by lowering the height of the second potential barrier to carriers, carriers accumulated in the second accumulation region are transferred to the third accumulation region, and then the height of the second potential barrier is increased, and with the carriers held in the third accumulation region, application potentials to the first, second, and third gate electrodes are controlled so that carriers are alternately accumulated in a pair of the first accumulation regions.

More specifically, when carriers of the last measurement have been accumulated in the second accumulation region, if the first gate electrode is driven in this measurement, the carriers will be mixed. However, in the present example, if the height of the second potential barrier is lowered to transfer the carriers to the third accumulation regions and then the height of the second potential barrier is increased to prevent carriers from flowing in from the second accumulation region to the third accumulation region, the first gate electrode can be driven at this stage to make carriers generated in this measurement flow in the second accumulation region from the light-sensitive area.

Moreover, preferably, the light-sensitive area serves also as the above-mentioned photo-detection means, and the solid state imaging device further includes control means that outputs an application potential to the second gate electrode according to an output of the light-sensitive area. More specifically, a background light is detected in the light-sensitive area, and if output of the detected background light is large, the application potential to the second gate electrode is controlled so that the height of the first potential barrier is increased, and if output is small, the application potential to the second gate electrode is controlled so that the height of the first potential barrier is reduced. This makes it unnecessary to provide photo-detection means separately, so that downsizing of the device is enabled.

Moreover, a distance image measurement device according to the present invention includes the foregoing solid state imaging device, a light source for emitting a pulse light being in synchronization with an application potential to a pair of the first gate electrodes to a target, and a calculating circuit for calculating a distance up to the target according to a charge amount of carriers output from a pair of the second accumulation regions.

In this distance image measurement device, the charge amount of carriers is according to the distance up to the target, so that it becomes possible to output a distance image of the target from the calculating circuit.

Effects of the Invention

The solid state imaging device according to the present invention can be applied to a distance image measurement with a background light component eliminated although the configuration of which is simple, and the distance image measurement device, despite being simple, is capable of measuring an accurate distance image.

BRIEF DESCRIPTION OF THE DRAWINGS

FIG. 23 are a plan view (FIG. 23(A)) of the pixel P(m, n) shown in FIG. 22, a longitudinal sectional view (FIG. 23(B)) of the pixel P(m, n), and a potential diagram (FIG. 23(C)) in a semiconductor at no bias in the longitudinal sectional view.

FIG. 31 are a sectional view (FIG. 31(A)) taken along arrows 31A-31A in FIG. 30, a potential diagram (FIG. 31(B)) in a semiconductor at no bias in the sectional view of FIG. 31(A), a sectional view (FIG. 31(C)) taken along arrows 31C-31C in FIG. 30, and a potential diagram (FIG. 31(D)) in a semiconductor at no bias in the sectional view of FIG. 31(C).

DESCRIPTION OF REFERENCE NUMERALS AND SIGNS

Figure 1:
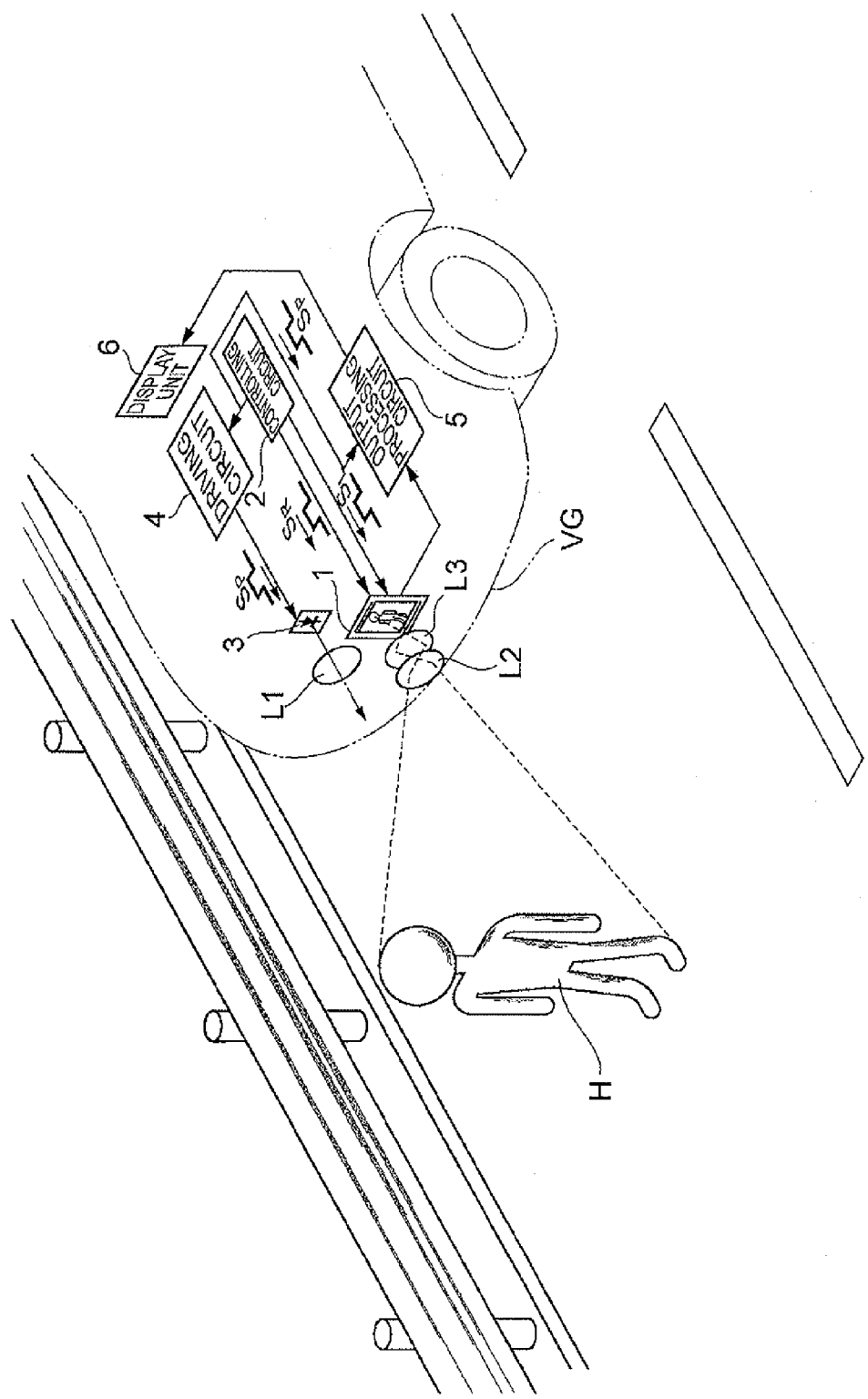
FIG. 1 is a view for explaining an outline of a distance image measurement device.

1 Solid state imaging element
1IP Imaging region
1V Vertical shift register
1H2 Horizontal shift register
2 Controlling circuit
3 Light source
DEX1, DEX2 Carrier discharge region
DEX3, DEX4 Carrier discharge region
EX1, EX2 Gate electrode
EX3, EX4 Gate electrode
PCC Background light elimination circuit
PD Photodetector

BEST MODES FOR CARRYING OUT THE INVENTION

Hereinafter, a solid state imaging device and a distance image measurement device according to an embodiment will be described. Also, the same elements are denoted by the same reference numerals and signs, and overlapping description will be omitted.

FIG. 1 is a view for explaining an outline of a distance image measurement device.

This distance image measurement device is mounted on a vehicle VG, and measures an object H that is located in front of the vehicle.

The distance image measurement device includes a solid state imaging element 1, a controlling circuit 2 that controls drive of the solid state imaging element 1, a light source 3 that emits pulse light, a driving circuit 4 of the light source 3, and an output processing circuit 5 incorporating a calculating circuit for calculating a distance up to the object H from output of the solid state imaging element 1. The controlling circuit 2 inputs a right pulse signal $S_R$ and a left pulse signal $S_L$ to the solid state imaging element 1, and inputs a drive pulse signal $S_P$ for light projection to the driving circuit 4. The drive pulse signal $S_P$ is input also to the output processing circuit 5, and used when calculating a distance from the solid state imaging element 1.

In synchronization with the drive pulse signal $S_P$ output from the controlling circuit 2, a drive current is supplied from the driving circuit 4 to the light source 3. From the light source 3, a probe light having the same pulse width as that of the drive pulse signal $S_P$ is emitted. The probe light is irradiated onto the object H via a light-projecting lens L1. The probe light reflected on the surface of the object H is made incident into an imaging region of the solid state imaging element 1 via imaging lenses L2, L3. Accordingly, an image of the object H is to be formed in the imaging region of the solid state imaging element 1.

From the solid state imaging element 1, (original data of) a distance image of the object H is output, and these data are processed by the output processing circuit 5, and displayed on a display unit 6 of a car navigation system. Although, on the display unit 6, a distance image can be independently displayed, it is also possible to display this distance image superimposed with a brightness image. In addition, when the object H indicated by the distance image exists within a predetermined distance, a warning display to the effect that the object H exists can also be displayed superimposed with the brightness image.

Figure 2:
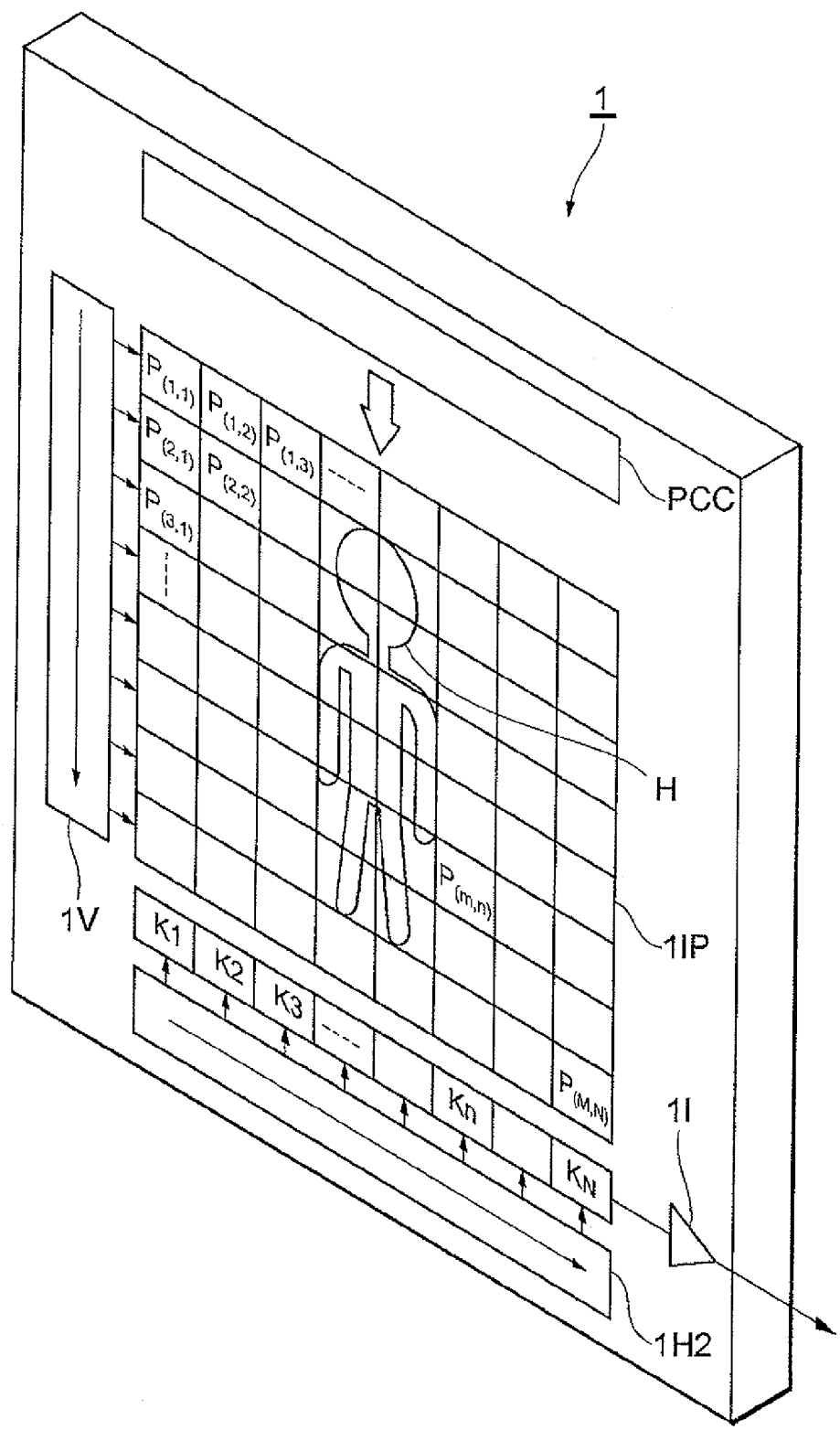
FIG. 2 is a perspective view of a solid state imaging element 1.

FIG. 2 is a perspective view of the solid state imaging element 1.

The solid state imaging element 1 includes an imaging region 1IP consisting of a plurality of pixels P(1, 1), P(1, 2), ... P(m, n), ... P(M, N) arrayed two-dimensionally. m, n, M, N is a natural number. In addition, for clarification of description, a smaller number of pixels than that in actuality are shown in the figure. A vertical shift register 1V is arranged parallel to pixel columns of the imaging region 1IP, and a background light elimination circuit PCC and a horizontal shift register 1H2 are arranged parallel to pixel rows.

The vertical shift register 1V sequentially applies, to each pixel P(m, n), a vertical transfer signal to read out output of pixels P(m, n) arrayed in a column direction, sequentially along the column direction. In each pixel column, a pixel output transferred in one vertical direction is input to distance information readout circuits K1, K2, ... Kn ... $K_N$. The pixel outputs input to the distance information readout circuits K1, K2, ... Kn $K_N$ are sequentially read out as (original data of) a distance image along the row direction.

More specifically, in a distance image measurement mode, when outputs of the first row pixels P(1, 1), P(1, 2) ... P(1, n) P(1, N) are input to the distance information readout circuits K1, K2, ... Kn ... $K_N$, respectively, the distance information readout circuits K1, K2, ... Kn ... $K_N$ once hold original data of a distance image for each of the input pixel outputs, and the held original data are, in a horizontal order, sequentially read out to the outside via an output buffer amplifier 1I. This horizontal readout is performed by sequentially inputting, from the horizontal shift register 1H2, a signal to turn on an output switch of each distance information readout circuit K1, K2, ... Kn ... $K_N$ to the output switch along the horizontal direction.

Next, outputs of the second row pixels P(2, 1), P(2, 2) ... P(2, n) ... P(2, N) are input to the distance information readout circuits K1, K2, ... Kn ... $K_N$, respectively, and thereafter, the same operation as above is performed. When the same operation as above is thereafter performed for the third, fourth ... to M-th row, the outputs from all pixels in the imaging region 1IP are to be read out as distance information.

At the time of non-irradiation of a probe light, projected onto the imaging region 1IP is a brightness image that is formed as a result of outside light such as sunlight or a street light being reflected on the surface of the object H. At the time of irradiation of a probe light, projected onto the imaging region 1IP superimposed with such a brightness image (background light) is an image for acquiring a distance up to the object H, which is formed of a reflected light of the probe light. The image for distance acquisition is a set of original data to calculate a distance image.

The background light elimination circuit PCC, according to the size of output of a background light detected by a photodetector (photo-detection means), controls the height of a potential barrier that controls the amount of charge flooding from each pixel. More specifically, in each pixel, a potential barrier is provided at a previous stage of its readout section, and when the background light is large, by increasing the height of the potential barrier, a background light component is eliminated from an output from each pixel. The potential barrier is adjusted by controlling potential to be applied to a gate electrode formed on a semiconductor substrate.

Figure 3:
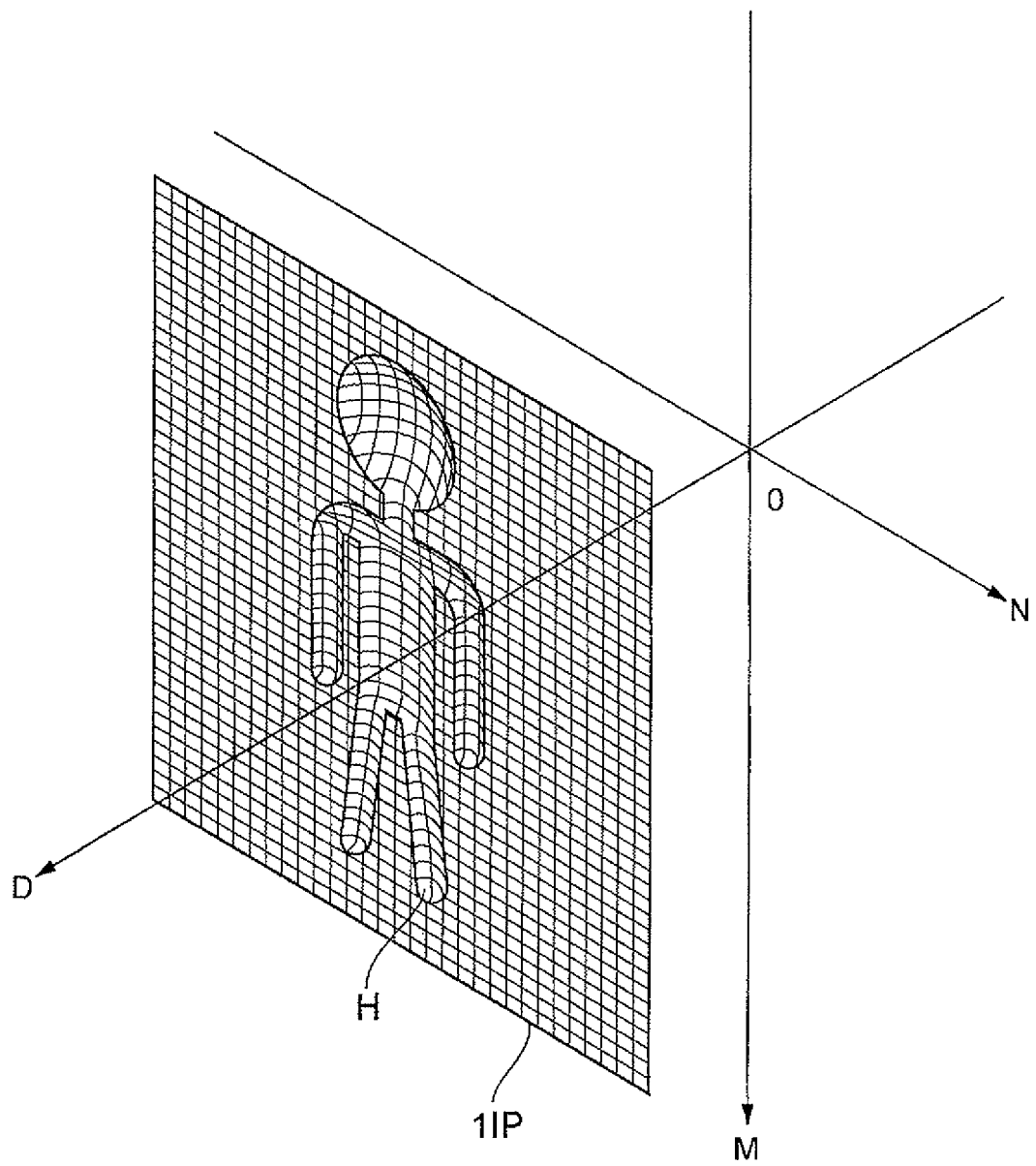
FIG. 3 is a view showing a distance image that is generated from an image for distance acquisition projected onto an imaging region 1IP.

FIG. 3 is a view showing a distance image that is generated from an image for distance acquisition projected onto the imaging region 1IP. A rectangular coordinate system consisting of an M-axis, an N-axis, and a D-axis is set. In the figure, lines connecting distances indicated by the respective pixel outputs in the imaging region 1IP are shown in a network form. This distance image is calculated in the output processing circuit 5. In the imaging region 1IP, M rows and N columns of pixels are arrayed, and a distance vertical to the imaging region 1IP is shown on the D-axis. The distance image of the object H is a set of information of the distances (denoted by d) on the D-axis.

Figure 4:
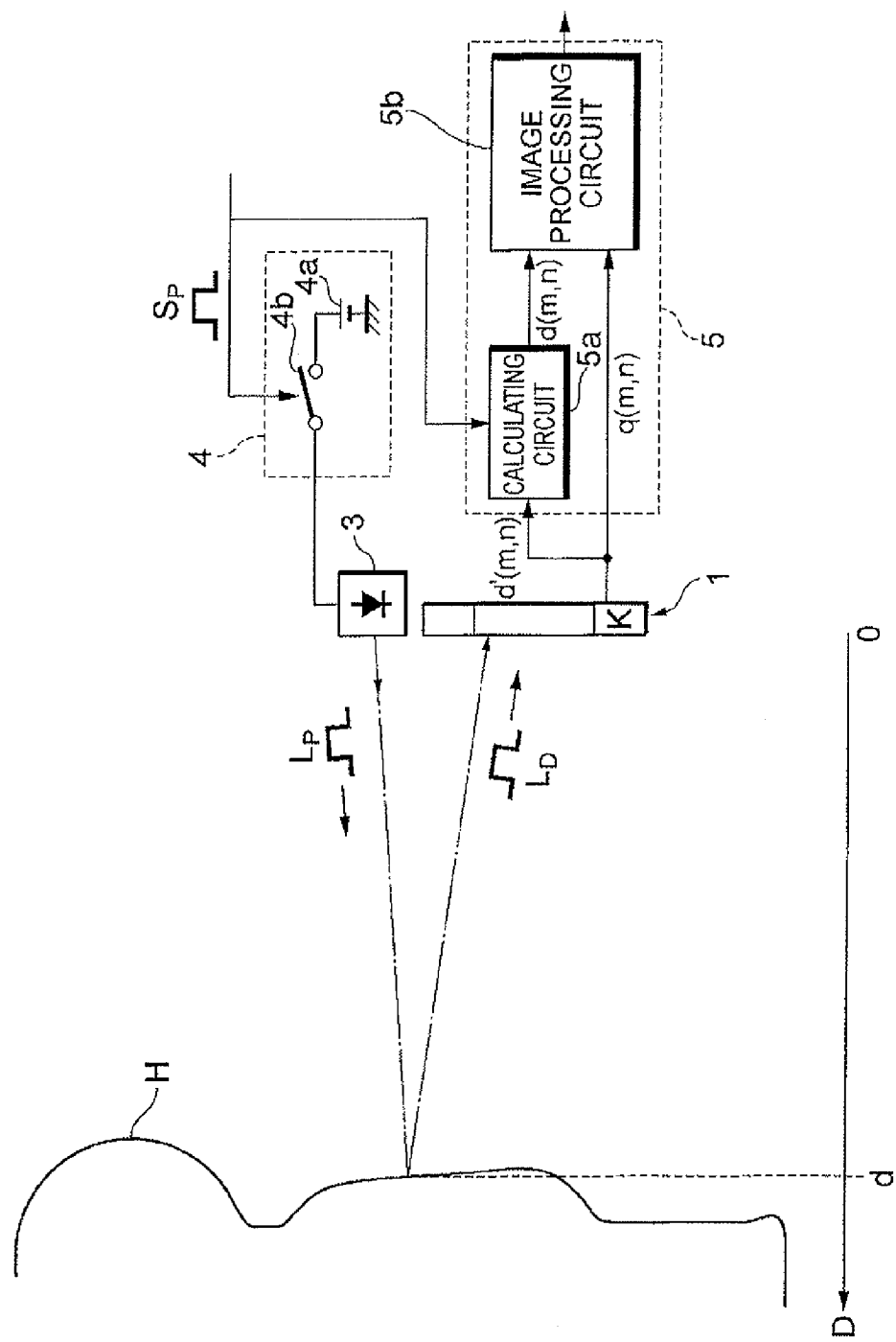
FIG. 4 is a view for explaining a measurement principle of a distance d up to an object H.

FIG. 4 is a view for explaining a measurement principle of the distance d up to the object H.

The driving circuit 4 has a switch 4b interposed between a power supply 4a and the light source 3, and when a drive pulse signal $S_P$ for light projection is input to the switch 4b, a drive current being in synchronization with the drive pulse signal $S_P$ is supplied to the light source 3, and a probe light (pulse light) $L_P$ being in synchronization with the drive pulse signal $S_P$ is emitted from the light source 3. Although the light source 3 of the present example is to be formed of a light-emitting diode or laser diode excellent in steepness of rise and fall of a pulse light, as a matter of course, it is also possible to use another type of light source. In addition, preferably, the light source 3 is formed of an infrared light-emitting diode.

When a probe light is irradiated onto the surface of the object H located at the distance d, the probe light is reflected on this surface, and the reflected probe light is made incident into the solid state imaging element 1 as a pulse light $L_D$. The pulse light to be made incident into the solid state imaging element 1 is provided as $L_D$, while a detection pulse signal to be output from a pixel as a result of the pulse light being made incident is provided as $S_D$. On the solid state imaging element 1, the foregoing distance information readout circuit K is provided, and the foregoing right pulse signal $S_R$ and left pulse signal $S_L$ are input to the distance information readout circuit K.

It is also possible for the distance information readout circuit K to output a background light, and the background light indicates a brightness image of the target. For example, when a charge of a background light component remaining in two potential wells is read out, this serves as a brightness image q(m, n). The brightness image q(m, n) output from each pixel P(m, n) is input to the image processing circuit 5b.

In response to incidence of the detection pulse signal $S_D$, from the distance information readout circuit K, distance information d'(m, n) serving as original data of a distance image is read out corresponding to each pixel P(m, n). The distance information d'(m, n) is input to a calculating circuit 5a, and converted to a distance image d(m, n) by using the drive pulse signal $S_P$. The distance information d'(m, n) is a value depending on the time of flight of a probe light up to the object H. The distance image d(m, n) is input to the image processing circuit 5b together with the brightness image q(m, n) according to necessity. In the image processing circuit 5b, the foregoing superimposition processing and the like can be performed.

Figure 5:
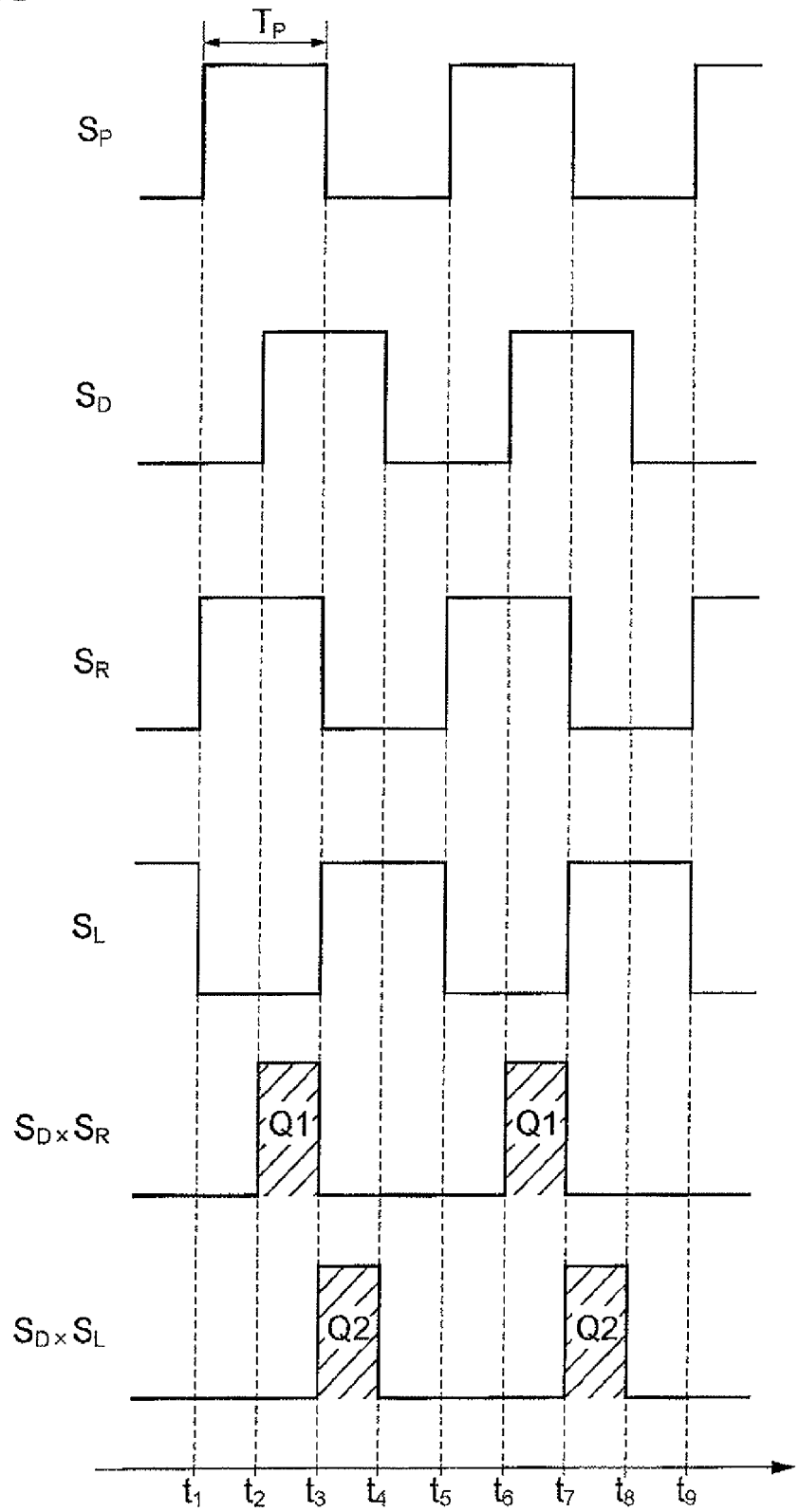
FIG. 5 is a timing chart of a drive pulse signal $S_P$, a detection pulse signal $S_D$, a right pulse signal $S_R$, and a left pulse signal $S_L$.

FIG. 5 is a timing chart of the drive pulse signal $S_P$, the detection pulse signal $S_D$, the right pulse signal $S_R$, and the left pulse signal $S_L$. The drive pulse signal $S_P$ has a pulse width of $T_P$.

The right pulse signal $S_R$ rises in synchronization with a rising time $t_1$ of the drive pulse signal $S_P$. The right pulse signal $S_R$ falls in synchronization with a falling time $t_3$ of the drive pulse signal $S_P$. More specifically, the right pulse signal $S_R$ is in phase with the drive pulse signal $S_P$. The left pulse signal $S_L$, which is in opposite phase with the right pulse signal $S_R$, falls at the time $t_1$, and rises at the time $t_3$. The right pulse signal $S_R$ and the left pulse signal $S_L$ both have a pulse width of $T_P$.

When the detection pulse light $L_D$ is made incident into each pixel, carriers are generated in each pixel. A time waveform of the charge amount of carriers generated due to incidence of the detection pulse light $L_D$ matches the detection pulse signal $S_D$.

Carriers generated in the pixels flow in one first accumulation region when the right pulse signal $S_R$ is high level. Thus, in this pulse cycle, a charge amount Q1 of carriers to be effectively accumulated in one first accumulation region is proportional to an overlapping period of time $t_2$ to $t_3$ between the detection pulse signal $S_D$ and the right pulse signal $S_R$. In other words, a value of a product of the detection pulse signal $S_D$ and the right pulse signal $S_R$ a crest value of which indicates a charge amount per time having been integrated for a period of time $t_2$ to $t_3$ equals the charge amount Q1 to be accumulated in one first accumulation region. Moreover, in a next pulse cycle, a value of the product of the detection pulse signal $S_D$ and the right pulse signal $S_R$ having been integrated for a period of time $t_6$ to $t_7$ equals the charge amount Q1 to be accumulated in one first accumulation region.

Carriers generated in the pixels flow in the other first accumulation region when the left pulse signal $S_L$ is high level. Thus, in this pulse cycle, a charge amount Q2 of carriers to be effectively accumulated in the other first accumulation region is proportional to an overlapping period of time $t_3$ to $t_4$ between the detection pulse signal $S_D$ and the right pulse signal $S_R$. In other words, a value of a product of the detection pulse signal $S_D$ and the left pulse signal $S_L$ a crest value of which indicates a charge amount per time having been integrated for a period of time $t_3$ to $t_4$ equals the charge amount Q2 to be accumulated in the other first accumulation region. Moreover, in a next pulse cycle, a value of the product of the detection pulse signal $S_D$ and the left pulse signal $S_L$ having been integrated for a period of time $t_7$ to $t_8$ equals the charge amount Q2 to be accumulated in the other second accumulation region.

The ratio of the charge amount Q1 and the charge amount Q2 is proportional to the time of flight (TOF). More specifically, the relatively larger the latter charge amount Q2 is than the former charge amount Q1, the greater the distance d. As a matter of course, the ratio of not only the charge amount accumulated in one pulse cycle but an integrated value ΣQ1, ΣQ2 of the charge amount Q1, Q2 is also proportional to the time of flight (TOF). In addition, performing integration makes it possible to obtain an accurate distance because the charge amount becomes large.

Here, where it is provided that a probe light is emitted in darkness, the ratio of the charge amount Q1, Q2 indicates the distance, however, because a charge component corresponding to a background light is in fact contained in the detection pulse signal $S_D$, it is necessary to eliminate the background light component.

Figure 6:
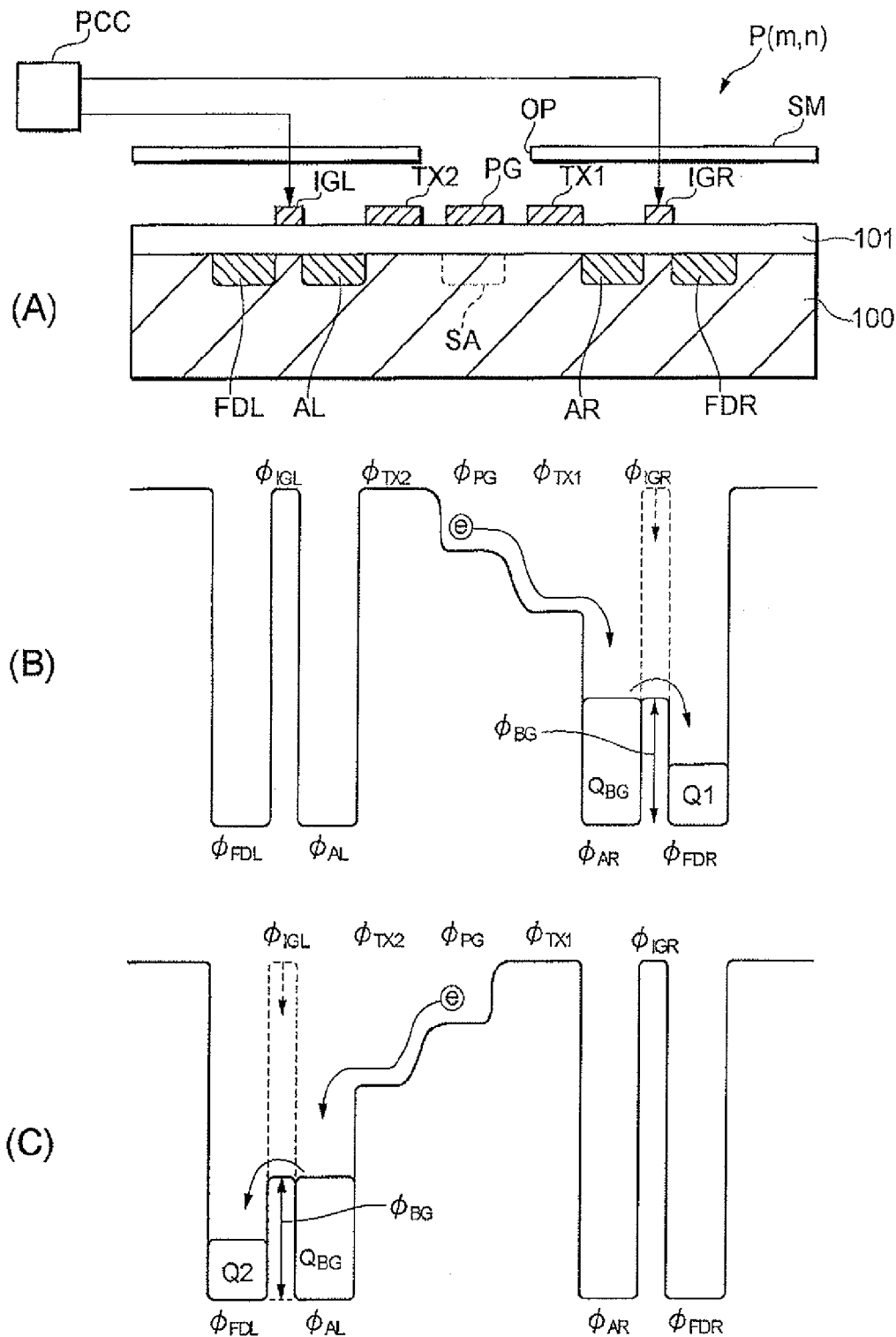
FIG. 6 are explanatory views for explaining an accumulation principle of carriers.

FIG. 6 are explanatory views for explaining an accumulation principle of carriers.

FIG. 6(A) is a sectional view of one pixel P(m, n).

The pixel P(m, n) includes a p-type (first conductivity type) semiconductor substrate 100 and an insulating layer 101 formed on the semiconductor substrate 100. On the insulating layer 101, a light-shielding film SM is provided. The light-shielding film SM includes light entrance openings OP on a pixel-by-pixel basis On the insulating layer 101 directly below the opening OP, a pixel electrode PG is arranged. A surface area within the semiconductor substrate 100 directly below the pixel electrode PG of the semiconductor substrate 100 is provided as a light-sensitive area SA. At both sides of the pixel electrode PG, a pair of first gate electrodes TX1 and TX2 are arranged on the insulating layer 101. On the outside of the first gate electrodes TX1, TX2, a pair of first accumulation regions AR and AL provided in the semiconductor substrate 100 are located. Further, on the outside of the first accumulation regions AR, AL, a pair of second accumulation regions FDR and FDL provided in the semiconductor substrate 100 are located. The second accumulation regions FDR, FDL are floating diffusion regions. Above a region between the first accumulation regions AR, AL and the second accumulation regions FDR, FDL, second gate electrodes IGR, IGL are respectively located on the insulating layer 101.

The first accumulation region AR, AL and the second accumulation region FDR, FDL are each formed of an n-type semiconductor region. A positively ionized donor exists in an n-type semiconductor, and a negatively ionized acceptor exists in a p-type semiconductor. The potential in a semiconductor is higher in the n-type than in the p-type. In other words, because the potential in an energy band diagram is shown heading downward as the positive direction of potential, the potential in an n-type semiconductor is deeper (higher) than that of a p-type in the energy band diagram, and the energy level is lower. Moreover, when a positive potential is applied to each electrode, the potential of a semiconductor region directly below the electrode is deepened (increased in the positive direction). When the positive potential to be applied to each electrode is reduced in size, the potential of a semiconductor region directly below the electrode is made shallow (reduced in the positive direction).

FIG. 6(B) is a potential diagram when the right pulse signal $S_R$ to be applied to the right first gate electrode TX1 is high level. The left pulse signal $S_L$ to be applied to the left first gate electrode TX2 is low level. In addition, description will be given of the potential diagram assuming downward as positive, and a potential $\phi$ to be applied to each electrode and a potential $\phi$ of the semiconductor region directly below each electrode are denoted by the same sign.

A slight positive potential $\phi_{PG}$ is applied to the pixel electrode PG, and a positive potential $\phi_{TX1}$ greater than $\phi_{PG}$ is applied to the right first gate electrode TX1. Accordingly, carriers (electrons) generated by the incidence of light into the light-sensitive area SA are induced by a potential gradient formed by $\phi_{PG}$ and $\phi_{TX1}$, and flow in a position of a potential $\phi_{AR}$ of the first accumulation region AR existing in a deep position.

Next to the right first accumulation region AR is one adjacent second accumulation region FDR. A potential difference between a potential $\phi_{AR}$ of the first accumulation region AR and a potential $\phi_{IGR}$ of the semiconductor region directly below the second gate electrode IGR is provided as $\phi_{BG}$. When this right first potential barrier $\phi_{BG}$ is large, the charge amount of carriers flowing in the second accumulation region FDR from the right first accumulation region AR is small, and when it is small, the charge amount of carriers flowing in the second accumulation region FDR from the first accumulation region AR is large.

From the background light elimination circuit PCC, a potential control voltage ($\phi_{IGR}$, $\phi_{IGL}$) corresponding to the size of a background light is output. This potential control voltage is applied to the pair of second gate electrodes IGR and IGL. In addition, when the potential of the semiconductor substrate 100 is provided at ground level, an application voltage and an application potential to each electrode match. In the present example, the potential of the semiconductor substrate 100 is provided at ground level, and the same sign is used for the potential and voltage. In addition, when a background light component remains in an output signal from each pixel, a distance being a pulse phase difference to be determined by a ratio of the charge amount is incorrect, so that the background light elimination circuit PCC functions also as a phase controlling circuit at the time of distance calculation.

With a large background light, the potential $\phi_{IGR}$ to be applied to the right second gate electrode IGR is reduced, and the right first potential barrier $\phi_{BG}$ is increased. With a small background light, the potential $\phi_{IGR}$ to be applied to the right second gate electrode IGR is increased, and the right first potential barrier $\phi_{BG}$ is reduced. More specifically, the size of the right first potential barrier $\phi_{BG}$ is set so as to match a voltage corresponding to carriers generated in response to the background light (see FIG. 12).

For this, when the right pulse signal $S_R$ that is high level is applied to the first gate electrode TX1, the charge amount Q1 of carriers corresponding to a reflected light of a probe light flows in the second accumulation region FDR from the first accumulation region AR beyond the first potential barrier $\phi_{BG}$, so that in the right first accumulation region AR, the charge amount $Q_{BG}$ of carriers corresponding to the background light component remains.

Although, in the figure, for simple description of a basic principle, the application potential $\phi_{IGR}$ to the right second gate electrode IGR is provided at high level, and the application potential $\phi_{IGL}$ to the left second gate electrode IGL is provided at low level, providing these in phase allows reducing the number of wirings. More specifically, providing $\phi_{IGR}=\phi_{IGL}$ allows performing a potential barrier control using common wiring. As a matter of course, even when $\phi_{IGL}$ and $\phi_{IGR}$ are both provided at high level, the application voltage to the left first gate electrode TX2 is low level, so that carriers generated in the light-sensitive area SA do not flow in the left accumulation region, and operation is performed without problems.

FIG. 6(C) is a potential diagram when the left pulse signal $S_L$ to be applied to the left first gate electrode TX2 is high level. The right pulse signal $S_R$ to be applied to the right first gate electrode TX1 is low level.

In the same manner as the above, a slight positive potential $\phi_{PG}$ is applied to the pixel electrode PG, and a positive potential $\phi_{TX2}$ greater than $\phi_{PG}$ is applied to the left first gate electrode TX2. Accordingly, carriers (electrons) generated by the incidence of light into the light-sensitive area SA are induced by a potential gradient formed by $\phi_{PG}$ and $\phi_{TX2}$, and flow in a position of a potential $\phi_{AL}$ of the first accumulation region AL existing in a deep position.

Next to the left first accumulation region AL is the other adjacent second accumulation region FDL. A potential difference between a potential $\phi_{AL}$ of the first accumulation region AL and a potential $\phi_{IGL}$ of the semiconductor region directly below the second gate electrode IGL is also provided as $\phi_{BG}$. When this left first potential barrier $\phi_{BG}$ is large, the charge amount of carriers flowing in the second accumulation region FDL from the left first accumulation region AL is small, and when it is small, the charge amount of carriers flowing in the second accumulation region FDL from the first accumulation region AL is large.

As described above, from the background light elimination circuit PCC, a potential control voltage ($\phi_{IGR}$, $\phi_{IGL}$: preferably, $\phi_{IGR}=\phi_{IGL}$) corresponding to the size of a background light is output, and the potential control voltage is applied to the pair of second gate electrodes IGR and IGL.

With a large background light, the potential $\phi_{IGL}$ to be applied to the left second gate electrode IGL is reduced, and the left first potential barrier $\phi_{BG}$ is increased. With a small background light, the potential $\phi_{IGL}$ to be applied to the left second gate electrode IGL is increased, and the left first potential barrier $\phi_{BG}$ is reduced. More specifically, the size of the left first potential bather $\phi_{BG}$ is set so as to match a voltage corresponding to carriers generated in response to the background light (see FIG. 12).

For this, when the left pulse signal $S_L$ that is high level is applied to the left first gate electrode TX2, the charge amount Q2 of carriers corresponding to a reflected light of a probe light flows in the second accumulation region FDL from the first accumulation region AL beyond the left first potential barrier $\phi_{BG}$, so that in the left first accumulation region AL, the charge amount $Q_{BG}$ of carriers corresponding to the background light component remains.

As described above, the pixel P(m, n) of the present embodiment includes a pair of first gate electrodes IGR and IGL provided on the semiconductor substrate 100 so that the potentials $\phi_{TX1}$ and $\phi_{TX2}$ between the light-sensitive area SA and the pair of first accumulation regions AR and AL alternately ramp, and a pair of second gate electrodes IGR and IGL that are provided on the semiconductor substrate 100 so as to control the height of the first potential barriers $\phi_{BG}$ each interposed between the first accumulation region AR, AL and the second accumulation region FDR, FDL, and increase the height of the first potential barrier $\phi_{BG}$ to carriers as a higher output of a background light is detected by the above-mentioned photodetector.

In addition, the height of the potential barrier $\phi_{BG}$ is, when the carriers are electrons, relative to a potential where electrons exist, increased by decreasing the potential, and reduced by increasing the potential. Alternatively, when the carriers are holes, the height of the potential barrier $\phi_{BG}$ is, relative to a potential where holes exist, increased by increasing the potential, and reduced by decreasing the potential. More specifically, although the semiconductor substrate 100 is provided as a p-type semiconductor in the above and each accumulation region is provided as an n-type, it is also possible to invert the conductivity types of these so as to provide holes as carriers.

In addition, the above-mentioned second accumulation regions FDR, FDL are electrically connected with wiring to be described later, and these function as floating diffusion regions.

As described above, when a pulsed probe light for distance detection is irradiated onto the object H and the voltages $\phi_{TX1}$ and $\phi_{TX2}$ where the foregoing potential ramp alternately occurs are applied to the first gate electrodes TX1, TX2, the charge amount of carriers to be accumulated in one first accumulation region AR is reduced, and the charge amount of carriers to be accumulated in the other first accumulation region AL is increased, in proportion to a delay at the incidence of a reflected light of a probe light. More specifically, the ratio of these charge amounts Q1 and Q2 of accumulated carriers depends on the delay time, that is, time of flight (TOF). Moreover, appropriately controlling the voltage to be applied to the second gate electrode IGR, IGL according to the size of a background light makes it possible to simply block carriers corresponding to the background light by the first potential barrier $\phi_{BG}$ and allow only a reflected light component of a probe light from the object H to flow in the second accumulation region FDR, FDL.

The height of the first potential barrier $\phi_{BG}$ may be reduced (1) after performing this measurement (accumulation period of time of carriers into the first accumulation region AR, AL) after detecting a background light, or may be reduced in advance (2) before performing this measurement (accumulation period of time of carriers into the first accumulation region AR, AL) after detecting a background light.

Figure 7:
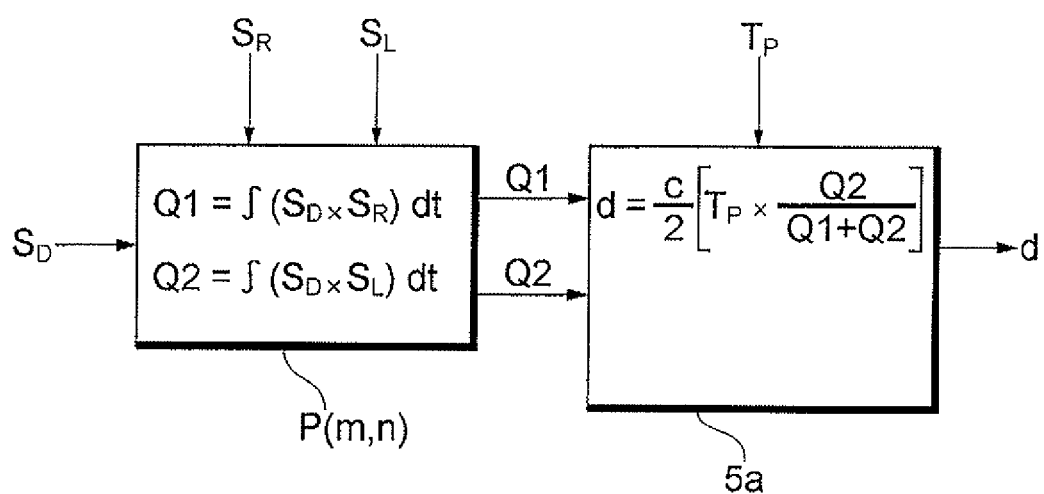
FIG. 7 is a block diagram for explaining a calculation of the distance d.

FIG. 7 is a block diagram for explaining a calculation of the distance d.

As described above, each pixel P(m, n) is input with the detection pulse signal $S_D$, the right pulse signal $S_R$, and the left pulse signal $S_L$. The charge amount Q1 is a value of a product of the detection pulse signal $S_D$ and the right pulse signal $S_R$ having been time-integrated for an overlapping period of time $t_2$ to $t_3$ of these pulses, and the charge amount Q2 is a value of a product of the detection pulse signal $S_D$ and the left pulse signal $S_L$ having been time-integrated for an overlapping period of time $t_3$ to $t_4$ of these pulses. From each pixel P(m, n), the charge amounts Q1, Q2 are output.

The charge amounts Q1, Q2 are input to the subsequent calculating circuit 5a together with the pulse width $T_P$ of the drive pulse signal $S_P$, and a calculation to determine the distance d is performed. As described above, when there are two second accumulation regions, the distance is given by $d=(c/2)\times(T_P\times Q2/(Q1+Q2))$. In addition, c represents light speed. Thus, from the calculating circuit 5a, the distance d(m, n) of each pixel P(m, n) is output. In addition, a binning operation may be performed for each pixel column or pixel row. In this case, an average distance indicated by detection pulses made incident in the pixel column or pixel row to be integrated by binning is obtained.

Moreover, a description has been given in the above of an example of using, when two first gate electrodes are driven with a phase difference of 180 degrees, two second accumulation regions adjacent to the two first accumulation regions. This can be applied also to an example of using, when four first gate electrodes are driven with a phase difference of every 90 degrees, four second accumulation regions adjacent to the four first accumulation regions. When the number of second accumulation regions is three or more, for example, four and the drive signal is sinusoidal, where the charge amount to be accumulated in each second accumulation region is provided as Q1, Q2, Q3, Q4, the distance is given by $d=\Phi\times c/2\times 2\pi f$. In addition, f represents a repetition frequency of a driving sinusoidal signal $S_P$, and the phase is given by $\Phi=-\arctan((Q2-Q4)/(Q1-Q3))$.

Thus, when the number of first and second accumulation regions is three or more each, the ratio of carriers flowing in each first accumulation regions from the light-sensitive area depends on the phases of application voltages to potential ramping electrodes interposed between these, and the carrier accumulation changes in amount by a shift in phase. In addition, the charge amount of carriers accumulated in the first accumulation region contains a carrier component generated in response to a background light component, so that the ratio of carriers after elimination of carriers corresponding to the background light component indicates the distance.

The above-mentioned distance image measurement device includes the foregoing solid state imaging device, the light source 3 that emits a pulse light being in synchronization with an application potential to the pair of first gate electrodes TX1, TX2 (TX3, TX4) to the object H serving as a target, the calculating circuit 5a that calculates the distance d up to the object H according to the charge amount Q1, Q2 (Q3, Q4) of carriers output from the pair of second accumulation regions. In this distance image measurement device, the charge amount of carriers is according to the distance d up to the object H, so that it becomes possible to output a distance image of the object H from the calculating circuit 5a.

Figure 8:
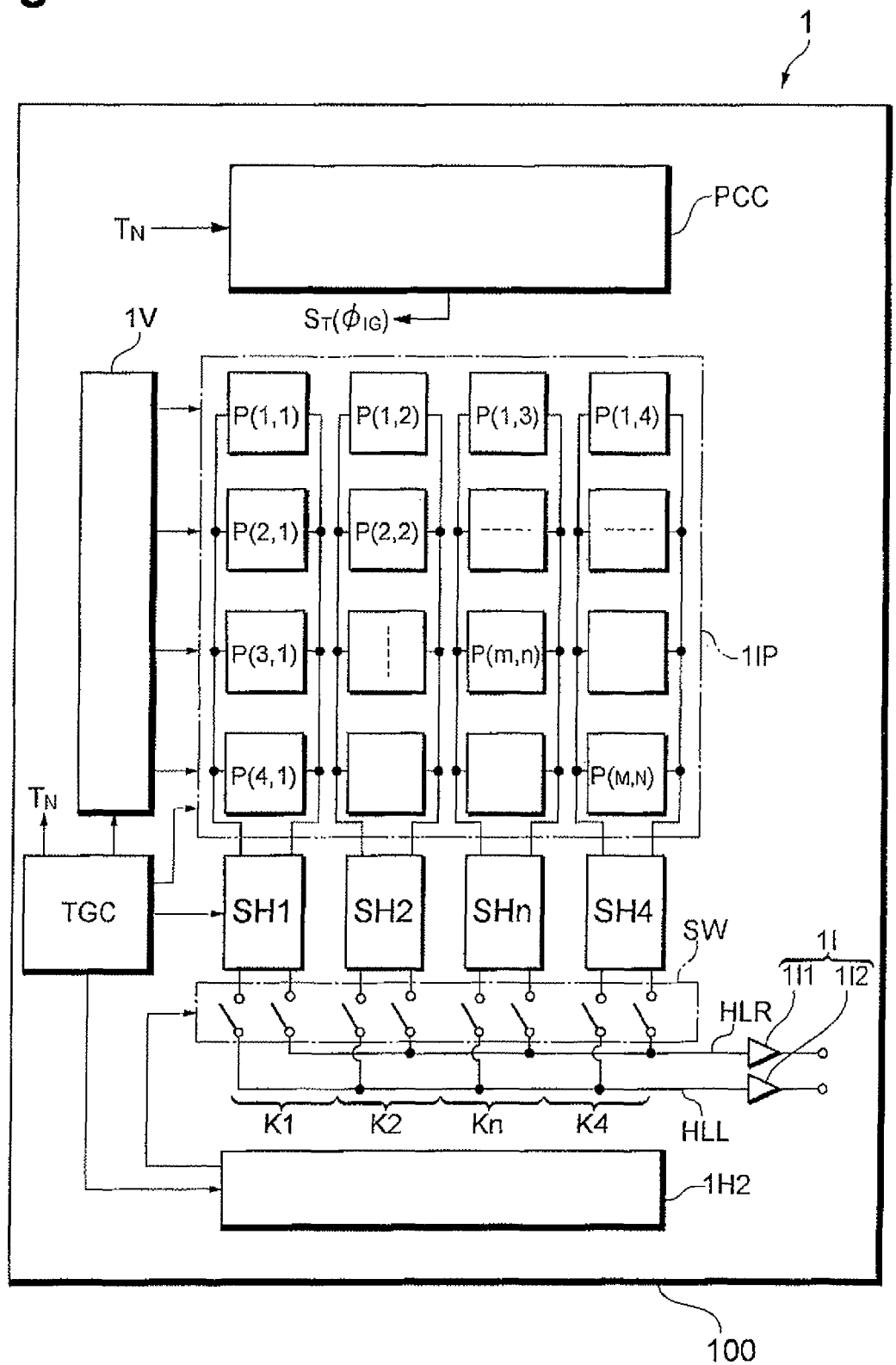
FIG. 8 is a plan view of a solid state imaging element 1.

FIG. 8 is a plan view of the solid state imaging element 1 for explaining a detailed configuration of the foregoing solid state imaging device.

On the semiconductor substrate 100, distance information readout circuits K1, K2, Kn, and K4 are provided. The distance information readout circuits Kn include a readout switch group SW to be switched by the horizontal shift register 1H2, and Sample holding circuits SHn provided for each pixel column. For simplification of description, although a timing generation circuit TGC is also arranged on the semiconductor substrate 100, the timing generation circuit TGC may be provided separately from the semiconductor substrate 100.

The timing generation circuit TGC generates various timing signals in response to an input drive signal. The horizontal shift register 1H2 is a register formed by connecting flip-flops, and the switch group SW is turned on for each pixel column in response to a control signal input from the timing generation circuit TGC. The foregoing charge amount Q1, Q2 is output from each pixel P(m, n). The switches composing the switch group SW are interposed between a right horizontal line HLR for reading out a value of the charge amount Q1 and a left horizontal line HLL for reading out a value of the charge amount Q2, and by turning on these switches by the horizontal shift register 1H2, the value of the charge amount Q1 held in the Sample holding circuit SHn is output to the outside via the right horizontal line HLR and an output buffer 1I1, and the value of the charge amount Q2 held in the Sample holding circuit SHn is output to the outside via the left horizontal line HLL and an output buffer 1I2.

Prior to accumulation of the charge amount Q1, Q2, detection of a background light is performed. The timing generation circuit TGC generates a background light detection signal $T_N$ in synchronization with an input trigger signal. The background light detection signal $T_N$ is input to the background light elimination circuit PCC. The background light elimination circuit PCC, when the background light detection signal $T_N$ is on, performs detection of a background light, holds a value generated by the detection, and thereafter outputs a potential control voltage $\phi_{IG}$ (=$\phi_{IGR}$, $\phi_{IGL}$) as a transfer signal $S_T$ to the second gate electrode IG (IGR, IGL).

Figure 9:
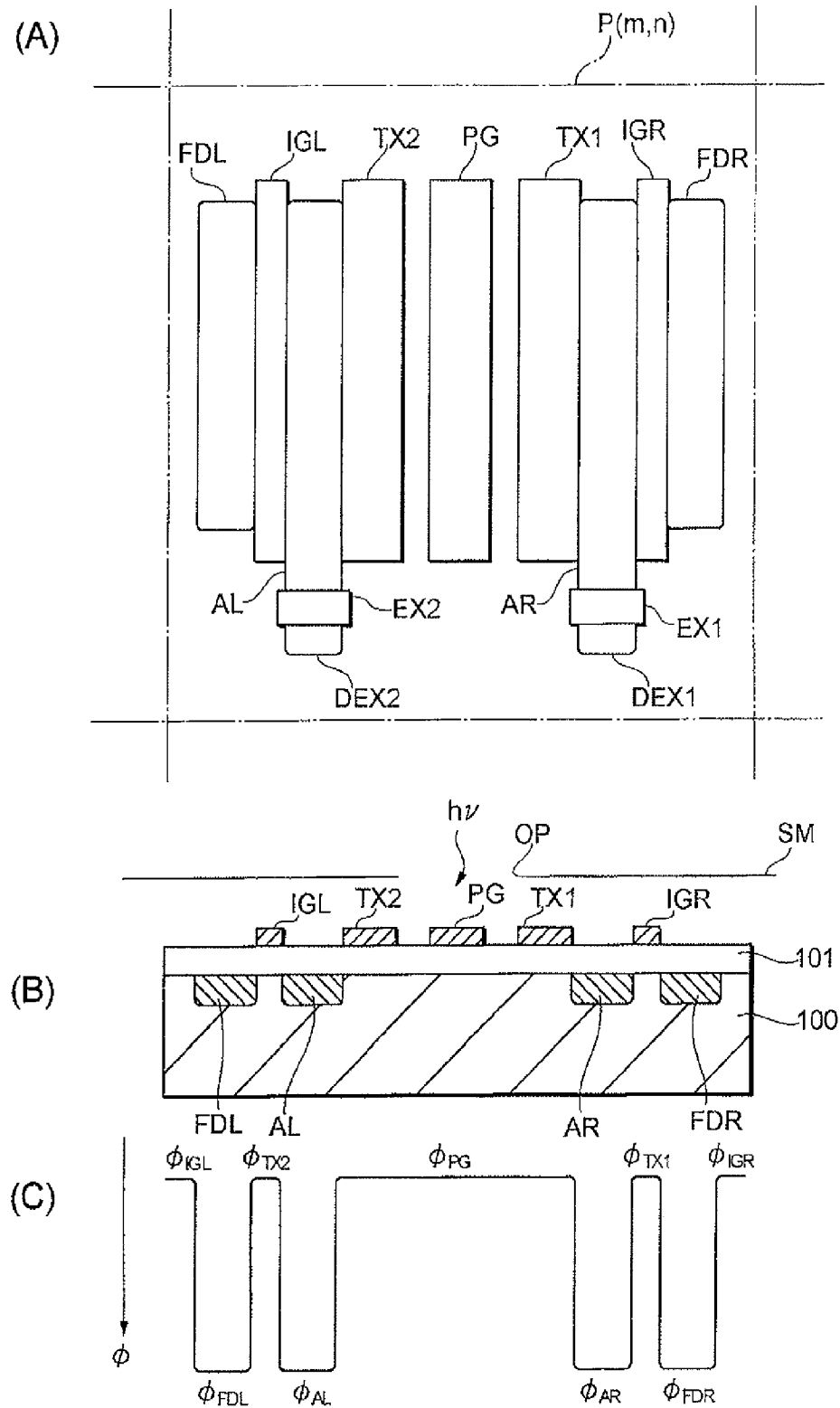
FIG. 9 are views for explaining a detailed structure of each pixel P(m, n).

FIG. 9 are views for explaining a detailed structure of the foregoing each pixel P(m, n), wherein FIG. 9(A) is a plan view of the pixel P(m, n), FIG. 9(B) is a longitudinal sectional view of the pixel P(m, n), and FIG. 9(C) is a potential diagram in a semiconductor at no bias corresponding to the longitudinal sectional view.

The pixel P(m, n) includes carrier discharge regions DEX1, DEX2 adjacent to the first accumulation regions AR, AL, respectively. More specifically, as described above, carriers corresponding to the background light component remain to be accumulated in the first accumulation regions AR, AL, and the accumulated carriers are discharged to the outside via the carrier discharge regions DEX1, DEX2. The carrier discharge regions DEX1, DEX2 are formed of an n-type semiconductor.

Above a semiconductor region between the right first accumulation region AR and the carrier discharge region DEX1, the gate electrode EX1 for a carrier discharge is located on the insulating layer 101, and when a positive potential is applied to the right gate electrode EX1, carriers accumulated in the first accumulation region AR flow in the carrier discharge region DEX1, and are output to the outside via wiring electrically connected to the carrier discharge region DEX1.

Above a semiconductor region between the left first accumulation region AL and the carrier discharge region DEX2, the gate electrode EX2 for a carrier discharge is located on the insulating layer 101, and when a positive potential is applied to the gate electrode EX2, carriers accumulated in the left first accumulation region AL flow in the carrier discharge region DEX2, and are output to the outside via wiring electrically connected to the carrier discharge region DEX2.

Figure 10:
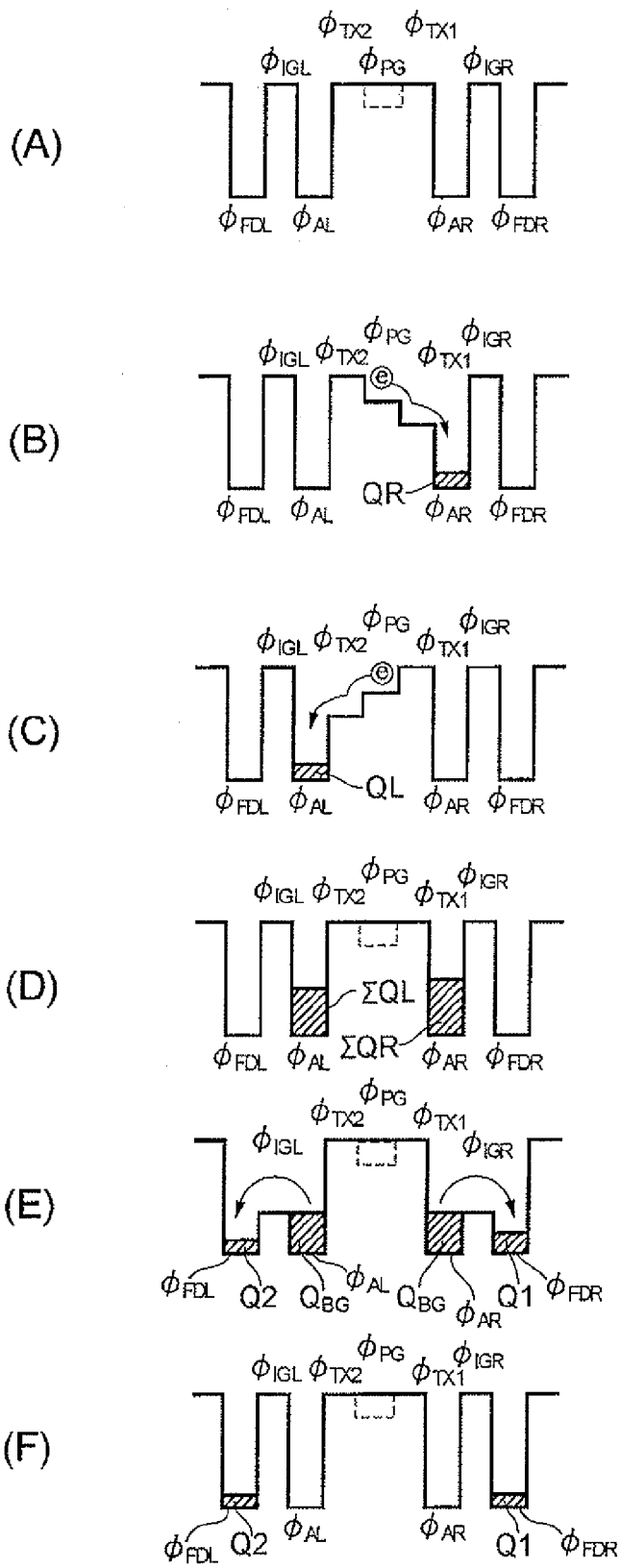
FIG. 10 are potential diagrams for explaining an accumulation and discharge operation of carriers.

FIG. 10 are potential diagrams for explaining an accumulation and discharge operation of carriers.

In an initial state, potentials $\phi_{FDL}$, $\phi_{AL}$, $\phi_{AR}$, $\phi_{FDR}$ are high (deep), no carriers are accumulated in each potential well. In addition, a slight positive potential may be applied to $\phi_{PG}$ according to necessity (FIG. 10(A)).

In a period of a first half cycle of a drive pulse, the potential $\phi_{PG}$ and the right potential $\phi_{TX1}$ are deepened to transfer carriers into a well of the potential $\phi_{AR}$ of the right first accumulation region (FIG. 10(B)). A charge amount QR is accumulated in the right potential well.

In a period of a second half cycle of a drive pulse, the potential $\phi_{PG}$ and the left potential $\phi_{TX2}$ are deepened to transfer carriers into a well of the potential $\phi_{AL}$ of the left first accumulation region (FIG. 10(C)). A charge amount QL is accumulated in the left potential well.

By repeating a small charge accumulation step consisting of FIG. 10(B) and FIG. 10(C) M times, a charge amount $\Sigma QR$, $\Sigma QL$ integrated M-fold is accumulated in each potential well (FIG. 10(D)).

Thereafter, potentials $\phi_{IGR}$, $\phi_{IGL}$ are deepened (reduced in barrier height) to cause a charge amount $Q_{BG}$ of carriers corresponding to a background light component to remain in wells of the respective potentials $\phi_{AR}$ and $\phi_{AL}$, and a charge corresponding to a residual pulse light component is flooded to transfer the charge into wells of the potentials $\phi_{FDR}$, $\phi_{FDL}$ of the second accumulation regions. In the wells of the potentials $\phi_{FDR}$, $\phi_{FDL}$ of the second accumulation regions, carriers of the charge amounts Q1, Q2 are accumulated (FIG. 10(E)).

Next, carriers of the charge amount $Q_{BG}$ remaining in the wells of the potentials $\phi_{AR}$ and $\phi_{AL}$ of the first accumulation regions are transferred to the carrier discharge regions DEX1, DEX2 by applying a positive potential to the gate electrode EX1, EX2 shown in FIG. 9, and discharged to the outside (FIG. 10(F)). In addition, because a total charge amount of carriers to be discharged corresponds to the brightness of each pixel, reading out this on a pixel-by-pixel basis allows obtaining a brightness image.

In addition, according to the specifications, an integrated charge accumulation step consisting of M times of repeating steps of FIG. 10(B) and FIG. 10(C) and a transfer step of FIG. 10(D) to FIG. 10(F) is repeated X times back in the step of FIG. 10(B). In this case, a signal component of a pulse light contained in M×X times of carriers of a small charge can be accumulated in the second accumulation regions.

Figure 11:
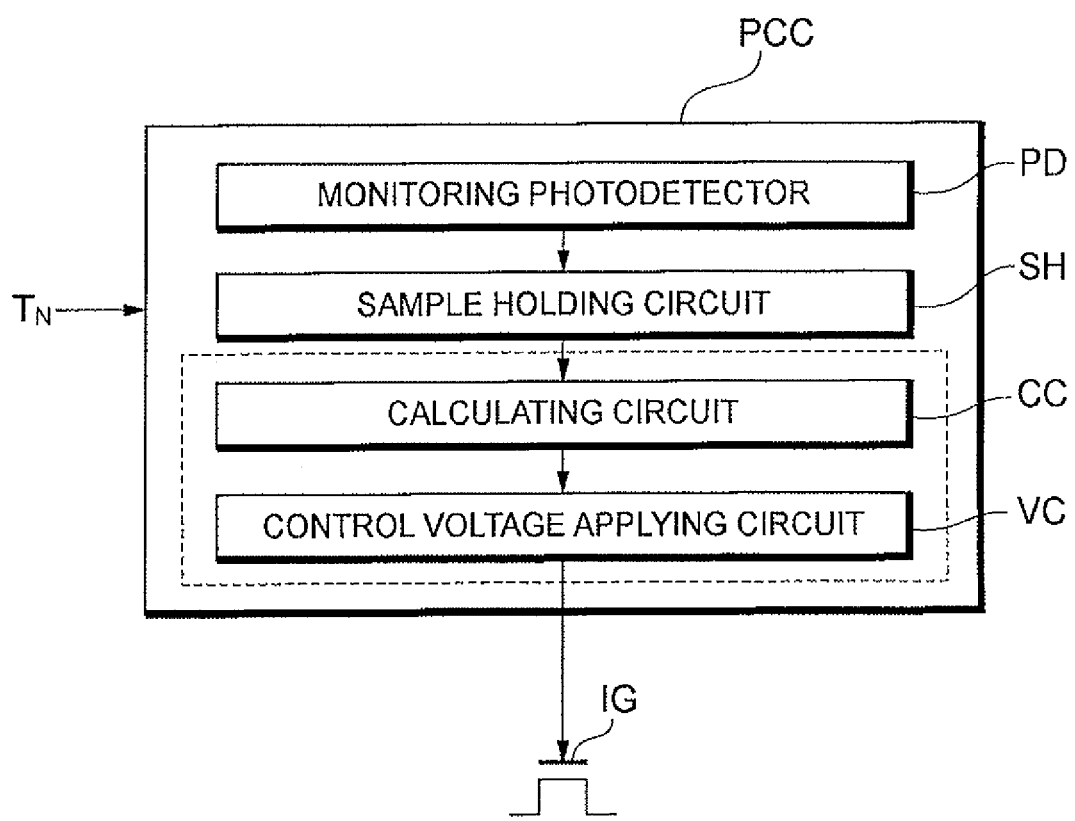
FIG. 11 is a block diagram showing an internal configuration of a background light elimination circuit PCC.

FIG. 11 is a block diagram showing an internal configuration of the background light elimination circuit PCC.

The background light elimination circuit PCC receives a background light detection signal $T_N$ for background light sampling, and when the background light detection signal $T_N$ is on, applies a bias voltage to a monitoring photodetector PD to activate the photodetector PD, and transfers a charge generated at this time to the Sample holding circuit SH as a background light component.

In addition, there may be a configuration of transferring a voltage generated in the photodetector PD to the Sample holding circuit SH. In this case, while a photodiode serving as the photodetector PD is charged-up with a reset voltage, a terminal-to-terminal voltage of the photodiode declines when light is made incident thereto. The amount of decline in voltage is linearly proportional to the amount of incident light.

Alternatively, an A/D converter circuit may be used in place of the Sample holding circuit SH. In either case, a detection value (analog value or digital value) β corresponding to the potential barrier $\phi_{BG}$ is held in the Sample holding circuit SH or A/D converter circuit. The calculating circuit CC converts the detection value β to a size of the potential barrier $\phi_{BG}$. The control voltage applying circuit VC inputs the potential $\phi_{IG}$ corresponding to the calculated potential barrier $\phi_{BG}$ to the second gate electrode IG (IGR, IGL). In addition, the above-described gate electrode, along with semiconductor regions on both sides thereof, form a field effect transistor.

Figure 12:
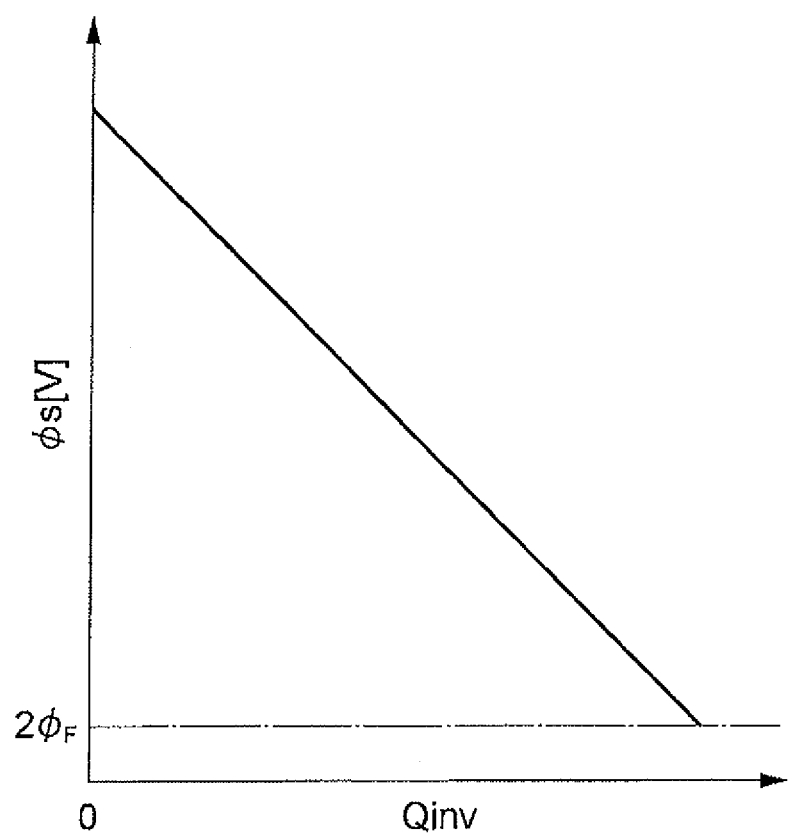
FIG. 12 is a graph for explaining a calculation in a calculating circuit CC.

FIG. 12 is a graph for explaining a calculation in the calculating circuit CC. The horizontal axis represents an interface electric field density Qinv between the foregoing insulating layer and semiconductor substrate, and the vertical axis represents a surface potential $\phi s$ of the semiconductor substrate in a light receiving section. In addition, $\phi_F$ in the graph shows a surface potential at a flat band voltage. The surface potential $\phi s$ is given approximately by $\phi s = V_G - V_{FB} - (Qinv/C_{OX})$. In addition, $V_G$ represents a gate voltage, $C_{OX}$ represents a capacitance of the insulating layer, and $V_{FB}$ represents a flat band voltage.

When the charge amount (interface electric field density Qinv) of carriers generated in the light-sensitive area increases, the surface potential $\phi s$ linearly declines. More specifically, there is a relationship between the generated carriers and potential to be approximated by a linear function. Accordingly, lowering the potential barrier $\phi_{BG}$ by a potential corresponding to the generated carriers allows eliminating a background light.

As a matter of course, a MOS-FET where the insulating layer is a gate oxide film is formed in a pixel, and when the photodetector PD is a photodiode formed of a p-n junction, both are different in structure, but are the same in a feature that a voltage change linearly occurs according to the amount of carriers to be generated, and thus outputs of both have a certain correlation.

The height of the potential barrier $\phi_{BG}$ with completely no background light is provided as VB(V). With no background light, that is, when a background light component corresponds to β(V)(β=0), $\phi_{IG}$=VB(V) is applied to the second gate electrode to eliminate the potential barrier $\phi_{BG}$ and transfer carriers. When the background light component corresponds to β(V)(β=1), $\phi_{IG}$=(VB−β)(V) is applied to the second gate electrode to maintain the potential barrier $\phi_{BG}$ corresponding to the background light component and transfer carriers. VB(V) is, for example, 5(V). In actuality, $\phi_{IG}$=(VB−β+α)(V) is applied to the second gate electrode. α is set to, for example, 0.2V. Here, a margin of a portion where a background light cannot be exactly measured is represented by α. The calculating circuit CC holds a lookup table or a computing equation showing a relationship between $\phi_{IG}$ and β, and determines $\phi_{IG}$ according to input β.

Figure 13:
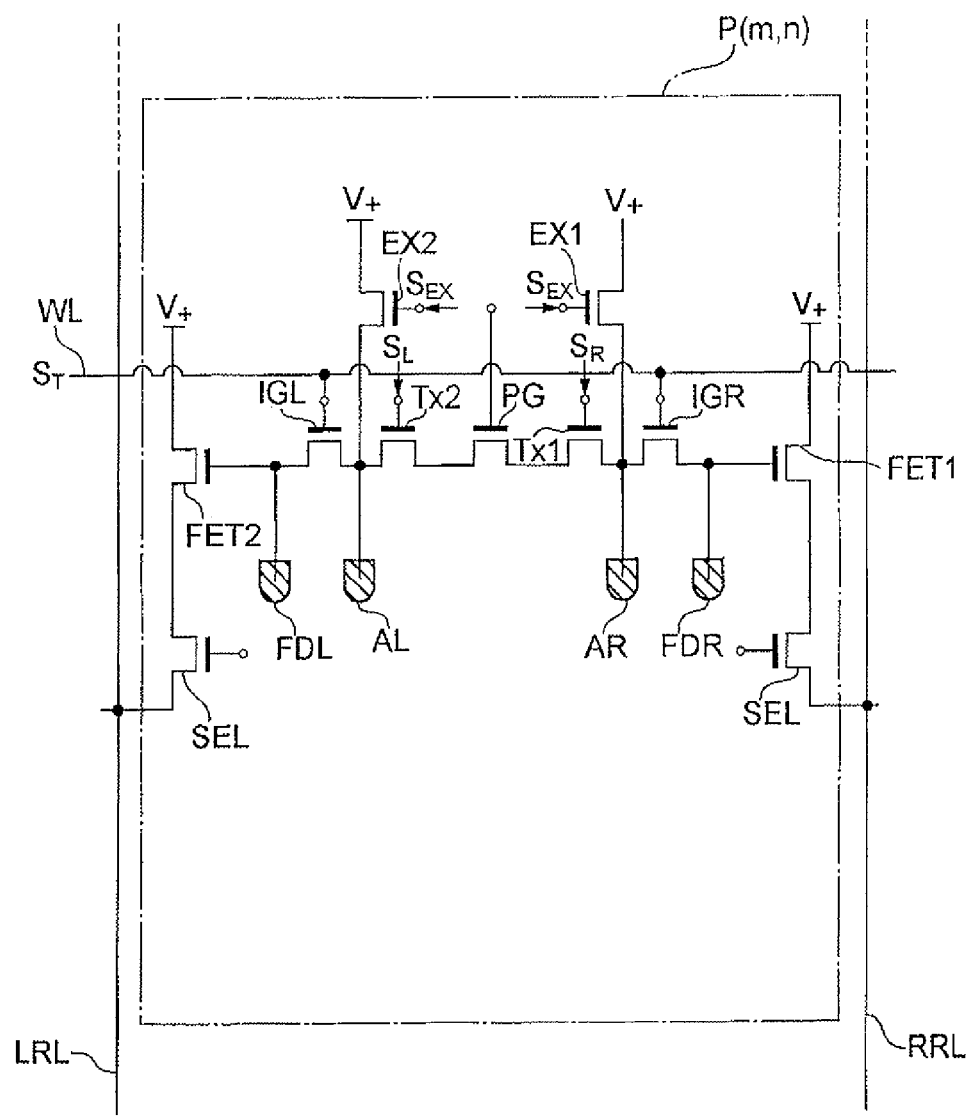
FIG. 13 is a circuit diagram within each pixel P(m, n).

FIG. 13 is a circuit diagram within each pixel P(m, n).

As described above, each gate electrode forms a gate electrode of a field effect transistor. Here, for avoiding complication of the drawing as a result of using a plurality of signs so as to clarify description, a transistor having each gate electrode is denoted using a sign of a corresponding gate electrode in parentheses. Moreover, a side to which carriers flow in at readout of carriers is set to a source of the transistor, and a side from which carriers flow out is set to a drain.

One end of a transistor containing a pixel electrode PG is connected to a source of an NMOS transistor containing a gate electrode TX1, and a drain of the NMOS transistor (TX1) is connected to a first accumulation region AR, a source of an NMOS transistor (IGR), and a source of a carrier discharging transistor (EX1), and a drain of the NMOS transistor (EX1) for a carrier discharge is connected to a power supply potential V+. The first accumulation region AR is connected to the source of the NMOS transistor (IGR) for background light component elimination, and a drain of the NMOS transistor (IGR) is connected to a second accumulation region FDR and a gate electrode of an NMOS transistor FET1.

A source of the NMOS transistor FET1 is connected to a power supply potential V+, and a drain thereof is connected to a right NMOS transistor SEL for output selection. Moreover, a gate electrode IGR of the transistor (IGR) is input with a transfer signal $S_T(=\phi_{IGR})$ of carriers via a common line WL. A drain of the transistor SEL is connected to a right vertical readout line RRL. To the vertical readout line RRL, a current corresponding to the charge amount Q1 to be accumulated in the second accumulation region FDR flows in. In addition, the charge accumulated in the second accumulation region FDR is reset by turning on both the transistor (IGR) and transistor (EX1). To a gate electrode EX1 of the transistor (EX1), a discharge signal $S_{EX}$ is applied. In addition, the power supply potentials V+ are different in size from each other according to the design.

The other end of the transistor containing the pixel electrode PG is connected to a source of an NMOS transistor containing a gate electrode TX2, and a drain of the NMOS transistor (TX2) is connected to a first accumulation region AL, a source of an NMOS transistor (IGL), and a source of a carrier discharging transistor (EX2), and a drain of the NMOS transistor (EX2) for a carrier discharge is connected to a power supply potential V+. The first accumulation region AL is connected to the source of the NMOS transistor (IGL) for background light component elimination, and a drain of the NMOS transistor (IGL) is connected to a second accumulation region FDL and a gate electrode of a PMOS transistor FET2.

A source of the NMOS transistor FET2 is connected to a power supply potential V+, and a drain thereof is connected to a left NMOS transistor SEL for output selection. Moreover, a gate electrode IGR of the transistor (IGR) is input with a transfer signal $S_T(=\phi_{IGR})$ of carriers via the common line WL. A drain of the transistor SEL is connected to a left vertical readout line LRL. To the vertical readout line LRL, a current corresponding to the charge amount Q2 to be accumulated in the second accumulation region FDR flows in. In addition, the charge accumulated in the second accumulation region FDL is reset by turning on both the transistor (IGR) and transistor (EX2). To a gate electrode EX2 of the transistor (EX2), a discharge signal $S_{EX}$ is applied.

Moreover, for performing charge distribution, to the pair of first gate electrodes TX1 and TX2, a right pulse signal $S_R$ and a left pulse signal $S_L$ each including a pulse signal are input, respectively.

After detecting a background light, by simultaneously applying the transfer signal $S_T$ to the gate electrodes IGR and IGL, the potential barrier $\phi_{BG}$ is lowered as described above to accumulate carriers corresponding to the reflected light in the second accumulation region FDR, FDL. At a point in time before carriers flow in, the second accumulation region FDR, FDL is at a floating level, and in proportion to the negative charge amount Q1, Q2 having flowed therein, a current that flows through the transistor FET1, FET2 is determined. When a signal to turn on the transistor SEL for selection is input from a vertical shift register, according to an input gate voltage of FET1, FET2, a current corresponding to each charge amount Q1, Q2 flows to the vertical readout line RRL, LRL.

After ending this detection or when setting the second accumulation region FDR, FDL to a floating level, the transistor (IGR, IGL) and the transistor (EX1, EX2) are turned on, the second accumulation region FDR, FDL is connected to the power supply potential V+, and thereafter, the transistor (IGR, IGL) and the transistor (EX1, EX2) are turned off. Thus, resetting of this floating diffusion region is performed. At this time, the size of a voltage to be applied to the gate electrodes of the transistor (IGR, IGL) and transistors (EX1, EX2) is set large such that the resetting is performed.

Figure 14:
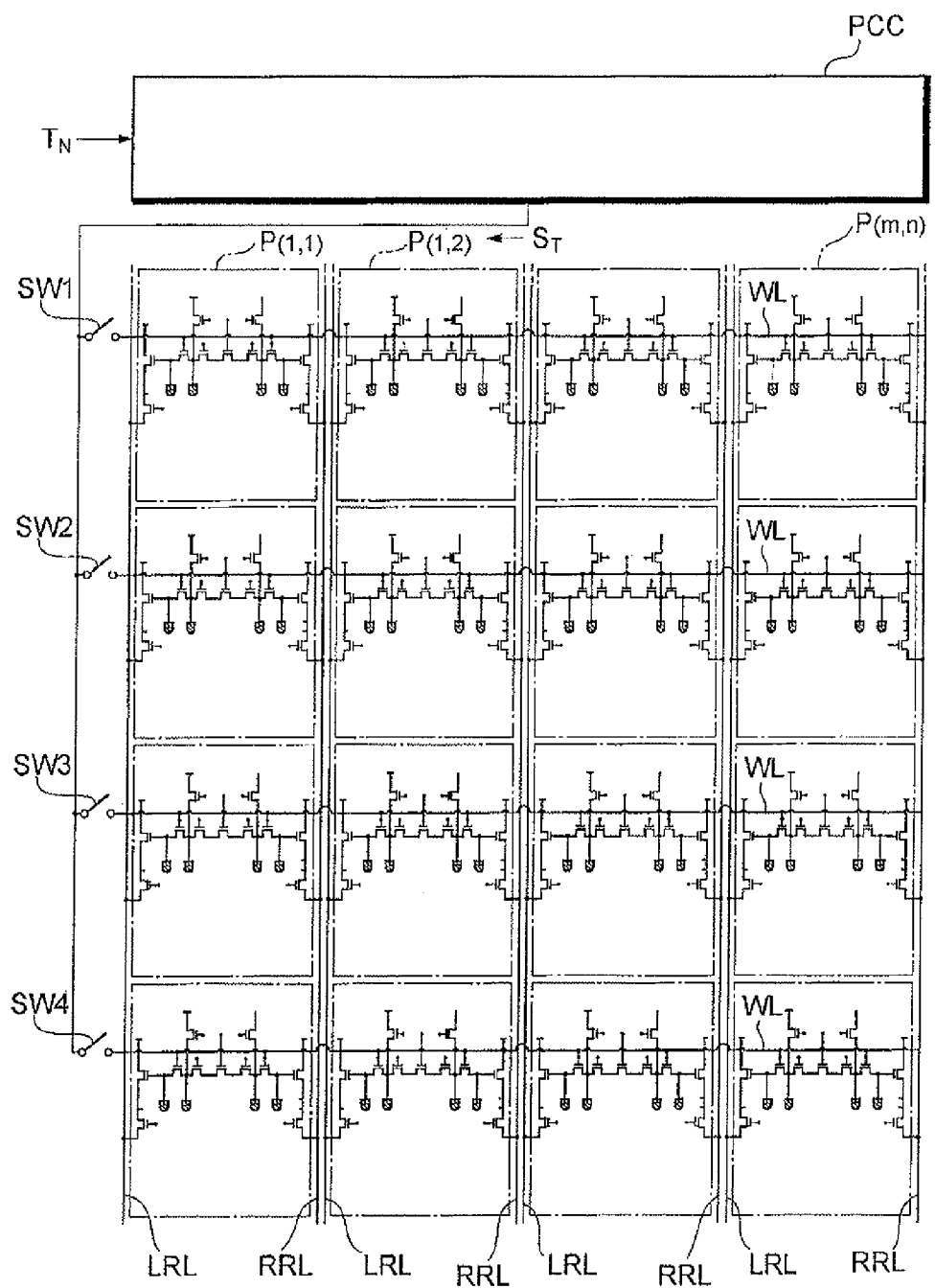
FIG. 14 is a circuit diagram of a solid state imaging element 1 formed by arraying the pixels P(m, n) shown in FIG. 13.

FIG. 14 is a circuit diagram of the solid state imaging element 1 formed by arraying the pixels P(m, n) shown in FIG. 13.

The transfer signal $S_T(\phi_{IG})$ output from the background light elimination circuit PCC is input to the common line WL of each pixel row, via a switch SW1, SW2, SW3, SW4 provided for each pixel row, to simultaneously turn on the second gate electrodes IGR and IGL for each pixel row. The common line WL is common in one pixel row.

In addition, when the switches SW1, SW2, SW3, and SW4 are simultaneously turned on, carriers can be simultaneously transferred to the second accumulation regions in all pixels. More specifically, when there is one reference background light component in one measurement cycle, it suffices to turn on the switches SW1, SW2, SW3, and SW4 simultaneously. By thus turning on the switches SW1, SW2, SW3, and SW4 simultaneously or by not providing switches, the measurement cycle of distance images can be shortened. Moreover, as will described later, when self-reference type background light detection is performed, it suffices to, for example, sequentially generate a transfer signal $S_T$ of each pixel row from a background light component detected for each pixel row and turn on the switches SW1, SW2, SW3, and SW4 in order to thereby input the generated transfer signal $S_T$ to each corresponding pixel row.

Figure 15:
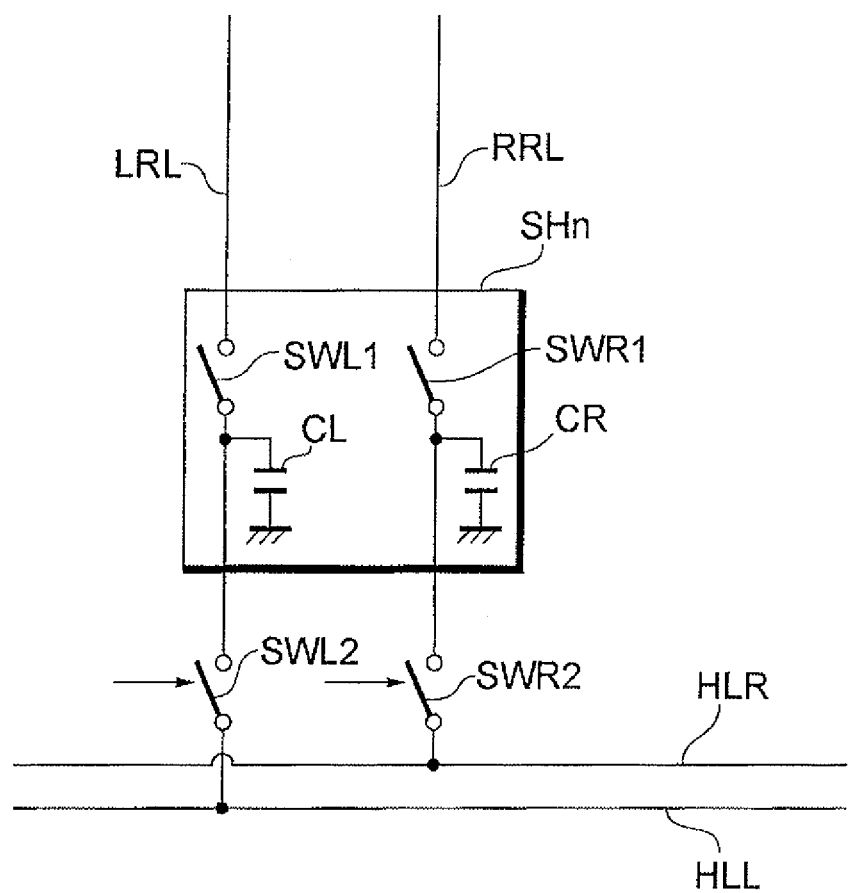
FIG. 15 is a circuit diagram of a Sample holding circuit SHn shown in FIG. 8.

FIG. 15 is a circuit diagram of the Sample holding circuit SHn shown in FIG. 8.

From each pixel column, a current proportional to the charge amount Q1, Q2 sequentially flows via the vertical readout line RRL, LRL, and flows to a ground via a load (not shown), so that the potential of the vertical readout line RRL, LRL is proportional to the charge amount Q1, Q2. This voltage, by simultaneously turning on switches SWR1 and SWL1 for only the same period of time, is applied to the capacitor CR, CL, and charges depending on the voltage are respectively accumulated. More specifically, a charge of a value proportional to the charge amount Q1, Q2 is accumulated in the capacitor CR, CL, and generated at both ends thereof is a voltage proportional to the accumulated charge amount. By driving a horizontal shift register to turn on a switch SWR2, SWL2 of a subsequent stage of the capacitor CR, CL, a voltage proportional to the charge amount accumulated in the capacitor CR, CL is read out from each horizontal line HLR, HLL.

Figure 16:
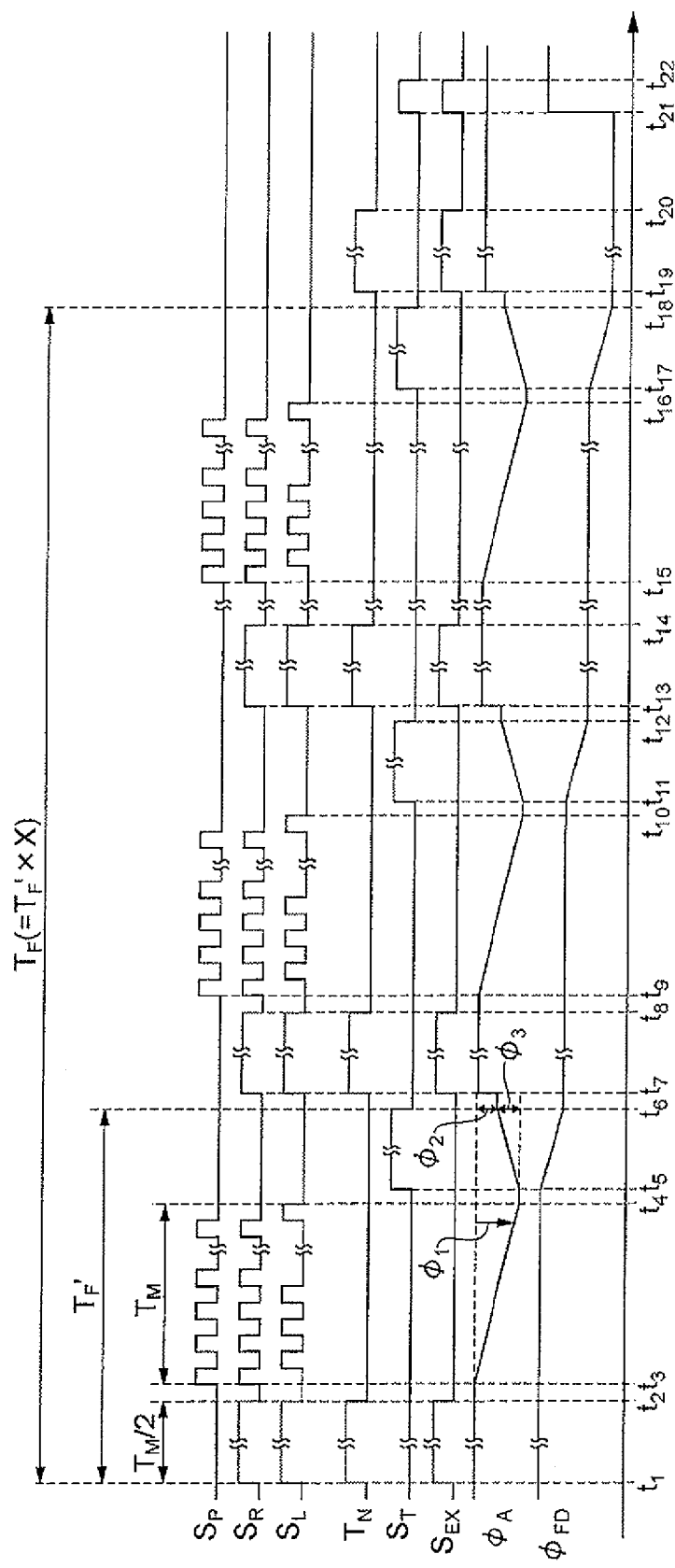
FIG. 16 is a timing chart of a solid state imaging device.

FIG. 16 is a timing chart of a solid state imaging device.

First, during time $t_1$ to $t_2$, the drive pulse signal $S_P$ is not applied to the light source, and the light source is in a non-light-emitting state. The background light detection signal $T_N$ is on during time $t_1$ to $t_2$ to perform detection of a background light. The detection period of a background light is provided as $T_M/2$. This corresponds to one second of $T_M$, which is a period to perform the foregoing M times of small charge accumulation in reflected pulse detection. If the amounts of carriers per time to be generated in the photodetector PD and each pixel P(m, n) are almost equal, the charge amount (voltage β) of carriers generated in the photodetector PD in the background light detection period $T_M/2$ almost matches the charge amount of carriers of a background light component contained in the reflected pulse detection period $T_M$.

The right pulse signal $S_R$ and the left pulse signal $S_L$ remain high level during detection of a background light. For this, although carriers are to flow in the first accumulation region, the carrier discharging signal $S_{EX}$ has been made high level (transistor ON), and these carriers are discharged to the outside. Accordingly, the potential $\phi_A(\phi_{AR}, \phi_{AL})$ in the first accumulation region remains fixed, and the potential $\phi_{FD}(\phi_{FDR}, \phi_{FDL})$ of the second accumulation region is also fixed. In this timing chart, potential of one of the right and left regions is representatively shown.

In a period of time $t_3$ to $t_4$, the foregoing M times of detection is performed. At this time, the carrier discharging signal $S_{EX}$ has been made low level (transistor OFF), and the potential $\phi_A$ declines with an elapse of time. The amount of decline $\phi_1$ in potential $\phi_A$ is proportional to the amount of a received reflected pulse light and background light. In the present example, after accumulating carriers in the first accumulation region, the potential barrier $\phi_{IG}$ is lowered according to the amount of the background light. More specifically, the transfer signal $S_T$ is made high level (potential $\phi_{IG}$) for a period of time $t_5$ to $t_6$ to transfer carriers to the second accumulation region. As a result, electrons flow into the second accumulation region from the first accumulation region, so that the potential $\phi_A$ from which electrons have flowed out is raised, and the potential $\phi_{FD}$ to which electrons have flowed in is lowered.

At time $t_6$, a difference $\phi_2$ between the potential of the first accumulation region in a state without carriers and the potential with carriers remaining matches a potential barrier $\phi_G$ corresponding to a background light component. Moreover, a difference $\phi_3$ between the potential at time $t_5$ of the first accumulation region in a state filled with carriers and the potential of the accumulation region when carriers flowed out at time $t_6$ matches the charge amount of carriers having flowed in the second accumulation region, that is, the amount of delay of a reflected pulse light (modulation signal).

The above detection cycle period is provided as $T_F'$. Thereafter, the carrier discharging signal $S_{EX}$ is made high level (transistor ON) for a period of time $t_7$ to $t_8$ to discharge carriers remaining in the first accumulation region, while shifting to a next detection cycle period.

In the present example, by turning on the transistor SEL (see FIG. 13) serving as a selector switch at time $t_{18}$ after executing X times of detection cycle periods $T_F'$, detection of the potential $\phi_{FD}$ is performed, and by performing discharge of the remaining background light component as described above at time $t_{19}$ to $t_{20}$, and at time $t_{21}$ to $t_{22}$, by simultaneously making $S_T$ and $S_{EX}$ high level (turning on the transistor (IGR, IGL, EX1, EX2)), resetting is performed, and a measurement of distance information in one pixel thus ends. In addition, for every detection cycle period $T_F'$, electrons are integrated and accumulated in the second accumulation region, and the potential $\phi_{FD}$ thereof sequentially declines.

In addition, it is possible to arrange the photodetectors PD of the foregoing background light elimination circuit PCC in the imaging region 1IP. In the following, description will be given of an example of arrangement of the photodetectors PD in the imaging region 1IP. Moreover, the following arrangement example can also be applied to another embodiment.

Figure 17:
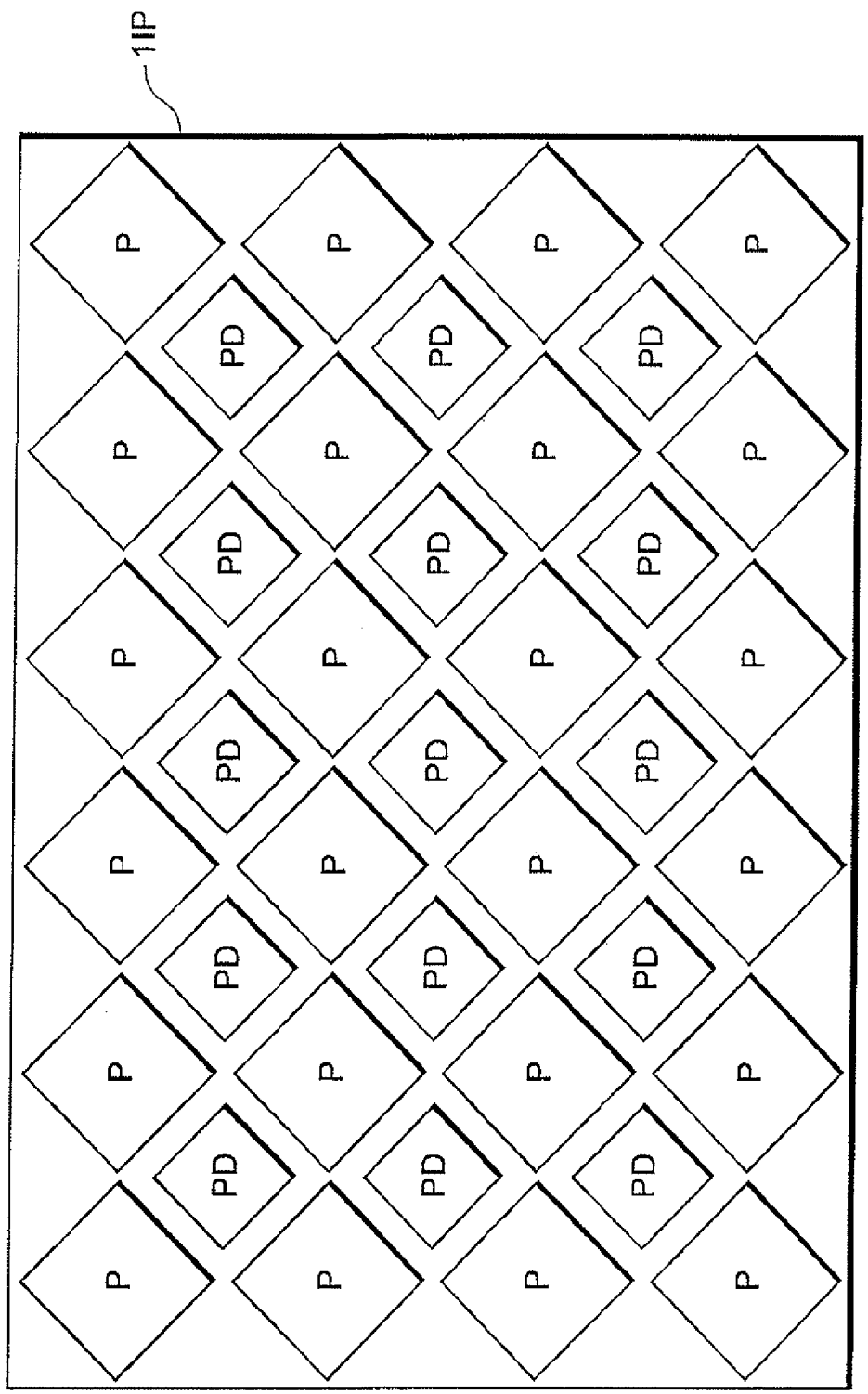
FIG. 17 is a plan view of an imaging region 1IP showing an arrangement example of pixels P and photodetectors PD.

FIG. 17 is a plan view of an imaging region 1IP showing an arrangement example of the foregoing pixels P and photodetectors PD. In the quadrangular imaging region 1IP, a plurality of pixels P and photodetectors PD are arranged. The pixels P are arrayed along a direction diagonally crossing one side of the imaging region 1IP, and photodetectors PD are arranged between the pixels P. In the figure, four pixels P are arranged around one photodetector PD, and four photodetectors PD are arranged around one pixel P. Outputs of the plurality of photodetectors PD are, by summing up all in the imaging region 1IP or by summing up outputs in a predetermined region, input to the Sample holding circuit SH or A/D converter circuit of the background light elimination circuit PCC. The predetermined region includes a region containing one photodetector column.

Figure 18:
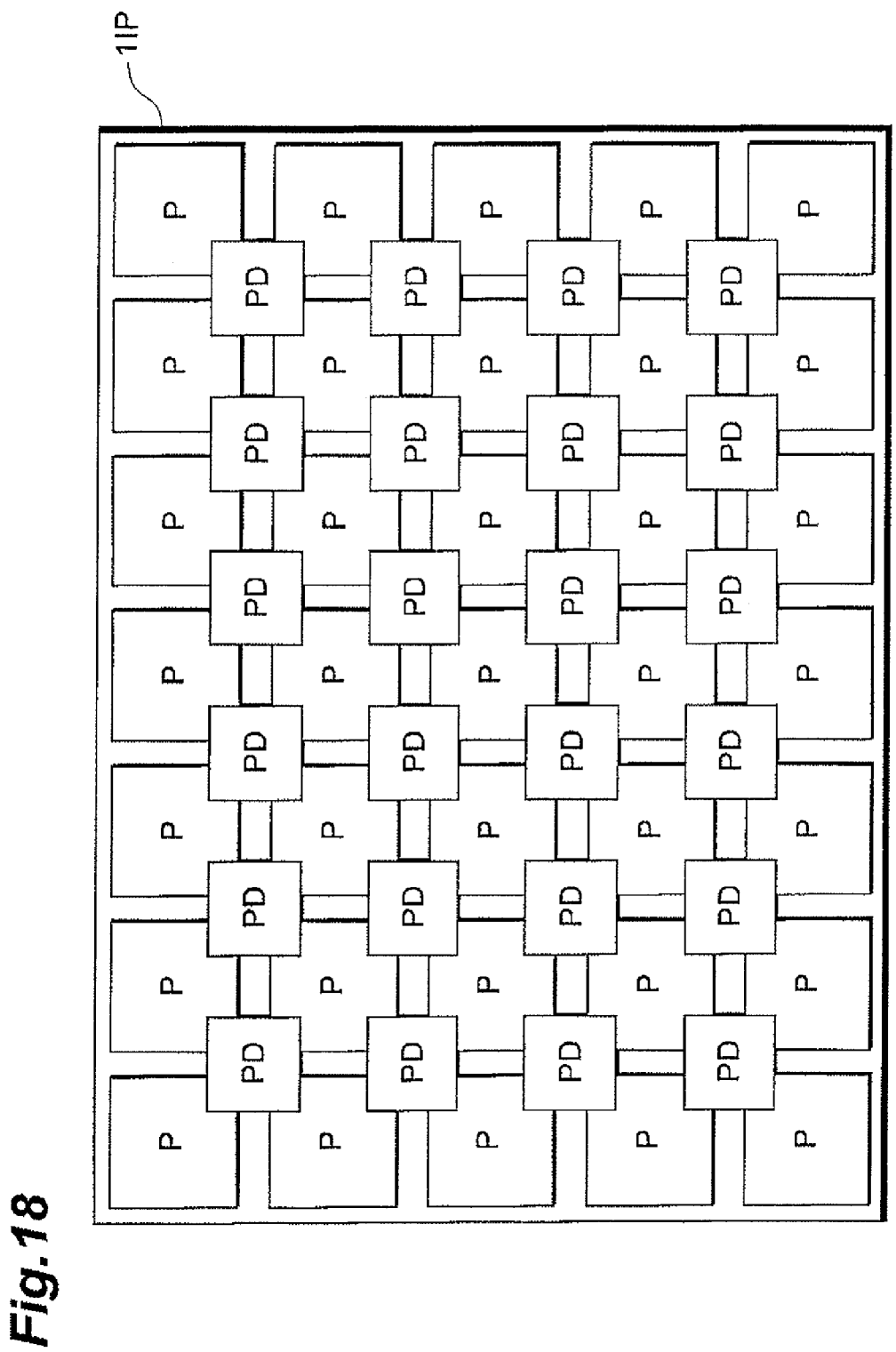
FIG. 18 is a plan view of an imaging region 1IP showing an arrangement example of pixels P and photodetectors PD.

FIG. 18 is a plan view of an imaging region 1IP showing an arrangement example of the foregoing pixels. P and photodetectors PD.

In the quadrangular imaging region 1IP, a plurality of pixels P and photodetectors PD are arranged. The pixels P are arrayed parallel to one side of the imaging region 1IP, and photodetectors PD are arranged sharing partial regions of a plurality of adjacent pixels P. In the present example, a photodetector PD is arranged in the center of mutually adjacent four pixels P. Outputs of the plurality of photodetectors PD are, by summing up all in the imaging region 1IP or by summing up outputs in a predetermined region, input to the Sample holding circuit SH or A/D converter circuit of the background light elimination circuit PCC.

Figure 19:
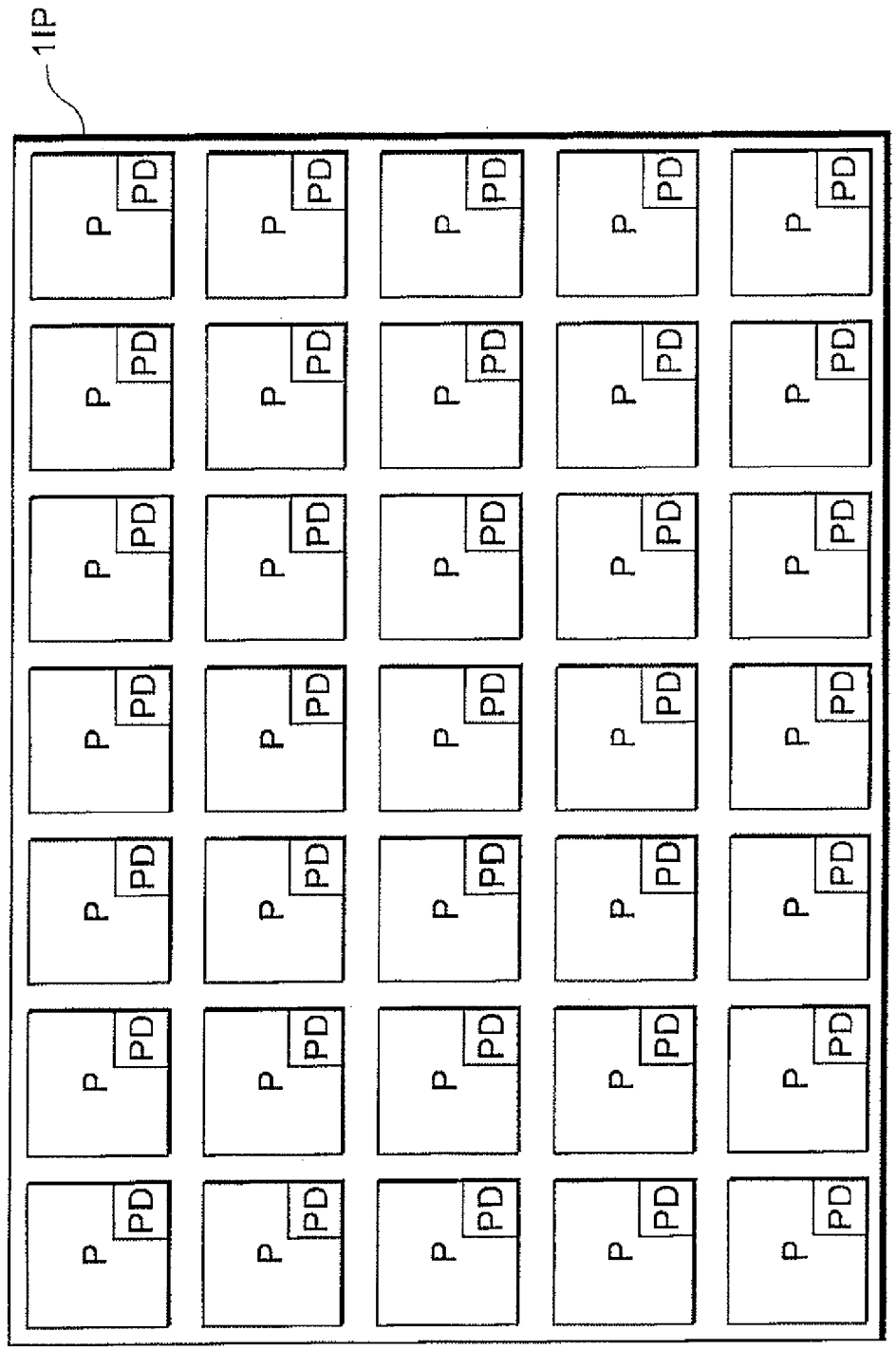
FIG. 19 is a plan view of an imaging region 1IP showing an arrangement example of pixels P and photodetectors PD.

FIG. 19 is a plan view of an imaging region 1IP showing an arrangement example of the foregoing pixels P and photodetectors PD.

In the quadrangular imaging region 1IP, a plurality of pixels P and photodetectors PD are arranged. The pixels P are arrayed parallel to one side of the imaging region 1IP, and photodetectors. PD are arranged in partial regions of pixels P, respectively. Outputs of the plurality of photodetectors PD are, by summing up all in the imaging region 1IP or by summing up outputs in a predetermined region, or as outputs of individual pixels, input to the Sample holding circuit SH or A/D converter circuit of the background light elimination circuit PCC.

Figure 20:
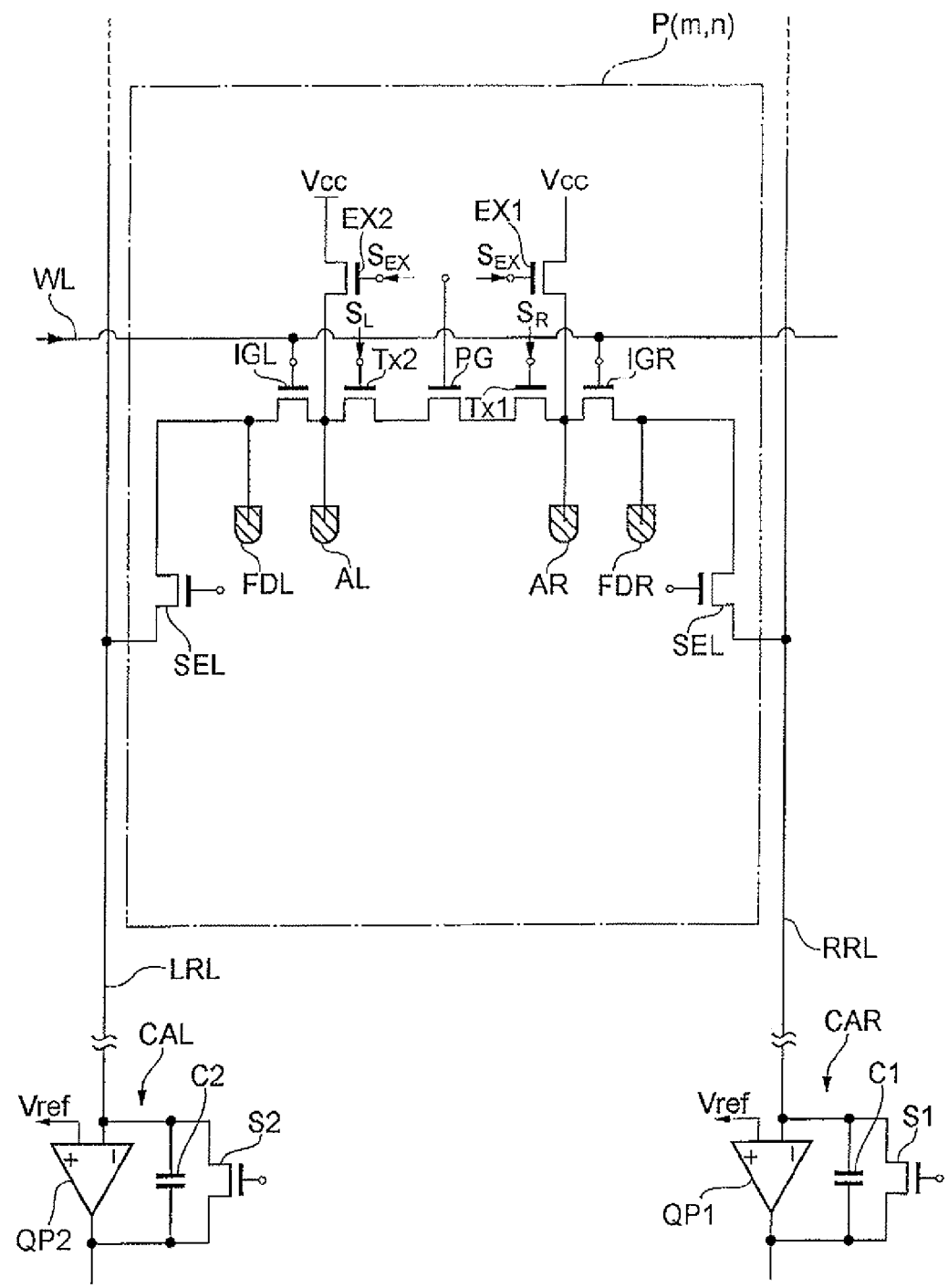
FIG. 20 is a circuit diagram of a pixel P(m, n) and amplifiers.

FIG. 20 is a circuit diagram of a pixel P(m, n) and amplifiers.

The vertical readout lines RRL, LRL are connected to inverting input terminals of charge amplifiers CAR, CAL, respectively.

The charge amplifier CAR includes a capacitor C1 and a transistor S1 serving as a switch connected between an inverting input terminal and an output terminal of an operation amplifier QP1, and a non-inverting input terminal thereof is connected to a reference potential Vref.

The charge amplifier CAL includes a capacitor C2 and a transistor S2 serving as a switch connected between an inverting input terminal and an output terminal of an operation amplifier QP2, and a non-inverting input terminal thereof is connected to a reference potential Vref.

When the transistor S1, S2 is turned on, the capacitor C1, C2 is short-circuited. When the transistor S1, S2 is turned off, charge is accumulated in the capacitor C1, C2, and a voltage according to the accumulated charge is output.

Thus using the amplifier allows increasing an output gain.

Figure 21:
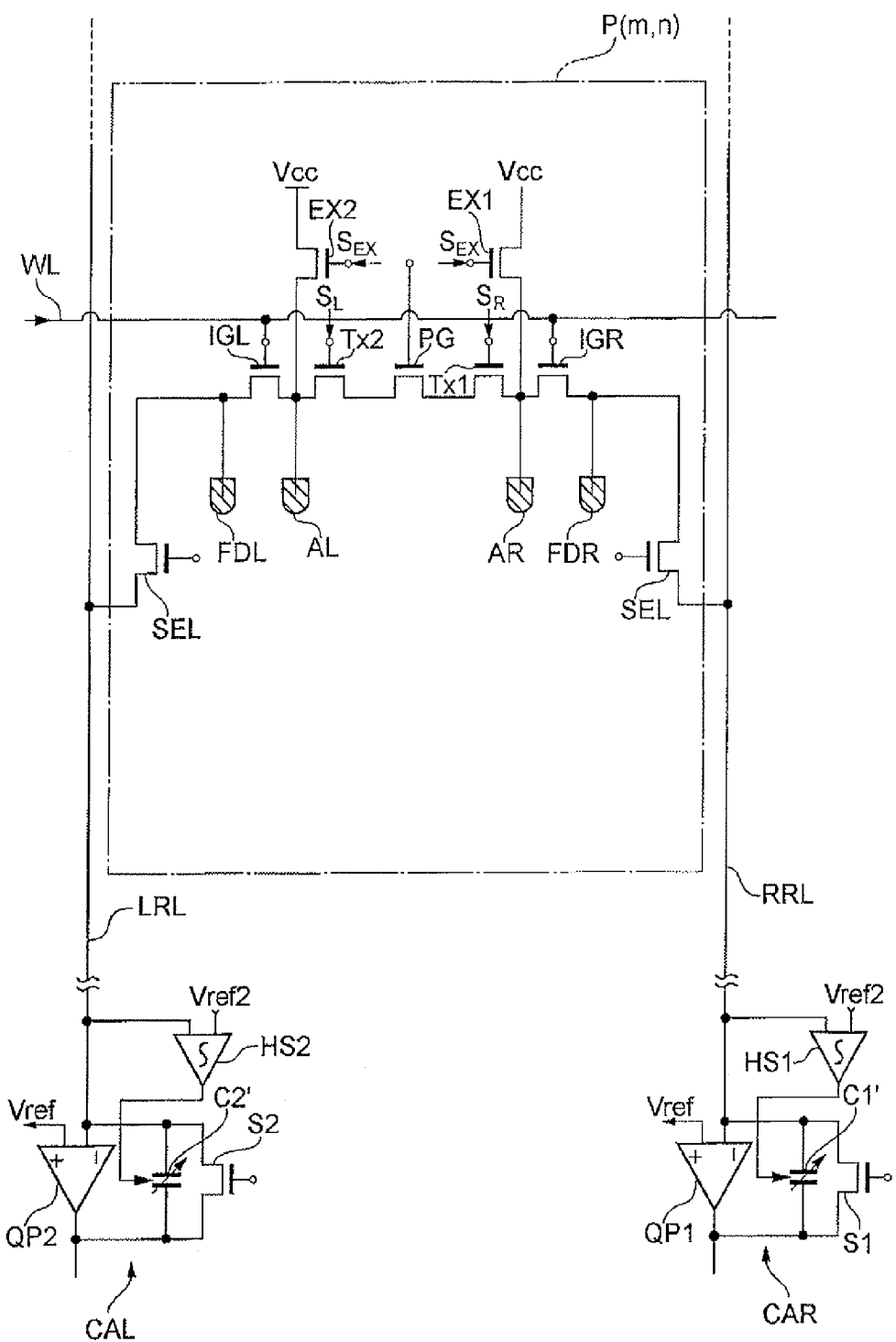
FIG. 21 is a circuit diagram of a pixel P(m, n) and amplifiers.

FIG. 21 is a circuit diagram of a pixel P(m, n) and amplifiers.

For this amplifier, the capacitor C1, C2 of the charge amplifier CAR, CAL shown in FIG. 20 is replaced by a variable capacitor C1', C2', and the capacitance of the variable capacitor C1', C2' is controlled by an output of a hysteresis comparator HS1, HS2. The comparator HS1, HS2 is connected at one input terminal thereof to the vertical readout line RRL, LRL, and input at the other input terminal thereof with a reference potential Vref2. When the potential of the vertical readout line RRL, LRL exceeds the reference potential Vref2, the detection range can be extended by increasing the capacitance of the capacitor C1, C2, and at the reference potential Vref2 or less, the detection sensitivity can be increased by reducing the capacitance of the capacitor C1, C2. Thus making the gain variable allows also meeting detection of weak light. In addition, as an amplifier configuration, either a source follower or a charge amplifier can be applied.

Next, description will be given of an example of modification of an electrode array in a pixel.

Figure 22:
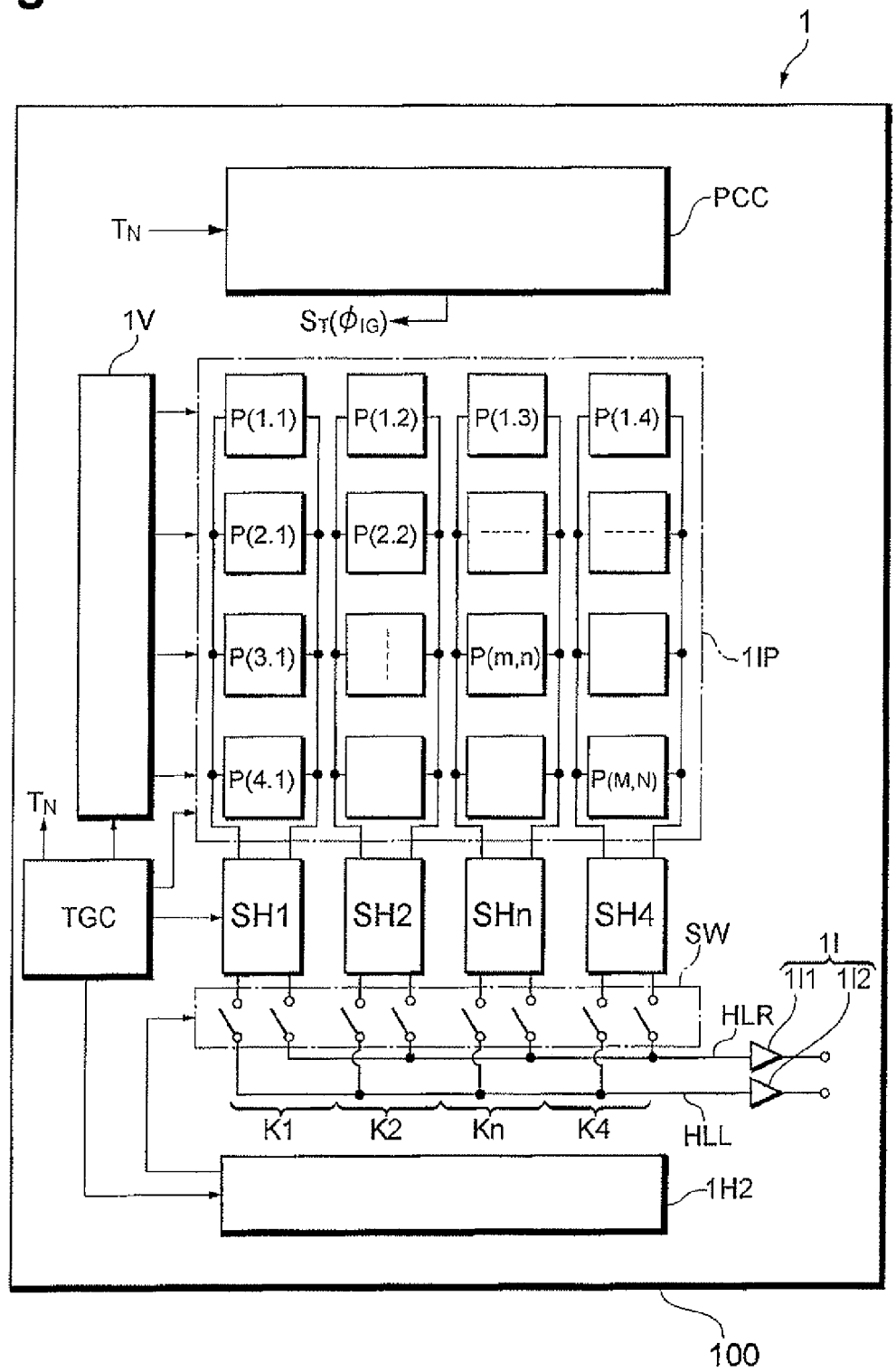
FIG. 22 is a plan view of a solid state imaging element 1 having pixels with an electrode array modified.

FIG. 22 is a plan view of the solid state imaging element 1 having pixels with an electrode array modified.

On the semiconductor substrate 100, an imaging region 1IP formed of a plurality of pixels P(m, n) and distance information readout circuits K1, K2, Kn, and K4 are provided, and this solid state imaging element 1 is the same as the solid state imaging element 1 shown in FIG. 8, except for the structure in the pixel P(m, n) and a timing signal to be output from the timing generation circuit TGC to an in-pixel electrode.

The timing generation circuit TGC generates various timing signals in response to an input drive signal. The timing signal to be generated in the timing generation circuit TGC, by turning on a selector switch SEL (see FIG. 26) of each pixel by the vertical shift register 1V, reads out the value of the charge amount of carriers accumulated in a floating diffusion region (third accumulation region FDR, FDL (see FIG. 26)) within a pixel for each pixel row, while alternately turning on right and left transistors (TX1, TX2 (see FIG. 26)) to accumulate carriers in a first accumulation region (AR, AL (see FIG. 26)).

The horizontal shift register 1H2 turns on the switch group SW for each pixel column in response to a control signal input from the timing generation circuit TGC. By turning on the switches composing the switch group SW by the horizontal shift register 1H2, the value of the charge amount Q1 held in the Sample holding circuit SHn is output to the outside via the right horizontal line HLR and an output buffer 1I1, and the value of the charge amount Q2 held in the Sample holding circuit SHn is output to the outside via the left horizontal line HLL and an output buffer 1I2.

Prior to accumulation of the charge amount Q1, Q2, detection of a background light is performed. The timing generation circuit TGC generates a background light detection signal $T_N$ in synchronization with an input trigger signal. The background light detection signal $T_N$ is input to the background light elimination circuit PCC. The background light elimination circuit PCC, when the background light detection signal $T_N$ is on, performs detection of a background light, holds a value generated by the detection, and thereafter outputs a potential control voltage $\phi_{IG}$ ($=\phi_{IGR}, \phi_{IGL}$) as a transfer signal $S_T$ to the second gate electrode IG (IGR, IGL).

FIG. 23 are a plan view (FIG. 23(A)) of the pixel P(m, n) shown in FIG. 22, a longitudinal sectional view (FIG. 23(B)) of the pixel P(m, n), and a potential diagram (FIG. 23(C)) in a semiconductor at no bias in the longitudinal sectional view.

Although, in FIG. 6, the floating diffusion region has been referred to as a second accumulation region, this will be referred to as a third accumulation region in the present example.

The pixel P(m, n) includes a p-type semiconductor substrate 100 and an insulating layer 101 formed on the semiconductor substrate 100. On the insulating layer 101, a light-shielding film SM is provided. The light-shielding film SM includes light entrance openings OP on a pixel-by-pixel basis. On the insulating layer 101 directly below the opening OP, a pixel electrode PG is arranged. A surface area within the semiconductor substrate 100 directly below the pixel electrode PG of the semiconductor substrate 100 is provided as a light-sensitive area SA. On both sides of the pixel electrode PG, a pair of first gate electrodes TX1 and TX2 are arranged on the insulating layer 101. On the outside of the first gate electrodes TX1, TX2, a pair of first accumulation regions AR and AL provided in the semiconductor substrate 100 are located. Further, on the outside of the first accumulation regions AR, AL, a pair of charge buffer regions (second accumulation regions) BR and BL provided in the semiconductor substrate 100 are located. Above a region between the first accumulation regions AR, AL and the charge buffer regions BR, BL, second gate electrodes IGR, IGL are respectively located on the insulating layer 101.

In the semiconductor substrate 100, a pair of third accumulation regions FDR and FDL are provided on the outside of the charge buffer regions BR, BL. The first accumulation region AR, AL, the charge buffer region BR, BL, and the second accumulation region FDR, FDL are each formed of an n-type semiconductor region.

Above a semiconductor region between the charge buffer regions BR, BL and the third accumulation regions FDR, FDL, a pair of third gate electrodes TGR and TGL are arranged on the insulating layer 101. The third gate electrodes TGR, TGL are provided on the semiconductor substrate 100 so as to control the height of the second potential barriers $\phi_G$ each interposed between the charge buffer regions BR, BL and the third accumulation regions FDR, FDL. The second potential barrier $\phi_G$ is given by a difference between the potential $\phi_{BR}$, $\phi_{BL}$ of the charge buffer region BR, BL and the potential $\phi_{TGR}$, $\phi_{TGL}$ of a semiconductor directly below the third gate electrode TGR, TGL.

The method for accumulating carriers in the first accumulation regions AR, AL and the charge buffer regions. BR, BL serving as the second accumulation regions is as described above, and adjusting the potential $\phi_{IGR}$, $\phi_{IGL}$ between these according to the background light intensity allows accumulating carriers (charge amounts Q1, Q2) due to a reflected light of a probe light in the charge buffer regions BR, BL serving as the second accumulation regions.

By lowering the height of the second potential barrier $\phi_G$ to carriers, the carriers accumulated in the charge buffer regions BR, BL are transferred to the third accumulation regions FDR, FDL, and then the height of the second potential bather $\phi_G$ is increased, and with the carriers held in the third accumulation regions FDR, FDL, the application potentials to the first gate electrodes TX1, TX2, the second gate electrodes IGR, IGL, and the third gate electrodes TGR, TGL are controlled so that carriers are alternately accumulated in the pair of the first accumulation regions AR and AL. In order to raise (deepen) the potential, it suffices to raise the potential to be applied to each gate electrode.

Moreover, in the plan view of FIG. 23, the width in the direction vertical to a carrier transfer direction of the third accumulation region FDR, FDL and a region outside thereof is shown narrower than the width in the direction vertical to a carrier transfer direction of the first accumulation region AR, AL and the second accumulation region BR, BL, so that the density of fine carriers in the third accumulation region FDR, FDL can be improved, and reducing the capacitance thereof allows increasing the conversion gain.

The pixel P(m, n) includes carrier discharge regions DEX1, DEX2 adjacent to the first accumulation regions AR, AL, respectively. More specifically, carriers corresponding to the background light component remain to be accumulated in the first accumulation regions AR, AL, and the accumulated carriers are discharged to the outside via the carrier discharge regions DEX1, DEX2. The carrier discharge regions DEX1, DEX2 are formed of an n-type semiconductor.

Above a semiconductor region between the right first accumulation region AR and the carrier discharge region DEX1, the gate electrode EX1 for a carrier discharge is located on the insulating layer 101, and when a positive potential is applied to the right gate electrode EX1, carriers accumulated in the first accumulation region AR flow in the carrier discharge region DEX1, and are output to the outside via wiring electrically connected to the carrier discharge region DEX1.

Above a semiconductor region between the left first accumulation region AL and the carrier discharge region DEX2, the gate electrode EX2 for a carrier discharge is located on the insulating layer 101, and when a positive potential is applied to the gate electrode EX2, carriers accumulated in the left first accumulation region AL flow in the carrier discharge region DEX2, and are output to the outside via wiring electrically connected to the carrier discharge region DEX2.

Outside of the third accumulation regions FDR, FDL, reset drain regions RDR, RDL formed of a pair of n-type semiconductor regions are provided, and above a semiconductor region between the third accumulation region FDR, FDL and the reset drain region RDR, RDL, the gate electrode TRR, TRL for resetting is provided on the insulating layer 101. The potential $\phi_{TRR}$, $\phi_{TRL}$ of a semiconductor region directly below the gate electrode TRR, TRL is deepened as a result of applying a positive potential to the gate electrode TRR, TRL, and the third accumulation region FDR, FDL and the reset drain region RDR, RDL are connected to each other. Although the reset drain region RDR, RDL is connected to the power supply potential, the reset drain region RDR, RDL has a potential $\phi_{RDR}$, $\phi_{RDL}$ at no bias.

Figure 24:
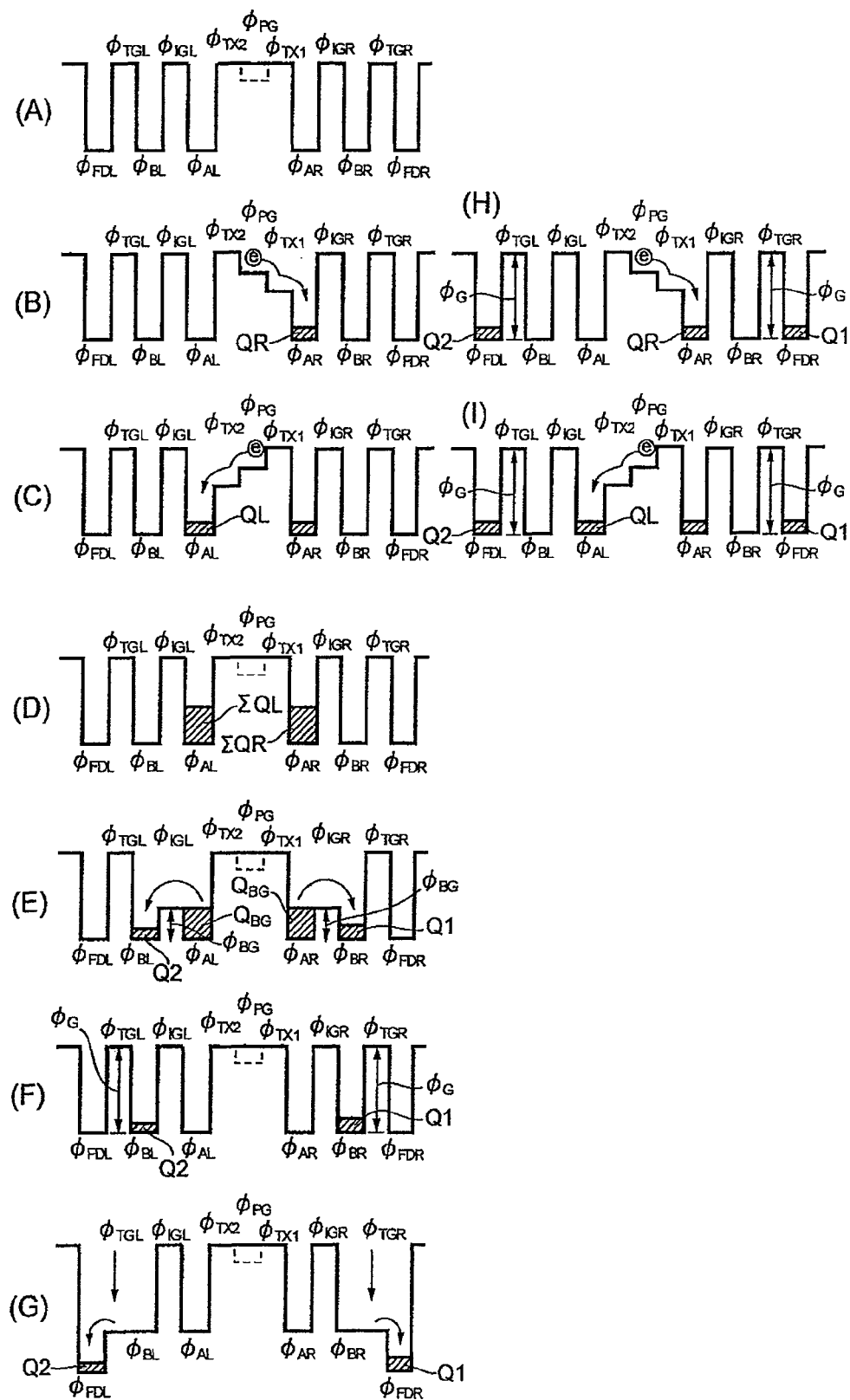
FIG. 24 are potential diagrams for explaining an accumulation and discharge operation of carriers.

FIG. 24 are potential diagrams for explaining an accumulation and discharge operation of carriers.

In an initial state, potentials $\phi_{FDL}$, $\phi_{BL}$, $\phi_{AL}$, $\phi_{AR}$, $\phi_{BR}$, $\phi_{FDR}$ are high (deep), no carriers are accumulated in each potential well. In addition, a slight positive potential may be applied to $\phi_{PG}$ according to necessity (FIG. 24(A)).

In a period of a first half cycle of a drive pulse, the potential $\phi_{PG}$ and the right potential $\phi_{TX1}$ are deepened to transfer carriers into a well of the potential $\phi_{AR}$ of the right first accumulation region (FIG. 24(B)). A charge amount QR is accumulated in the right potential well.

In a period of a second half cycle of a drive pulse, the potential $\phi_{PG}$ and the left potential $\phi_{TX2}$ are deepened to transfer carriers into a well of the potential $\phi_{AL}$ of the left first accumulation region (FIG. 24(C)). A charge amount QL is accumulated in the left potential well.

By repeating a small charge accumulation step consisting of FIG. 24(B) and FIG. 24(C) M times, a charge amount $\Sigma QR$, $\Sigma QL$ integrated M-fold is accumulated in each potential well (FIG. 24(D)).

Thereafter, potentials $\phi_{IGR}$, $\phi_{IGL}$ are deepened (reduced in barrier height) to cause a charge amount $Q_{BG}$ of carriers corresponding to a background light component to remain in wells of the respective potentials $\phi_{AR}$ and $\phi_{AL}$, and a charge corresponding to a residual pulse light component is flooded to transfer the charge into wells of the potentials $\phi_{BR}$, $\phi_{BL}$ of the charge buffer regions. In the wells of the potentials $\phi_{BR}$, $\phi_{BL}$ of the charge buffer regions, carriers of the charge amounts Q1, Q2 are accumulated (FIG. 24(E)).

Next, carriers of the charge amount $Q_{BG}$ remaining in the wells of the potentials $\phi_{AR}$ and $\phi_{AL}$ of the first accumulation regions are transferred to the carrier discharge regions DEX1, DEX2 by applying a positive potential to the gate electrode EX1, EX2 shown in FIG. 23, and discharged to the outside (FIG. 24(F)). In addition, because a total charge amount of carriers to be discharged corresponds to the brightness of each pixel, reading out this on a pixel-by-pixel basis allows obtaining a brightness image.

In addition, according to the specifications, an integrated charge accumulation step consisting of M times of repeating steps of FIG. 24(B) and FIG. 24(C) and a transfer step of FIG. 24(D) to FIG. 24(F) is repeated X times returning to the step of FIG. 24(B). In this case, a signal component of a pulse light contained in M×X times of carriers of a small charge can be accumulated in wells of the potentials $\phi_{BR}$, $\phi_{BL}$ of the charge buffer regions.

Next, the potential $\phi_{TGR}$, $\phi_{TGL}$ is deepened to reduce the potential barrier $\phi_G$ to carriers, and the carriers accumulated in the well of the potential $\phi_{BR}$, $\phi_{BL}$ of the charge buffer region are transferred to the well of the potential $\phi_{FDR}$, $\phi_{FDL}$ of the third accumulation region (FIG. 24(G)). At this time, although only carrier diffusion may be used as carrier transfer power, the potential $\phi_{FDR}$, $\phi_{FDL}$ of the third accumulation region is connected here to the power supply potential or the like to deepen the potential in advance. The process up to here is provided as a first carrier accumulation step.

Next, a second carrier accumulation step is performed. In addition, within the period of execution of the second carrier accumulation step, the carriers accumulated in the well of the potential $\phi_{FDR}$, $\phi_{FDL}$ of the third accumulation region are sequentially read out.

In the second carrier accumulation step, in the same manner as the above, after transferring carriers, with the carriers held in the well of the potential $\phi_{FDR}$, $\phi_{FDL}$, as in FIG. 24(B), in a period of a first half cycle. of a drive pulse, the potential $\phi_{PG}$ and the right potential $\phi_{TX1}$ are deepened to transfer carriers into a well of the potential $\phi_{AR}$ of the right first accumulation region (FIG. 24(H)). The height of the right- and left second potential barriers $\phi_G$ is increased in advance to the original position. A charge amount QR is again accumulated in the right potential well.

With the carriers held in the well of the potential $\phi_{FDR}$, $\phi_{FDL}$, in a period of a second half cycle of a drive pulse, the potential $\phi_{PG}$ and the left potential $\phi_{TX2}$ are deepened to transfer carriers into a well of the potential $\phi_{AL}$ of the left first accumulation region (FIG. 24(I)). A charge amount QL is accumulated in the left potential well.

By repeating a small charge accumulation step consisting of FIG. 24(H) and FIG. 24(I) M times, a charge amount ΣQR, ΣQL integrated M-fold is accumulated in each potential well (in addition, within the period of execution of the second carrier accumulation step, the carriers accumulated in the well of the potential $\phi_{FDR}$, $\phi_{FDL}$ of the third accumulation region are sequentially read out, and thus description will be given in the following assuming that the carriers in the third accumulation region have been read out. See FIG. 24(D)).

Thereafter, potentials $\phi I_{GR}$, $\phi I_{GL}$ are deepened (reduced in barrier height) to cause a charge amount $Q_{BG}$ of carriers corresponding to a background light component to remain in wells of the respective potentials $\phi_{AR}$ and $\phi_{AL}$, and a charge corresponding to a residual pulse light component is flooded to transfer the charge into wells of the potentials $\phi_{BR}$, $\phi_{BL}$ of the charge buffer regions. In the wells of the potentials $\phi_{BR}$, $\phi_{BL}$ of the charge buffer regions, carriers of the charge amounts Q1, Q2 are accumulated (see FIG. 24(E)).

Next, carriers of the charge amount $Q_{BG}$ remaining in the wells of the potentials $\phi_{AR}$ and $\phi_{AL}$ of the first accumulation regions are transferred to the carrier discharge regions DEX1, DEX2 by applying a positive potential to the gate electrode EX1, EX2 shown in FIG. 23, and discharged to the outside (see FIG. 24(F)).

In addition, according to the specifications, an integrated charge accumulation step consisting of M times of repeating steps of FIG. 24(H) and FIG. 24(I) and a transfer step of FIG. 24(D) to FIG. 24(F) is repeated X times back in the step of FIG. 24(H). In this case, a signal component of a pulse light contained in M×X times of carriers of a small charge can be accumulated in wells of the potentials $\phi_{BR}$, $\phi_{BL}$ of the charge buffer regions. In the following, the step of FIG. 24(G) is similarly executed.

In the foregoing example shown in FIG. 10, when carriers of the last measurement have been accumulated in the second accumulation region, if the first gate electrode is driven in this measurement, the carriers will be mixed. However, in the present example, the height of the second potential barrier $\phi_G$ is lowered to transfer the carriers to the third accumulation regions FDR, FDL (FIG. 24(G)), and then the height of the second potential barrier $\phi_G$ is increased (FIG. 24(H), FIG. 24(I)), so that carriers are prevented from flowing in from the charge buffer region $\phi_{BR}$, $\phi_{BL}$ to the third accumulation region FDR, FDL when the following steps of FIGS. 24(H), (I), (D), (E), and (F) are performed. As shown in FIG. 24(H) and FIG. 24(I), it becomes possible to drive the first gate electrode to make carriers generated in this measurement flow in the charge buffer region $\phi_{BR}$, $\phi_{BL}$ from the light-sensitive area or to transfer carriers as in the step of FIG. 24(E) while reading out carriers accumulated in the third accumulation region FDR, FDL. This allows shortening the measurement time.

Figure 25:
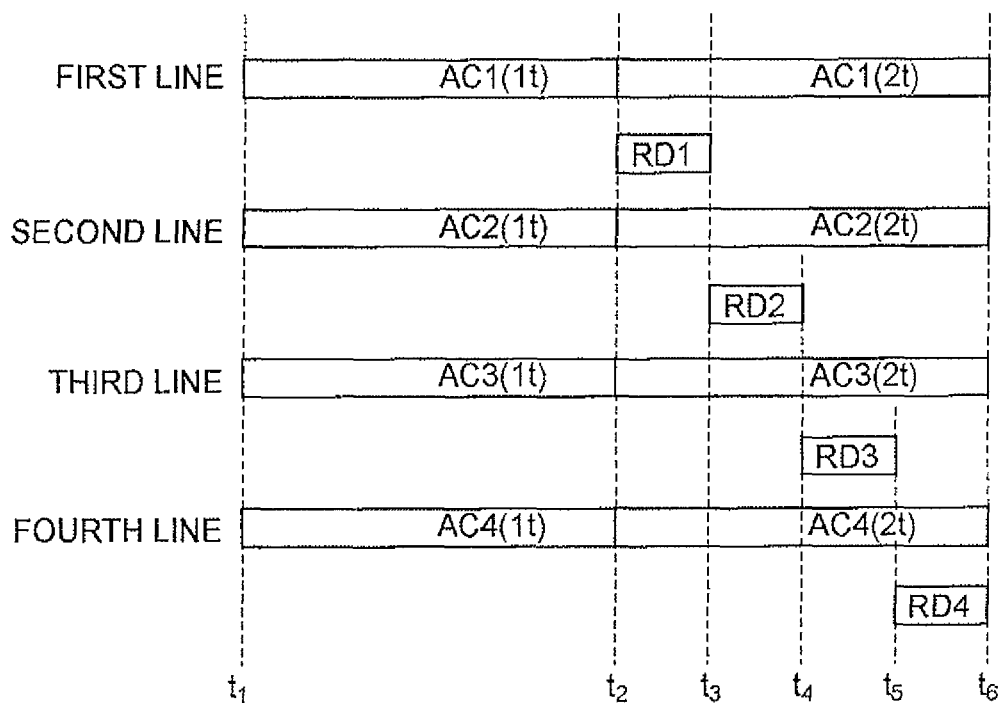
FIG. 25 is a time chart diagram showing a relationship between carrier accumulation and readout.

FIG. 25 is a time chart diagram showing a relationship between carrier accumulation and readout.

For a period of time $t_1$ to $t_2$, a first carrier accumulation step (AC1(1t)) is performed in a first pixel row. Similarly, for a period of time $t_1$ to $t_2$, a first carrier accumulation step (AC2(1t), AC3(1t), AC4(1t)) is performed in a second, third, or fourth pixel row.

After the first carrier accumulation step ends, for a period of time $t_2$ to $t_6$, a second carrier accumulation step (AC1(2t), AC2(2t), AC3(2t), AC4(2t)) is performed in each pixel row.

Here, in a period of time $t_2$ to $t_3$, a readout step (RD1) of carriers accumulated in the third accumulation region FDR, FDL is performed in the first pixel row. In a period of time $t_3$ to $t_4$, a readout step (RD2) of carriers accumulated in the third accumulation region FDR, FDL is performed in the second pixel row. In a period of time $t_5$ to $t_6$, a readout step (RD3) of carriers accumulated in the third accumulation region FDR, FDL is performed in the third pixel row. In a period of time $t_5$ to $t_6$, a readout step (RD4) of carriers accumulated in the third accumulation region FDR, FDL is performed in the fourth pixel row.

As in the above, in the present example, a carrier accumulation step can be executed while a carrier readout step is executed, and thus the measurement time can be shortened.

Figure 26:
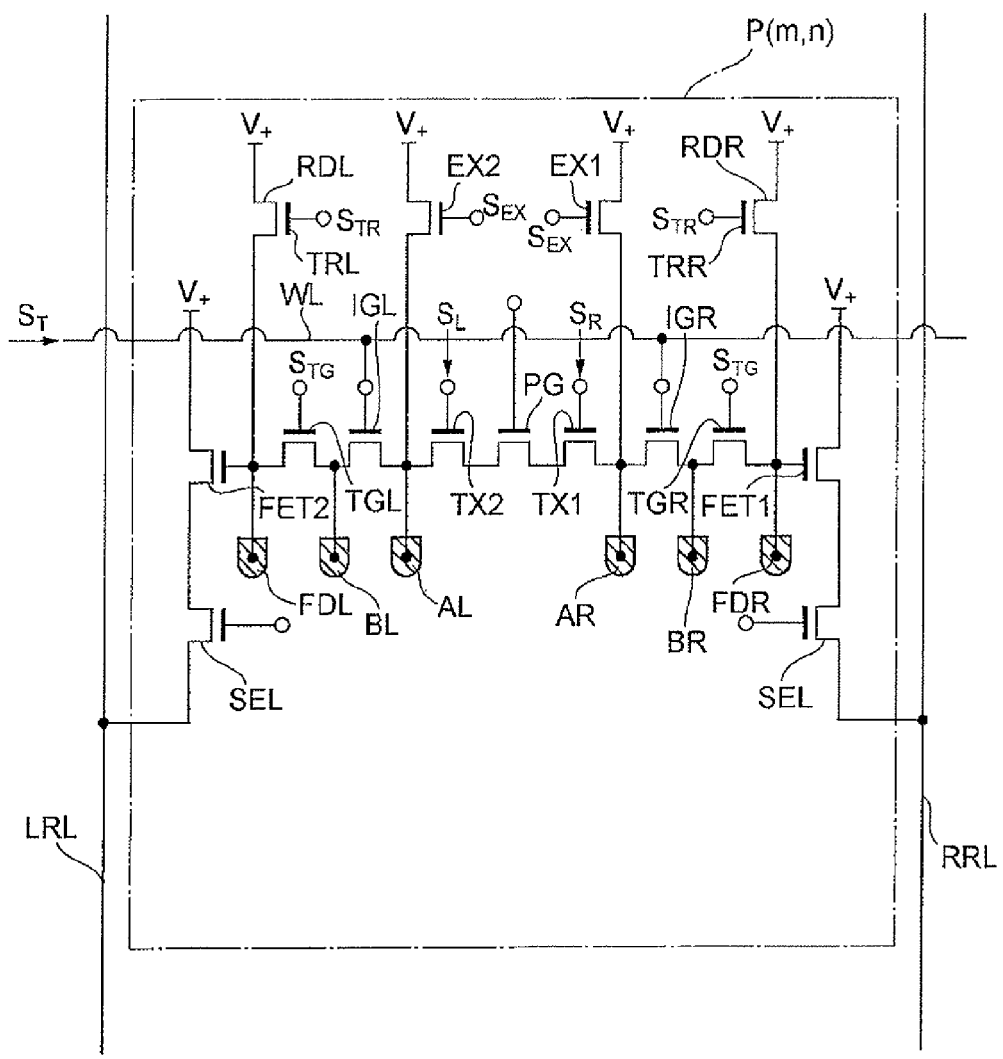
FIG. 26 is a circuit diagram of the pixel P(m, n) shown in FIG. 23.

FIG. 26 is a circuit diagram of the pixel P(m, n) shown in FIG. 23.

A transistor having each gate electrode is denoted using a sign of a corresponding gate electrode in parentheses. Moreover, a side to which carriers flow in at readout of carriers is set to a source of the transistor, and a side from which carriers flow out is set to a drain.

The circuit shown in FIG. 26 and the circuit shown in FIG. 13 are different in that the charge buffer regions BR, BL, the third gate electrodes TGR, TGL, and the transistors (TRR, TRL) for resetting have been added, and are the same in the other aspects of the configuration. Hereinafter, detailed description will be given.

One end of a transistor containing a pixel electrode PG is connected to a source of an NMOS transistor containing a gate electrode TX1, and a drain of the NMOS transistor (TX1)

is connected to a first accumulation region AR, a source of an NMOS transistor (IGR), and a source of a carrier discharging transistor (EX1), and a drain of the NMOS transistor (EX1) for a carrier discharge is connected to a power supply potential V+. The first accumulation region AR is connected to the source of the NMOS transistor (IGR) for background light component elimination, and a drain of the NMOS transistor (IGR) is connected to a charge buffer region BR.

The charge buffer region BR is connected to a source of an NMOS transistor (TGR). A drain of the transistor (TGR) is connected to a third accumulation region FDR, a source of an NMOS transistor (TRR) for resetting, and a gate electrode of a PMOS transistor FET1. A drain region RDR of the transistor (TRR) is connected to a power supply potential V+. Moreover, a source of the PMOS transistor FET1 is connected to a power supply potential V+, and a drain thereof is connected to a right PMOS transistor SEL for output selection. Moreover, a gate electrode IGR of the transistor (IGR) is input with a transfer signal $S_T(=\phi_{IGR})$ of carriers via a common line WL. A drain of the transistor SEL is connected to a right vertical readout line RRL. To the vertical readout line RRL, a current corresponding to the charge amount Q1 to be accumulated in the third accumulation region FDR flows in. In addition, the third accumulation region FDR is connected to the power supply potential V+ by turning on the transistor (TRR), and the accumulated charge is reset. In addition, to a gate electrode TRR of the transistor (TRR), a reset signal $S_{TR}$ is applied. Moreover, to a gate electrode EX1 of the charge discharging transistor (EX1), a discharge signal $S_{EX}$ is applied. In addition, the power supply potentials V+ are different in size from each other according to the design.

The other end of the transistor containing the pixel electrode PG is connected to a source of an NMOS transistor containing a gate electrode TX2, and a drain of the NMOS transistor (TX2) is connected to a first accumulation region AL, a source of an NMOS transistor (IGL), and a source of a carrier discharging transistor (EX2), and a drain of the NMOS transistor (EX2) for a carrier discharge is connected to a power supply potential V+. The first accumulation region AL is connected to the source of the NMOS transistor (IGL) for background light component elimination, and a drain of the NMOS transistor (IGL) is connected to a charge buffer region BL.

The charge buffer region BL is connected to a source of an NMOS transistor (TGL). A drain of the transistor (TGL) is connected to a third accumulation region FDL, a source of an NMOS transistor (TRL) for resetting, and a gate electrode of a PMOS transistor FET2. A drain region RDL of the transistor (TRL) is connected to a power supply potential V+. Moreover, a source of the PMOS transistor FET2 is connected to a power supply potential V+, and a drain thereof is connected to a left PMOS transistor SEL for output selection. Moreover, a gate electrode 1GL of the transistor (IGL) is input with a transfer signal $S_T(=\phi_{IGL})$ of carriers via the common line WL. A drain of the left transistor SEL is connected to a left vertical readout line LRL. To the vertical readout line LRL, a current corresponding to the charge amount Q2 to be accumulated in the third accumulation region FDL flows in. In addition, the third accumulation region FDL is connected to the power supply potential V+ by turning on the transistor (TRL), and the accumulated charge is reset. In addition, to a gate electrode TRL of the transistor (TRL), a reset signal $S_{TR}$ is applied. Moreover, to a gate electrode EX2 of the charge discharging transistor (EX2), a discharge signal $S_{EX}$ is applied. In addition, the power supply potentials V+ are different in size from each other according to the design.

Moreover, for performing charge distribution, to the pair of first gate electrodes TX1 and TX2, a right pulse signal. $S_R$ and a left pulse signal $S_L$ are input, respectively.

After detecting a background light, by simultaneously applying the transfer signal $S_T$ to the gate electrodes IGR and IGL, the potential barrier $\phi_{BG}$ is lowered as described above to accumulate carriers corresponding to the reflected light in the charge buffer region BR, BL.

The carriers accumulated in the charge buffer region BR, BL are, by simultaneously applying a high-level transfer signal $S_{TG}$ to the gate electrodes TGR and TGL, transferred into the third accumulation region FDR, FDL, and thereafter, the level of the transfer signal $S_{TG}$ is made low level to increase the height of the foregoing potential barrier $\phi_G$ to carriers, so as to isolate the carriers accumulated in the third accumulation region FDR, FDL from the charge buffer region BR, BL.

At a transfer of carriers, the third accumulation region FDR, FDL is at a floating level, and in proportion to the negative charge amount Q1, Q2 having flowed therein, a current that flows through the transistor FET1, FET2 is determined. When a signal to turn on the transistor SEL for selection is input from a vertical shift register, according to an input gate voltage of FET1, FET2, a current corresponding to each charge amount Q1, Q2 flows to the vertical readout line RRL, LRL.

For setting the third accumulation region FDR, FDL to a floating level, it suffices to turn on the transistor (TRR, TRL) for resetting to connect the third accumulation region FDR, FDL to the power supply potentials V+ and then turn off the transistor (TRR, TRL).

Figure 27:
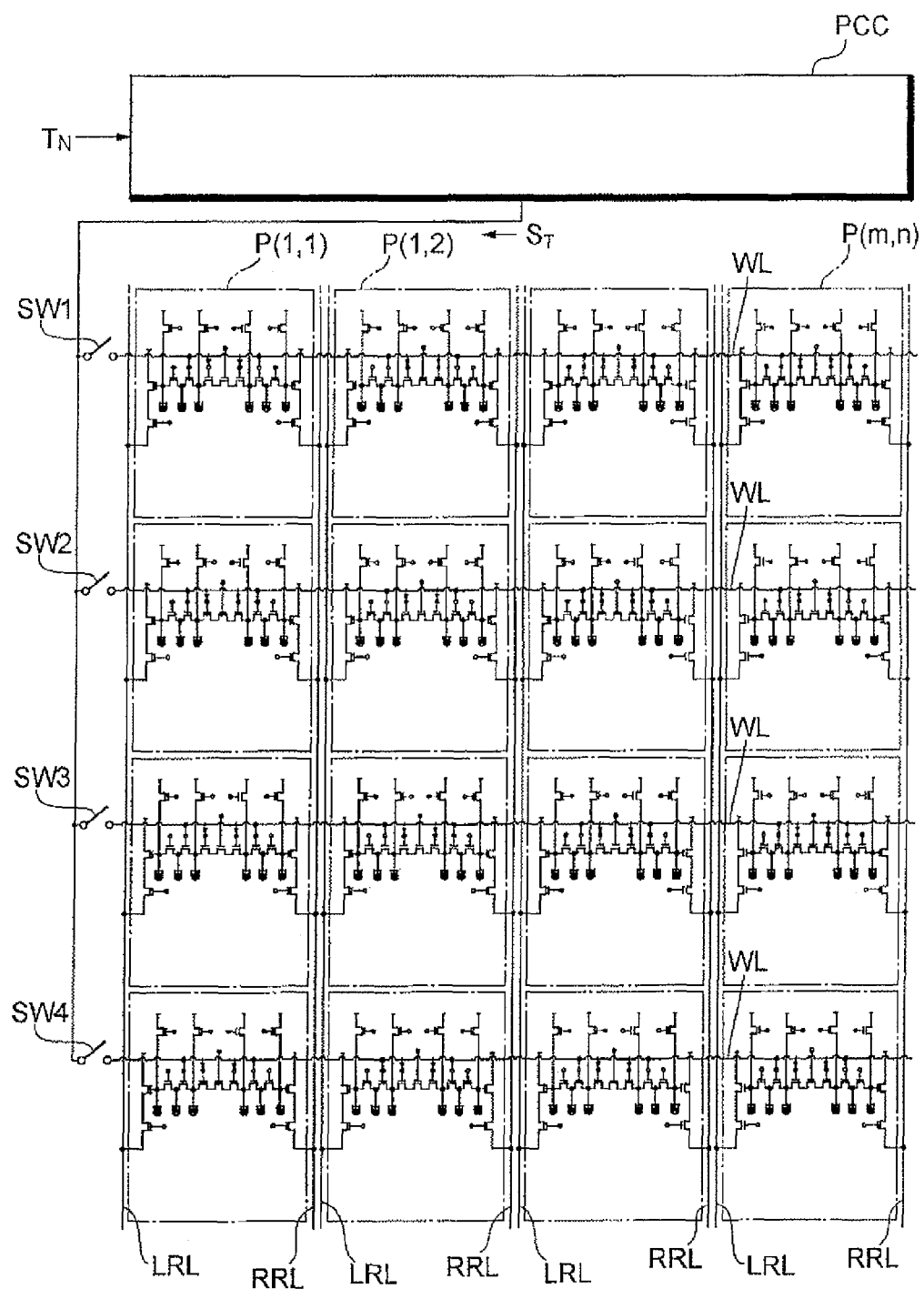
FIG. 27 is a circuit diagram of a solid state imaging element 1 formed by arraying the pixels P(m, n) shown in FIG. 26.

FIG. 27 is a circuit diagram of the solid state imaging element 1 formed by arraying the pixels P(m, n) shown in FIG. 26.

The transfer signal $S_T(\phi_{IG})$ output from the background light elimination circuit PCC is input to the common line WL of each pixel row, via a switch SW1, SW2, SW3, SW4 provided for each pixel row, to simultaneously turn on the second gate electrodes IGR and IGL for each pixel row (see FIG. 26). The common line WL is common in one pixel row.

In addition, when the switches SW1, SW2, SW3, and SW4 are simultaneously turned on, carriers can be simultaneously transferred to the charge buffer regions in all pixels. More specifically, when there is one reference background light component in one measurement cycle, it suffices to turn on the switches SW1, SW2, SW3, and SW4 simultaneously. By thus turning on the switches SW1, SW2, SW3, and SW4 simultaneously or by not providing switches, the measurement cycle of distance images can be shortened. Moreover, as will be described later, when self-reference type background light detection is performed, it suffices to, for example, sequentially generate a transfer signal $S_T$ of each pixel row from a background light component detected for each pixel row and turn on the switches SW1, SW2, SW3, and SW4 in order to thereby input the generated transfer signal $S_T$ to each corresponding pixel row. Thus performing a binning operation of a background light elimination allows shortening the measurement cycle of distance images.

Figure 28:
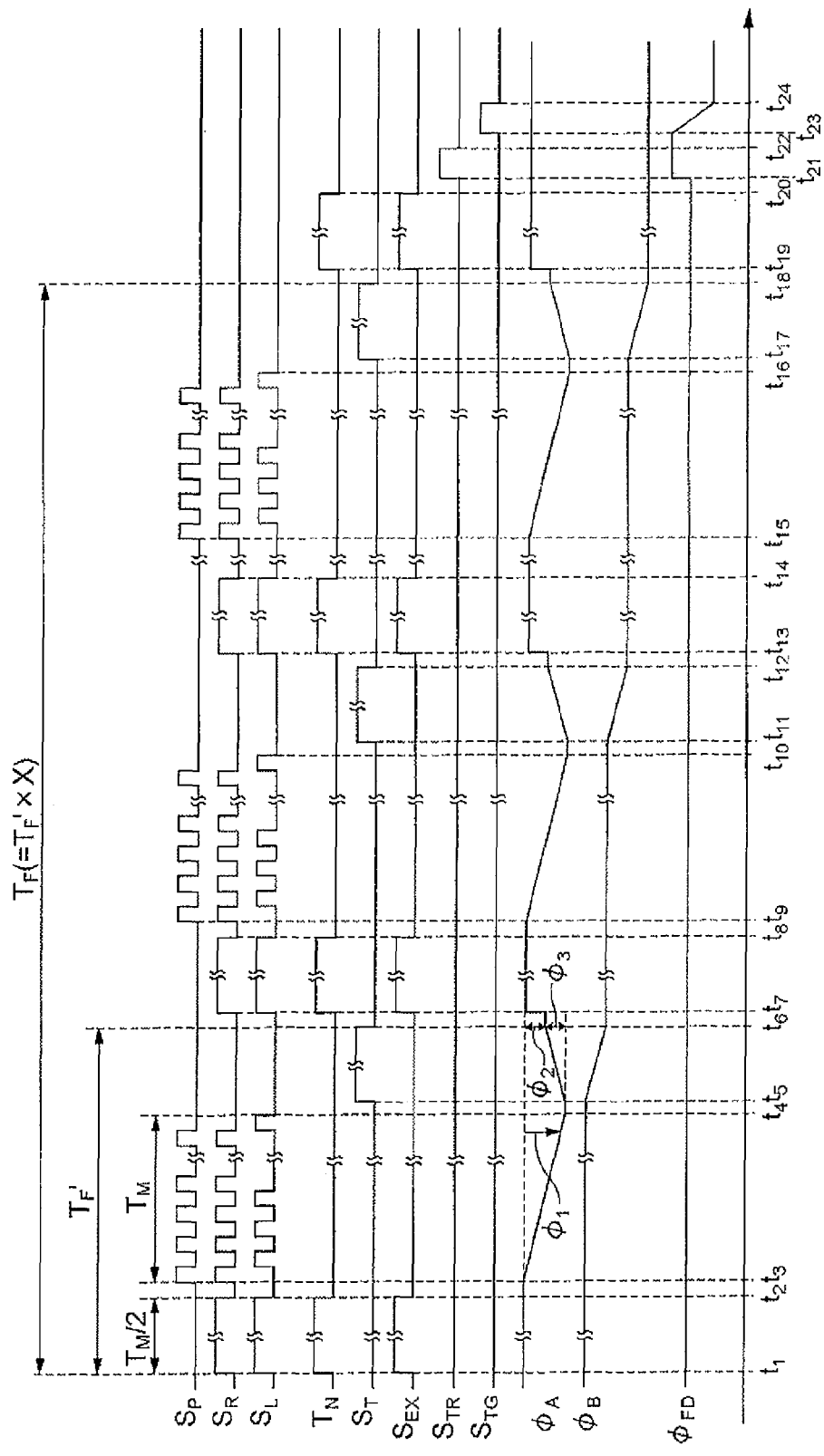
FIG. 28 is a timing chart of a solid state imaging device with a charge buffer region.

FIG. 28 is a timing chart of a solid state imaging device with a charge buffer region.

In a measurement period $T_F$ of signals in one pixel, the timings of signals excluding $S_{TR}$, $S_{TG}$, $\phi_B$ and $\phi_{FD}$ are the same as those shown in FIG. 16, and thus description thereof will be omitted if necessary.

The right pulse signal $S_R$ and the left pulse signal $S_L$ remain high level during detection of a background light in time $t_1$ to $t_2$. For this, although carriers are to flow in the first accumulation region, the carrier discharging signal $S_{EX}$ has been made high level (transistor ON), and these carriers are discharged to the outside. Accordingly, the potential $\phi_A(\phi_{AR}, \phi_{AL})$ in the first accumulation region remains fixed, and the potential $\phi_B(\phi_{BR}, \phi_{BL})$ of the charge buffer region is also fixed. In this timing chart as well, potential of one of the right and left regions is representatively shown.

In a period of time $t_3$ to $t_4$, the foregoing M times of detection is performed. At this time, the carrier discharging signal $S_{EX}$ has been made low level (transistor OFF), and the potential $\phi_A$ declines with an elapse of time. The amount of decline $\phi_1$ in potential $\phi_A$ is proportional to the amount of a received reflected pulse light and background light. In the present example, after accumulating carriers in the first accumulation region, the potential barrier $\phi_{IG}$ is lowered according to the amount of the background light. More specifically, the transfer signal $S_T$ is made high level (potential $\phi_{IG}$) for a period of time $t_5$ to $t_6$ to transfer carriers to the charge buffer region. As a result, electrons flow into the charge buffer region from the first accumulation region, so that the potential $\phi_A$ from which electrons have flowed out is raised, and the potential $\phi_B$ to which electrons have flowed in is lowered.

At time $t_6$, a difference $\phi_2$ between the potential of the first accumulation region in a state without carriers and the potential with carriers remaining matches a potential barrier $\phi_G$ corresponding to a background light component. Moreover, a difference $\phi_3$ between the potential at time $t_5$ of the first accumulation region in a state filled with carriers and the potential of the first accumulation region when carriers flowed out at time $t_6$ matches the charge amount of carriers having flowed in the charge buffer region, that is, the amount of delay of a reflected pulse light (modulation signal).

The above detection cycle period is provided as $T_F'$. Thereafter, the carrier discharging signal $S_{EX}$ is made high level (transistor ON) for a period of time $t_7$ to $t_8$ to discharge carriers remaining in the first accumulation region, while shifting to a next detection cycle period. In addition, for every detection cycle period $T_F'$, electrons are integrated and accumulated in the charge buffer region, and the potential $\phi_B$ thereof sequentially declines.

In the present example, after executing X times of detection cycle periods $T_F'$, the third accumulation region FDR, FDL serving as a floating diffusion region is reset in time $t_{21}$ to $t_{22}$. More specifically, by making the reset signal $S_{TR}$ high level in the period of time $t_{21}$ to $t_{22}$ to turn on the transistor (TRR, TRL) for resetting, in FIG. 26, the third accumulation region FDR, FDL is connected to the power supply potential, and then the transistor (TRR, TRL) is turned off.

Thereafter, by making the transfer signal $S_{TG}$ high level in a period of time $t_{23}$ to $t_{24}$ to turn on the transistor (TGR, TGL) for a signal transfer in FIG. 26, the carriers accumulated in the charge buffer region BR, BL are transferred to the third accumulation region FDR, FDL to apply a voltage according to the accumulated charge amount to a gate electrode of the transistor FET1, FET2.

Next, by turning on the transistor SEL (see FIG. 26) serving as a selector switch after this measurement period $T_F$ ends or at an appropriate time in the next measurement period $T_F$, the potential $\phi_{FD}$ is detected.

In the above, a distance image measurement has been performed by applying a right pulse signal $S_R$ and a left pulse signal $S_L$ that are out of phase with each other by 180 degrees to a pair of gate electrodes, respectively. In the following, description will be given of an example of performing a distance image measurement by applying four pulse signals that are out of phase with each other by 90 degrees (phase=0 degrees, 90 degrees, 180 degrees, 270 degrees) each to four gate electrodes for carrier distribution.

Figure 29:
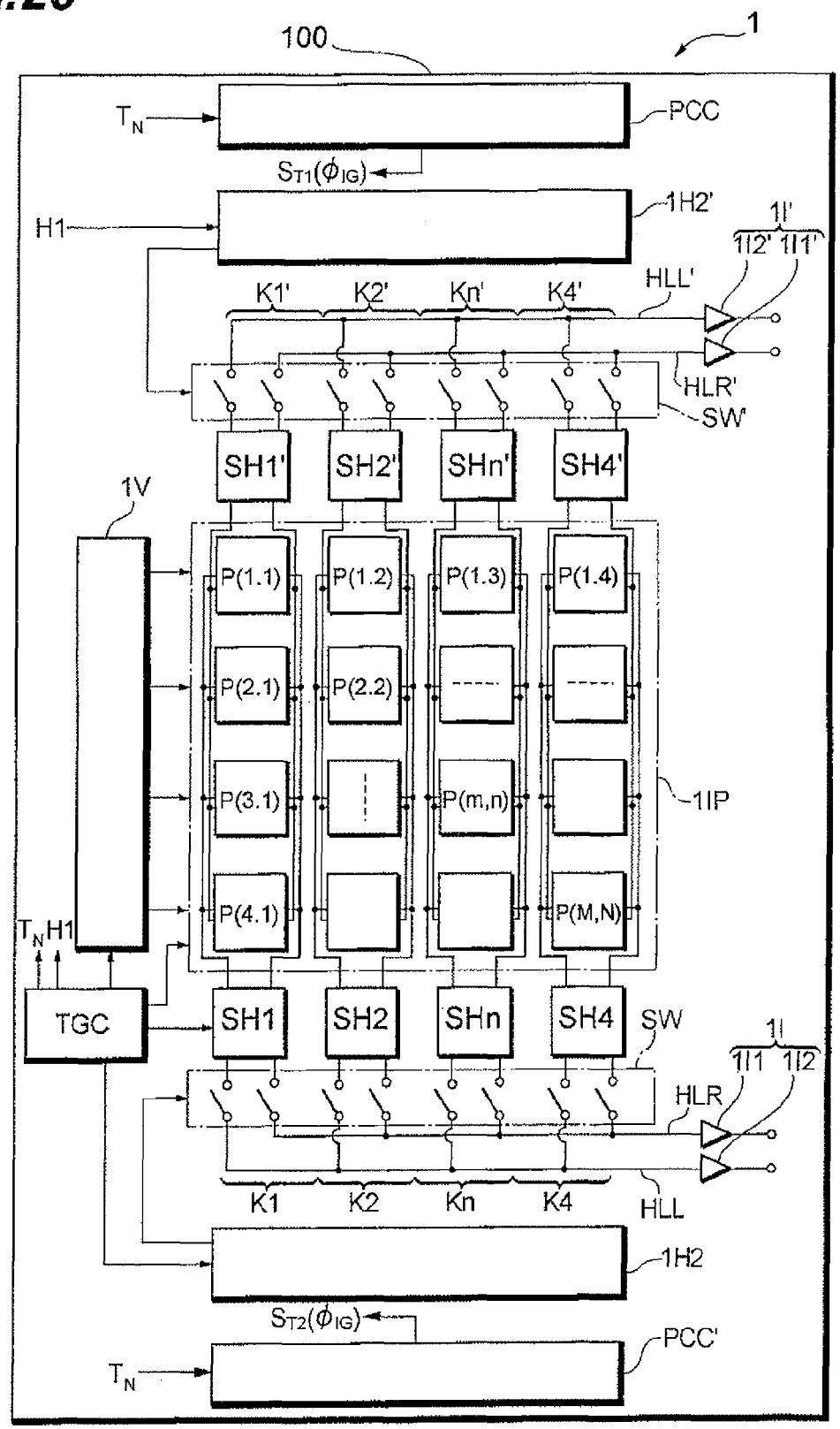
FIG. 29 is a plan view of a solid state imaging element 1 having four gate electrodes for carrier distribution per one pixel.

FIG. 29 is a plan view of a solid state imaging element 1 having four gate electrodes for carrier distribution per one pixel.

On one region of the semiconductor substrate 100, distance information readout circuits K1, K2, Kn, and K4 are provided. The distance information readout circuits Kn include a readout switch group SW to be switched by the horizontal shift register 1H2, and Sample holding circuits SHn provided for each pixel column.

On a region of the semiconductor substrate 100 opposite from the distance information readout circuits Kn across the imaging region 1IP, distance information readout circuits K1', K2', Kn', and K4' are provided. The distance information readout circuits Kn' include a readout switch group SW' to be switched by the horizontal shift register 1H2', and Sample holding circuits SHn' provided for each pixel column.

The timing generation circuit TGC generates various timing signals in response to an input drive signal. For simplification of description, although a timing generation circuit TGC is also arranged on the semiconductor substrate 100, the timing generation circuit TGC may be provided separately from the semiconductor substrate 100.

The background light elimination circuit PCC, when the background light detection signal $T_N$ is on, performs detection of a background light, holds a value generated by the detection, and thereafter outputs a potential control voltage $\phi_{IG}$ ($=\phi_{IGR}$, $\phi_{IGL}$) as a transfer signal $S_{T1}$ to the pair of right and left second gate electrodes IG (IGR, IGL) in the pixel.

The background light elimination circuit PCC', when the background light detection signal $T_N$ is on, performs detection of a background light, holds a value generated by the detection, and thereafter outputs a potential control voltage $\phi_{IG}$ ($=\phi_{IGF}$, $\phi_{IGB}$) as a transfer signal $S_{T2}$ to the pair of front and back second gate electrodes IG (IGF, IGB) in the pixel.

The horizontal shift register 1H2 is a register formed by connecting flip-flops, and the switch group SW is turned on for each pixel column in response to a control signal input from the timing generation circuit TGC. The foregoing charge amount Q1, Q2 is output from each pixel P(m, n) corresponding to the right and left gate electrodes. The switches composing the switch group SW are interposed between a right horizontal line HLR for reading out a value of the charge amount Q1 and a left horizontal line DLL for reading out a value of the charge amount Q2, and by turning on these switches by the horizontal shift register 1H2, the value of the charge amount Q1 held in the Sample holding circuit SHn is output to the outside via the right horizontal line HLR and an output buffer 1I1, and the value of the charge amount Q2 held in the Sample holding circuit SHn is output to the outside via the left horizontal line FILL and an output buffer 1I2.

The horizontal shift, register 1H2' is a register formed by connecting flip-flops, and the switch group SW' is turned on for each pixel column in response to a control signal H1 input from the timing generation circuit TGC. The charge amount Q3, Q4 is output from each pixel P(m, n) corresponding to the front and back gate electrodes. The switches composing the switch group SW' are interposed between a right horizontal line HLR' for reading out a value of the charge amount Q3 and a left horizontal line HLL' for reading out a value of the charge amount Q4, and by turning on these switches by the horizontal shift register 1H2', the value of the charge amount Q3 held in the Sample holding circuit SHn' is output to the outside via the right horizontal line HLR' and an output buffer 1I1', and the value of the charge amount Q4 held in the Sample holding circuit SHn' is output to the outside via the left horizontal line HLL' and an output buffer 1I2'.

Prior to accumulation of the charge amount Q1, Q2, Q3, Q4, detection of a background light is performed. The timing generation circuit TGC generates a background light detection signal $T_N$ in synchronization with an input trigger signal. The background light detection signal $T_N$ is input to the background light elimination circuit PCC and the background light elimination circuit PCC'. In addition, the background light elimination circuit PCC and the background light elimination circuit PCC' are the same in structure, and it is also possible to use one background light elimination circuit as both these circuits.

Figure 30:
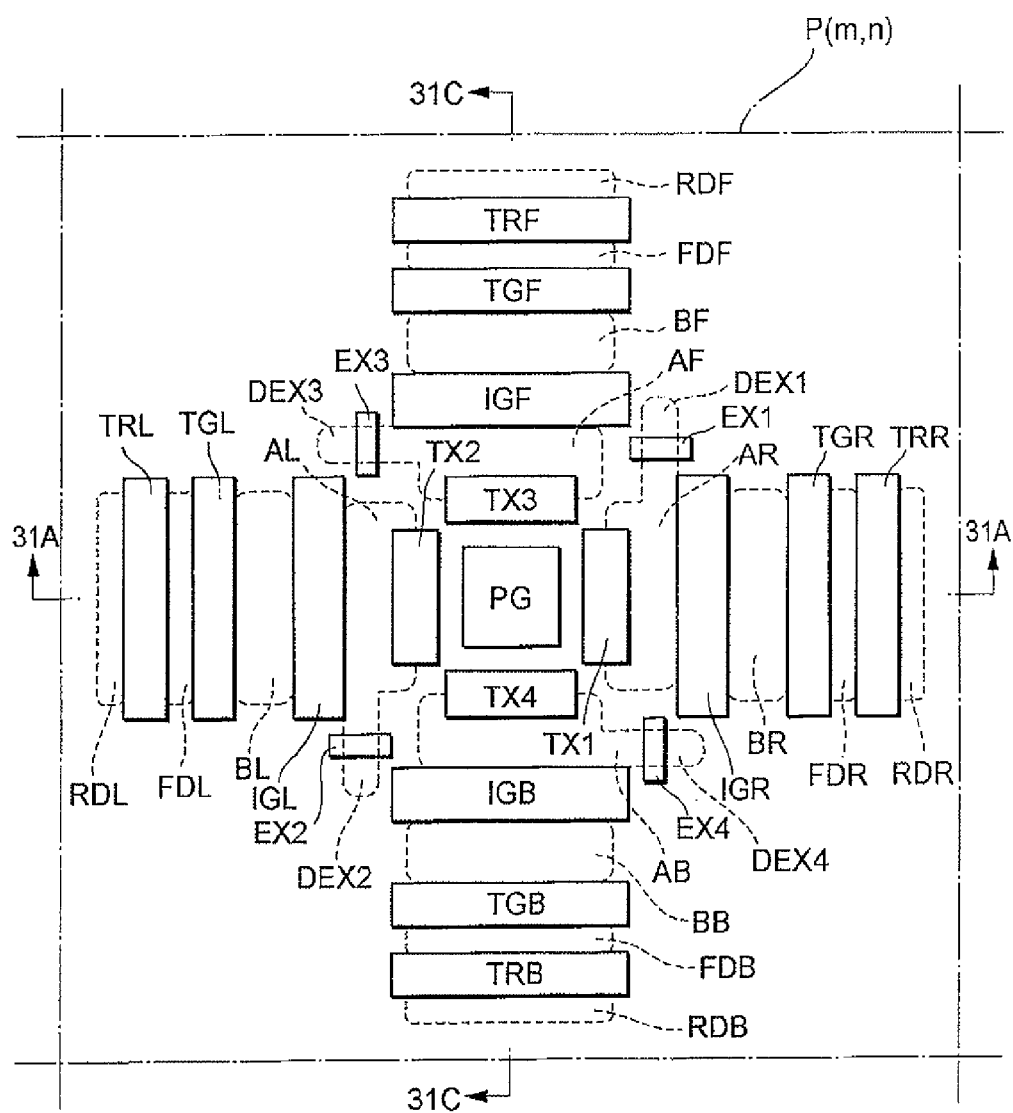
FIG. 30 is a plan view of the pixel P(m, n) shown in FIG. 29.

FIG. 30 is a plan view of the pixel P(m, n) shown in FIG. 29. FIG. 31 are a sectional view (FIG. 31(A)) taken along arrows 31A-31A in FIG. 30, a potential diagram (FIG. 31(B)) in a semiconductor at no bias in the sectional view of FIG. 31(A), a sectional view (FIG. 31(C)) taken along arrows 31C-31C in FIG. 30, and a potential diagram (FIG. 31(D)) in a semiconductor at no bias in the sectional view of FIG. 31(C).

The structure of the longitudinal sectional view (FIG. 31(A)) in the right and left direction and the potential diagram (FIG. 31(B)) are the same as those shown in FIG. 23, and thus description thereof will be omitted. Although, in the plan view of FIG. 30, the width in the front and back direction of the third accumulation region FDR, FDL and a region outside thereof is wider than that shown in FIG. 23, this may be the same as in the structure shown in FIG. 23.

The structure of the longitudinal sectional view (FIG. 31(C)) in the front and back direction and the potential diagram (FIG. 31(D)) are the same as those in the right and left direction, but signs of the elements are different, and thus description will be given in the following. In addition, the right and left direction and the front and back direction are each parallel to an exposed surface of the semiconductor substrate 100, vertical to a thickness direction of the semiconductor substrate 100, and the right and left direction and the front and back direction are orthogonal to each other.

On both sides of the pixel electrode PG, a pair of first gate electrodes TX3 and TX4 are arranged on the insulating layer 101. On the outside of the first gate electrodes TX3, TX4, a pair of first accumulation regions AF and AB provided in the semiconductor substrate 100 are located. Further, on the outside of the first accumulation regions AF, AB, a pair of charge buffer regions (second accumulation regions) BF and BB provided in the semiconductor substrate 100 are located. Above a region between the first accumulation regions AF, AB and the charge buffer regions BF, BB, second gate electrodes IGF, IGB are respectively located on the insulating layer 101.

In the semiconductor substrate 100, a pair of third accumulation regions FDF and FDB are provided on the outside of the charge buffer regions BF, BB. The first accumulation region AF, AB, the charge buffer region BF, BB, and the second accumulation region FDF, FDB are each formed of an n-type semiconductor region.

Above a semiconductor region between the charge buffer regions BF, BB and the third accumulation regions FDF, FDB, a pair of third gate electrodes TRF and TRB are arranged on the insulating layer 101. The third gate electrodes TRF, TRB are arranged on the semiconductor substrate 100 so as to control the height of the second potential barriers $\phi_G$ each interposed between the charge buffer regions BF, BB and the third accumulation regions FDF, FDB. The second potential barrier $\phi_G$ is given by a difference between the potential $\phi_{BF}$, $\phi_{BB}$ of the charge buffer region BF, BB and the potential $\phi_{TGF}$, $\phi_{TGB}$ of a semiconductor directly below the third gate electrode TRF, TRB.

The method for accumulating carriers in the first accumulation regions AF, AB in the front and back direction and the charge buffer regions BF, BB serving as the second accumulation regions is the same as the method for accumulating carriers in the first accumulation regions AR, AL in the right and left direction and the charge buffer regions BR, BL, and adjusting the potential $\phi_{IGF}$, $\phi_{IGB}$ between these according to the background light intensity allows accumulating carriers (charge amounts Q3, Q4) due to a reflected light of a probe light in the charge buffer regions BF, BB serving as the second accumulation regions.

By lowering the height of the second potential barrier $\phi_G$ to carriers, the carriers accumulated in the charge buffer regions BF, BB are transferred to the third accumulation regions FDF, FDB, and then the height of the second potential barrier $\phi_G$ is increased, and with the carriers held in the third accumulation regions FDF, FDB, the application potentials to the first gate electrodes TX3, TX4, the second gate electrodes IGF, IGB, and the third gate electrodes TRF, TRB are controlled so that carriers are alternately accumulated in the pair of the first accumulation regions AF and AB. In order to raise (deepen) the potential, it suffices to raise the potential to be applied to each gate electrode.

The pixel P(m, n) includes carrier discharge regions DEX3, DEX4 adjacent to the first accumulation regions AF, AB, respectively. More specifically, carriers corresponding to the background light component remain to be accumulated in the first accumulation regions AF, AB, and the accumulated carriers are discharged to the outside via the carrier discharge regions DEX3, DEX4. The carrier discharge regions DEX3, DEX4 are formed of an n-type semiconductor.

Above a semiconductor region between the front first accumulation region AF and the carrier discharge region DEX3, the gate electrode EX3 for a carrier discharge is located on the insulating layer 101, and when a positive potential is applied to the front gate electrode EX3, carriers accumulated in the first accumulation region AF flow in the carrier discharge region DEX3, and are output to the outside via wiring electrically connected to the carrier discharge region DEX3.

Above a semiconductor region between the back first accumulation region AB and the carrier discharge region DEX4, the gate electrode EX4 for a carrier discharge is located on the insulating layer 101, and when a positive potential is applied to the gate electrode EX4, carriers accumulated in the first accumulation region AB flow in the carrier discharge region DEX4, and are output to the outside via wiring electrically connected to the carrier discharge region DEX4.

Outside of the third accumulation regions FDF, FDB, reset drain regions RDF, RDB formed of a pair of n-type semiconductor regions are provided, and above a semiconductor region between the third accumulation region FDF, FDB and the reset drain region RDF, RDB, the gate electrode TRF, TRB for resetting is provided on the insulating layer 101. The potential $\phi_{TRF}$, $\phi_{TRB}$ of a semiconductor region directly below the gate electrode TRF, TRB is deepened as a result of applying a positive potential to the gate electrode TRF, TRB, and the third accumulation region FDF, FDB and the reset drain region RDF, RDB are connected to each other. Although the reset drain region RDF, RDB is connected to the power supply potential, the reset drain region RDF, RDB has a potential $\phi_{RDF}$, $\phi_{RDB}$ at no bias.

Figure 32:
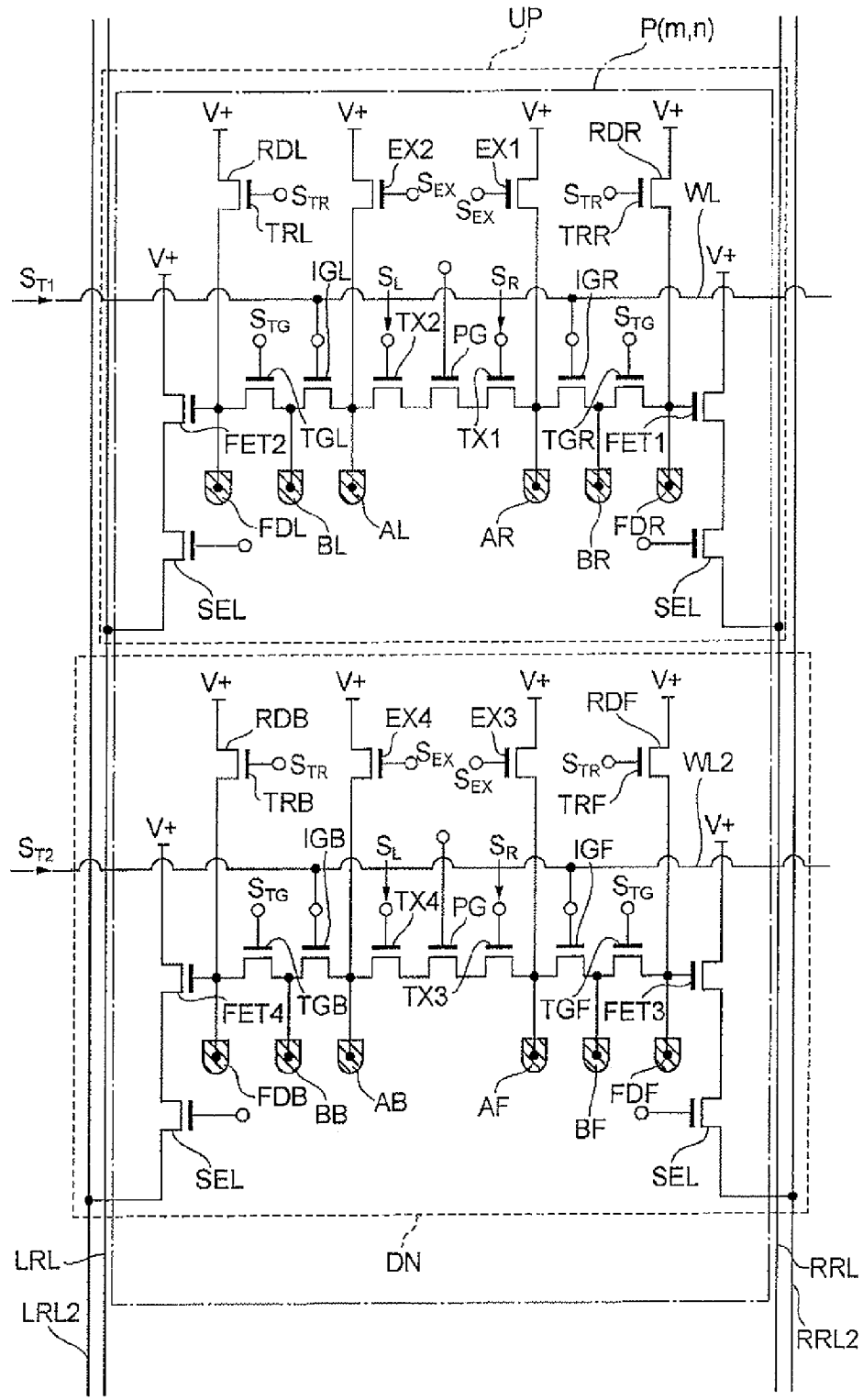
FIG. 32 is a circuit diagram of the pixel P(m, n) shown in FIG. 30.

FIG. 32 is a circuit diagram of the pixel P(m, n) shown in FIG. 30.

A transistor having each gate electrode is denoted using a sign of a corresponding gate electrode in parentheses. Moreover, a side to which carriers flow in at readout of carriers is set to a source of the transistor, and a side from which carriers flow out is set to a drain.

An upper half circuit structure UP in FIG. 32 and its function are the same as those shown in FIG. 26, and thus description will be omitted. The structure of a lower half circuit structure DN and its function are the same as the upper half circuit structure UP and its function, except for the phase at charge distribution. In the following, description will be given of the lower half circuit structure DN of FIG. 32.

One end of a transistor containing a pixel electrode PG is connected to a source of an NMOS transistor containing a gate electrode TX3, and a drain of the NMOS transistor (TX3) is connected to a first accumulation region AF, a source of an NMOS transistor (IGF), and a source of a carrier discharging transistor (EX3), and a drain of the NMOS transistor (EX3) for a carrier discharge is connected to a power supply potential V+. The first accumulation region AF is connected to the source of the NMOS transistor (IGF) for background light component elimination, and a drain of the NMOS transistor (IGF) is connected to a charge buffer region BF.

The charge buffer region BF is connected to a source of an NMOS transistor (TGF). A drain of the transistor (TGF) is connected to a third accumulation region FDF, a source of an NMOS transistor (TRF) for resetting, and a gate electrode of a PMOS transistor FET3. A drain region RDF of the transistor (TRF) is connected to a power supply potential V+. Moreover, a source of the PMOS transistor FET3 is connected to a power supply potential V+, and a drain thereof is connected to a right PMOS transistor SEL for output selection.

Moreover, a gate electrode IGF of the transistor (IGF) is input with a transfer signal $S_{T2}(=\phi_{IGF})$ of carriers via a common line WL2. Meanwhile, in the upper half circuit structure UP, a gate electrode IGR of the transistor (IGR) is input with a transfer signal $S_{T1}(=\phi_{IGR})$ of carriers via a common line WL.

The drain of the right transistor SEL of the lower half circuit structure DN is connected to a right vertical readout line RRL2. To the vertical readout line RRL2, a current corresponding to the charge amount Q3 to be accumulated in the third accumulation region FDF flows in. In addition, the third accumulation region FDF is connected to the power supply potential V+ by turning on the transistor (TRF), and the accumulated charge is reset. In addition, to a gate electrode TRF of the transistor (TRF), a reset signal $S_{TR}$ is applied. Moreover, to a gate electrode EX3 of the charge discharging transistor (EX3), a discharge signal $S_{EX}$ is applied. In addition, the power supply potentials V+ are different in size from each other according to the design.

The other end of the transistor containing the pixel electrode PG is connected to a source of an NMOS transistor containing a gate electrode TX4, and a drain of the NMOS transistor (TX4) is connected to a first accumulation region AB, a source of an NMOS transistor (IGB), and a source of a carrier discharging transistor (EX4), and a drain of the NMOS transistor (EX4) for a carrier discharge is connected to a power supply potential V+. The first accumulation region AB is connected to the source of the NMOS transistor (IGB) for background light component elimination, and a drain of the NMOS transistor (IGB) is connected to a charge buffer region BB.

The charge buffer region BB is connected to a source of an NMOS transistor (TGB). A drain of the transistor (TGB) is connected to a third accumulation region FDB, a source of an NMOS transistor (TRB) for resetting, and a gate electrode of a PMOS transistor FET4. A drain region RDB of the transistor (TRB) is connected to a power supply potential V+. Moreover, a source of the PMOS transistor FET4 is connected to a power supply potential V+, and a drain thereof is connected to a left PMOS transistor SEL for output selection.

Moreover, a gate electrode IGB of the transistor (IGB) is input with a transfer signal $S_{T2}(=\phi_{IGB})$ of carriers via the common line WL2. Meanwhile, in the upper half circuit structure UP, a gate electrode IGL of the transistor (IGL) is input with a transfer signal $S_{T1}(=\phi_{IGL})$ of carriers via the common line WL. The transfer signal $S_{T1}$ and the transfer signal $S_{T2}$ are different in the timing of becoming high level, but are the same in size. In addition, the transfer signal $S_{T1}$ is the same as the foregoing transfer signal $S_T$.

A drain of the left transistor SEL in the circuit structure DN is connected to a left vertical readout line LRL2. To the vertical readout line LRL2, a current corresponding to the charge amount Q4 to be accumulated in the third accumulation region FDB flows in. In addition, the third accumulation region FDB is connected to the power supply potential V+ by turning on the transistor (TRB), and the accumulated charge is reset. In addition, to a gate electrode TRB of the transistor (TRB), a reset signal $S_{TR}$ is applied. To a gate electrode EX4 of the charge discharging transistor (EX4), a discharge signal $S_{EX}$ is applied. In addition, the power supply potentials V+ are different in size from each other according to the design.

Moreover, for performing charge distribution, to the pair of first gate electrodes TX3 and TX4, a front pulse signal $S_F$ and a back pulse signal $S_B$ are input, respectively. The front pulse signal $S_F$ and the back pulse signal $S_B$ are the same as the right pulse signal $S_R$ and the left pulse signal $S_L$, respectively, except for the timing applied to the first gate electrodes TX3, TX4. More specifically, the relationship between the first gate electrodes TX3, TX4 and the front pulse signal $S_F$ and the back pulse signal $S_B$ is equal to the relationship between the first gate electrodes TX1, TX2 and the right pulse signal $S_R$ and the left pulse signal $S_L$.

After detecting a background light, by simultaneously applying the transfer signal $S_{T2}$ to the gate electrodes IGF and IGB, the potential barrier $\phi_{BG}$ is lowered as described above to accumulate carriers corresponding to the reflected light in the charge buffer region BF, BB. The carriers accumulated in the charge buffer region BF, BB are, by simultaneously applying a high-level transfer signal $S_{TG}$ to the gate electrodes TGF and TGB, transferred into the third accumulation region FDF, FDB, and thereafter, the level of the transfer signal $S_{TG}$ is made low level to increase the height of the foregoing potential barrier $\phi_G$ to carriers, so as to isolate the carriers accumulated in the third accumulation region FDF, FDB from the charge buffer region BF, BB.

At a transfer of carriers, the third accumulation region FDF, FDB is at a floating level, and in proportion to the negative charge amount Q3, Q4 having flowed in each thereof, a current that flows through the transistor FET3, FET4 is determined. When a signal to turn on the transistor SEL for selection is input from a vertical shift register, according to an input gate voltage of FET3, FET4, a current corresponding to each charge amount Q3, Q4 flows to the vertical readout line RRL2, LRL2.

For setting the third accumulation region FDF, FDB to a floating level, it suffices to turn on the transistor (TRF, TRB) for resetting to connect the third accumulation region FDF, FDB to the power supply potentials V+ and then turn off the transistor (TRF, TRB).

Figure 33:
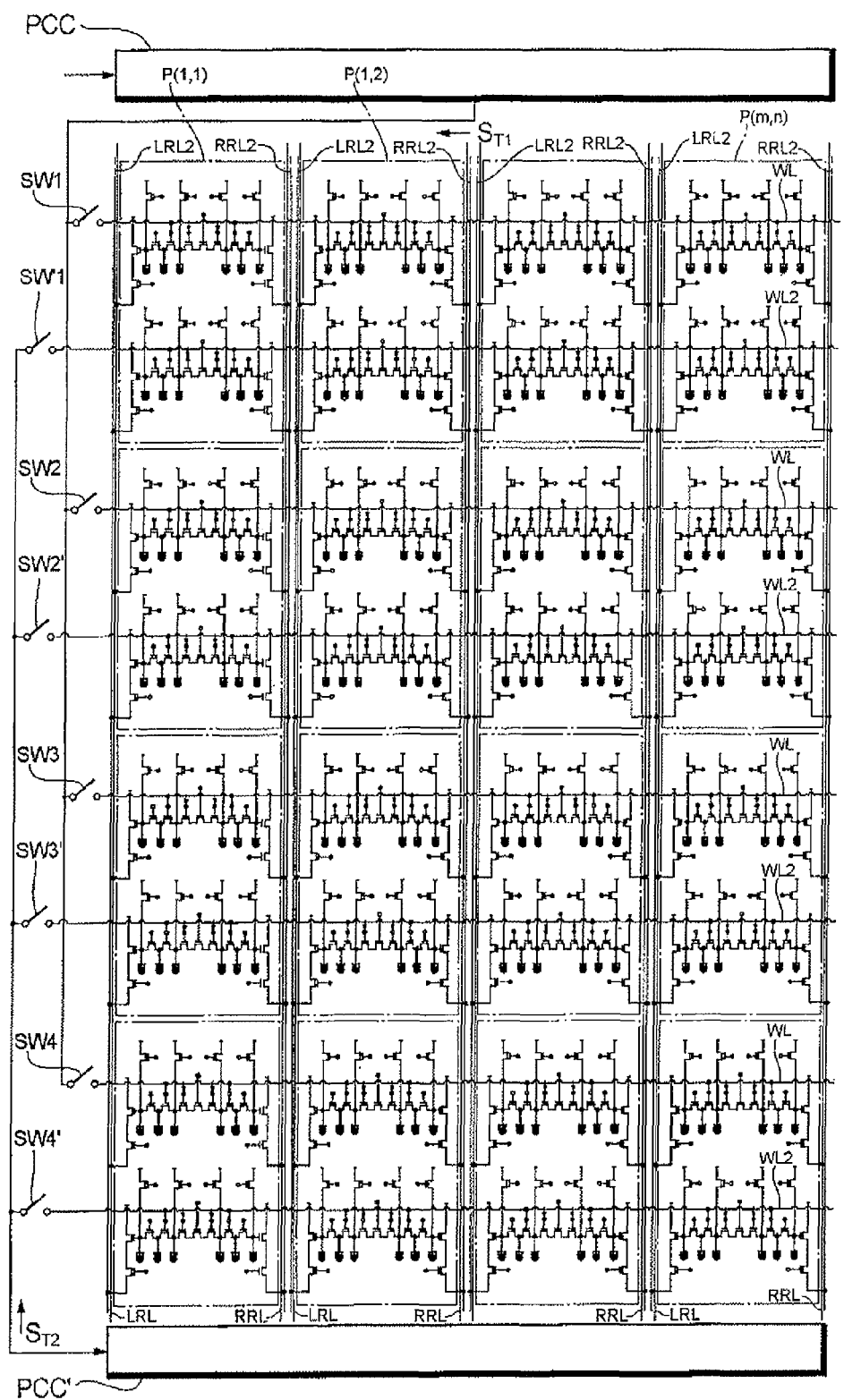
FIG. 33 is a circuit diagram of a solid state imaging element 1 formed by arraying the pixels P(m, n) shown in FIG. 32.

FIG. 33 is a circuit diagram of the solid state imaging element 1 formed by arraying the pixels P(m, n) shown in FIG. 32.

The transfer signal $S_{T1}(\phi_{IG})$ output from the background light elimination circuit PCC is input to the common line WL of each pixel row, via a switch SW1, SW2, SW3, SW4 provided for each pixel row, to simultaneously turn on the second gate electrodes IGR and IGL for each pixel row. The common line WL is common in one pixel row.

The transfer signal $S_{T2}(\phi_{IG})$ output from the background light elimination circuit PCC' is input to the common line WL2 of each pixel row, via a switch SW1', SW2', SW3', SW4' provided for each pixel row, to simultaneously turn on the second gate electrodes IGF and IGB for each pixel row. The common line WL2 is common in one pixel row.

In addition, when the switches SW1, SW2, SW3, and SW4 (SW1', SW2', SW3', and SW4') are simultaneously turned on, carriers can be simultaneously transferred to the second accumulation regions in all pixels. More specifically, when there is one reference background light component in one measurement cycle, it suffices to turn on the switches SW1, SW2, SW3, and SW4 (SW1', SW2', SW3', and SW4') simultaneously. By thus turning on the switches SW1, SW2, SW3, and SW4 (SW1', SW2', SW3', and SW4') simultaneously or by not providing switches, the measurement cycle of distance images can be shortened. Moreover, as will be described later, when self-reference type background light detection is performed, it suffices to, for example, sequentially generate a transfer signal $S_T$ of each pixel row from a background light component detected for each pixel row and turn on the switches SW1, SW2, SW3, and SW4 (SW1', SW2', SW3', and SW4') in order to thereby input the generated transfer signal $S_T$ to each corresponding pixel row.

Figure 34:
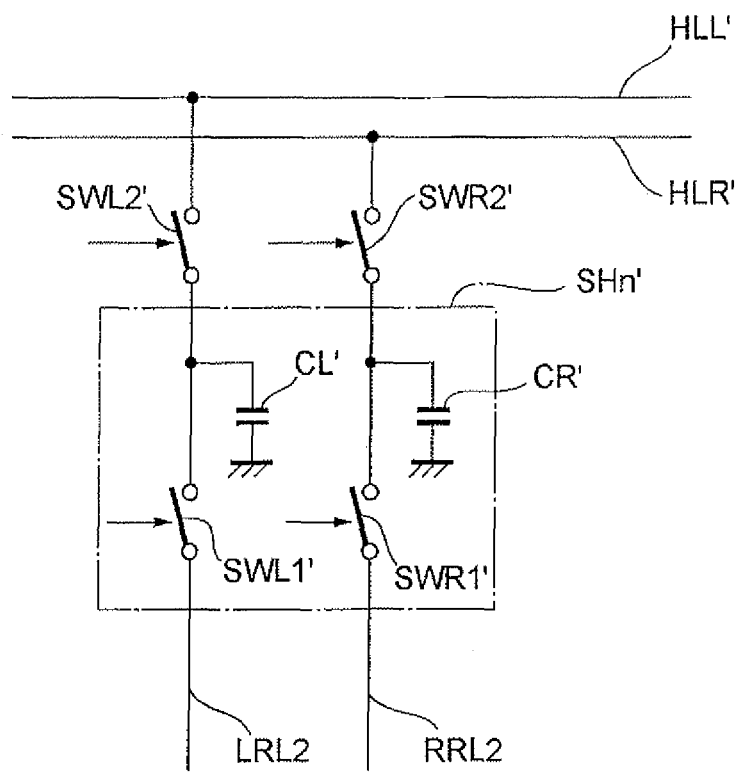
FIG. 34 is a circuit diagram of a Sample holding circuit SHn' shown in FIG. 29.

FIG. 34 is a circuit diagram of the Sample holding circuit SHn' shown in FIG. 29.

From each pixel column, a current proportional to the charge amount Q3, Q4 sequentially flows via the vertical readout line RRL2, LRL2, and flows to a ground via a load (not shown), so that the potential of the vertical readout line RRL2, LRL2 is proportional to the charge amount Q3, Q4. This voltage, by simultaneously turning on switches SWR1' and SWL1' for only the same period of time, is applied to the capacitor CR', CL', and charges depending on the voltage are respectively accumulated. More specifically, a charge of a value proportional to the charge amount Q3, Q4 is accumulated in the capacitor CR', CL', and generated at both ends thereof is a voltage proportional to the accumulated charge amount. By driving a horizontal shift register to turn on a switch SWR2', SWL2' of a subsequent stage of the capacitor CR', CL', a voltage proportional to the charge amount accumulated in the capacitor CR', CL' is read out from each horizontal line HLR', HLL'.

Figure 35:
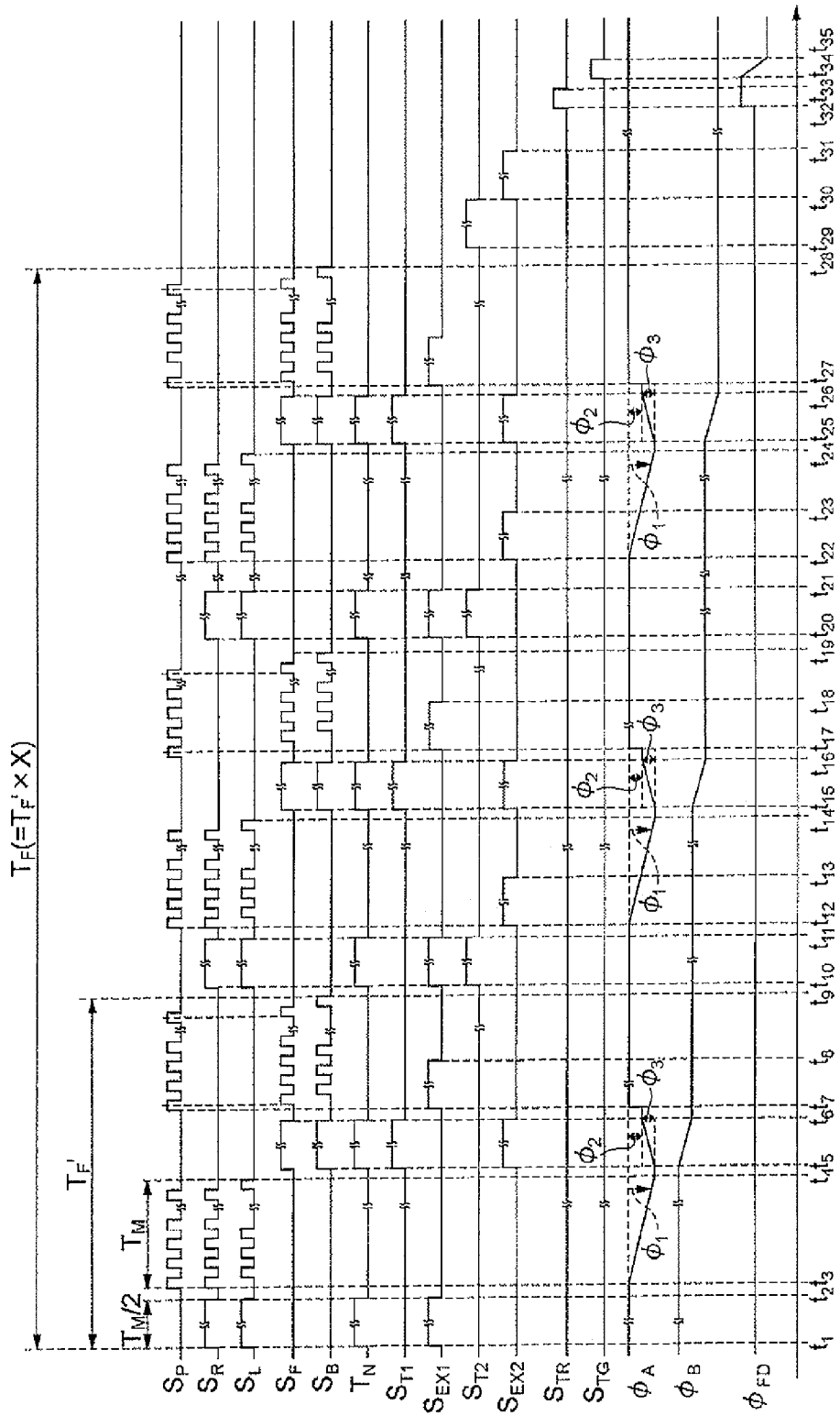
FIG. 35 is a timing chart of a solid state imaging device.

FIG. 35 is a timing chart of the above-mentioned solid state imaging device.

In a measurement period $T_F$ of signals in one pixel, the timings of signals excluding $S_F$, $S_B$, $S_{T2}$, and $S_{EX2}$ are the same as those shown in FIG. 28, and thus description thereof will be omitted if necessary. In addition, the signals $S_{T1}$ and $S_{EX1}$ in the figure are denoted as $S_T$ and $S_{EX}$ in FIG. 28. Moreover, the potentials $\phi_A$, $\phi_B$, and $\phi_{FD}$ representatively show potentials $\phi_{AR}$, $\phi_{AL}$, $\phi_{BR}$, $\phi_{BL}$, and $\phi_{FDR}$, $\phi_{FDL}$ in the right and left direction.

After distribution of carriers in the right and left direction within one pixel ends (time $t_4$), the transfer signal $S_{T1}$ is on during time $t_5$ to $t_6$ to transfer a signal from a first accumulation region to a signal buffer region thereof. In addition, during this time $t_5$ to $t_6$, a background light for distribution of carriers in the front and back direction is detected ($T_N$=ON). In addition, during this time $t_5$ to $t_6$, the front pulse signal $S_F$ and the back pulse signal $S_B$ are both made high level to transfer carriers from a light-sensitive area into the first accumulation region, and the discharge signal $S_{EX2}$ is made high level to simultaneously discharge these carriers.

In a period of time $t_7$ to $t_9$, the foregoing M times of detection is performed with regard to a carrier distribution in the front and back direction. At this time, the carrier discharging signal $S_{EX2}$ has been made low level (transistor OFF), and the potential $\phi_{AF}$, $\phi_{AB}$ (see FIG. 31) of the first accumulation region declines with an elapse of time. In addition, the discharge signal $S_{EX1}$ in the right and left direction is turned on (time $t_7$ to $t_8$) in the distribution period of a pulse light in the front and back direction (time $t_7$ to $t_9$) to discharge carriers of a background light component remaining in the first accumulation region in the right and left direction to the outside.

After accumulating carriers in the first accumulation region in the front and back direction, the potential barrier $\phi_{IG}$ is lowered according to the amount of the background light. More specifically, the transfer signal $S_{T2}$ is made high level (potential $\phi_{IG}$) for a period of time $t_{10}$ to $t_{11}$ to transfer carriers to the charge buffer region. As a result, electrons flow into the charge buffer region from the first accumulation region, so that the potential $\phi_{AF}$, $\phi_{AB}$ from which electrons have flowed out is raised, and the potential $\phi_{BF}$, $\phi_{BB}$ to which electrons have flowed in is lowered (see FIG. 31).

A detection cycle period from time $t_1$ to time $t_9$ is provided as $T_F'$. After time $t_9$, the signal $S_{EX1}$ for a carrier discharge in the right and left direction is made high level (transistor ON) for a period of time $t_{10}$ to $t_{11}$ to discharge carriers remaining in the first accumulation region, while shifting to a next detection cycle period. In a period where a carrier distribution in the right and left direction is performed in the next detection cycle, the signal $S_{EX2}$ for a carrier discharge in the front and back direction is made high level (transistor ON) for a period of time $t_{12}$ to $t_{13}$ to discharge carriers remaining in the first accumulation region. In addition, for every detection cycle period $T_F'$, electrons are integrated and accumulated in the charge buffer region, and the potential $\phi_{BR}$, $\phi_{BL}$, $\phi_{BF}$, $\phi_{AF}$, $\phi_{BB}$ thereof sequentially declines.

In the present example, after executing X times of detection cycle periods $T_F'$, the third accumulation region FDR, FDL, FDF, FDB serving as a floating diffusion region is reset in time $t_{32}$ to $t_{33}$. More specifically, by making the reset signal $S_{TR}$ high level in the period of time $t_{32}$ to $t_{33}$ to turn on the transistor (TRR, TRL, TRF, TRB) for resetting in FIG. 32, the third accumulation region FDR, FDL, FDF, FDB is connected to the power supply potential, and then the transistor (TRR, TRL, TRF, TRB) is turned off.

Thereafter, by making the transfer signal $S_{TG}$ high level in a period of time $t_{34}$ to $t_{35}$ to turn on the transistor (TGR, TGL, TGF, TGB) for a signal transfer in FIG. 32, the carriers accumulated in the charge buffer region BR, BL, BF, BB are transferred to the third accumulation region FDR, FDL, FDF, FDB to apply a voltage according to the accumulated charge amount to a gate electrode of the transistor FET1, FET2, FET3, FET4.

Next, by turning on the transistor SEL (see FIG. 32) serving as a selector switch after this measurement period $T_F$ ends or at an appropriate time in the next measurement period $T_F$, the potential $\phi_{FDR}$, $\phi_{FDL}$, $\phi_{FDF}$, $\phi_{FDB}$ is detected.

In the above, the right pulse signal $S_R$ and the left pulse signal $S_L$ are out of phase with each other by 180 degrees, the front pulse signal $S_F$ and the back pulse signal $S_B$ are out of phase with each other by 180 degrees, and the right pulse signal $S_R$ and the front pulse signal $S_F$ are out of phase with each other by 90 degrees. More specifically, the phases of $S_R$, $S_L$, $S_F$, and $S_B$, with reference to the drive pulse signal $S_P$, are 0 degrees, 90 degrees, 180 degrees, and 270 degrees, respectively.

Figure 36:
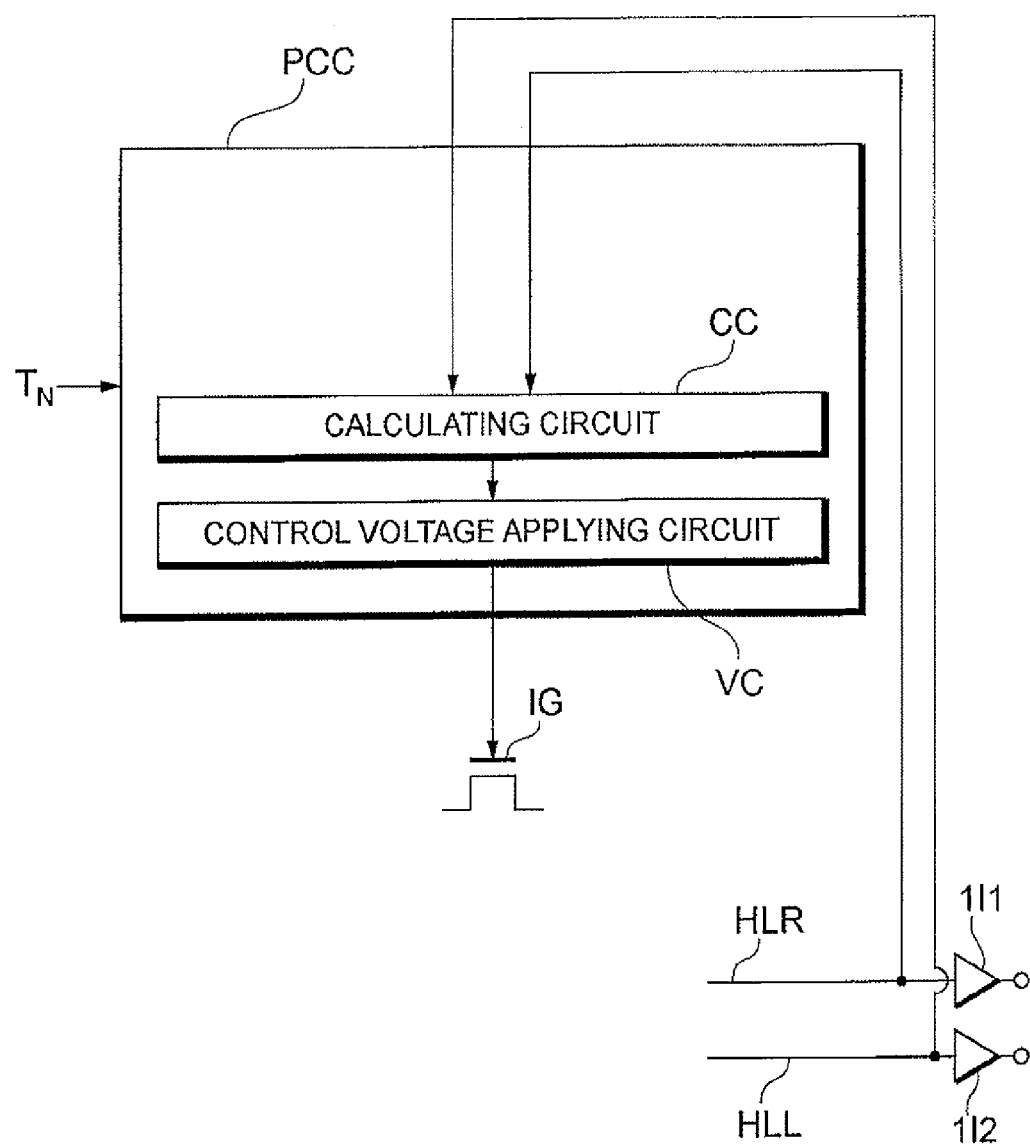
FIG. 36 is a block diagram showing a modification of a background light elimination circuit PCC.

FIG. 36 is a block diagram showing a modification of the background light elimination circuit PCC.

Output of the horizontal line HLR, HLL (or HLR', HLL'), at pulse detection, indicates the charge amount Q1, Q2 (or Q3, Q4), respectively, while at background light detection, a charge amount according to a background light component can be output. Accordingly, even when a detected background light component is input from the horizontal line HLR, HLL to the calculating circuit CC, as described above, the calculating circuit CC can convert the detection value β indicated by the background light component to a size of the potential barrier $\phi_{BG}$. The control voltage applying circuit VC inputs the potential $\phi_{IG}$ corresponding to the calculated potential barrier $\phi_{BG}$ to the second gate electrode IG (IGR, IGL (and IGF, IGB)).

In this configuration, the light-sensitive area SA shown in each sectional view of the pixel serves also as a photodetector PD, and this solid state imaging device includes a background light detection circuit (control means) PCC that outputs an application potential $\phi_{IG}$ to the second gate electrode IG (IGR, IGL (and IGF, IGB)) according to an output of the light-sensitive area SA.

More specifically, a background light is detected in the light-sensitive area SA, and if output of the detected background light is large, the application potential $\phi_{IG}$ to the second gate electrode IG (IGR, IGL (and IGF, IGB)) is controlled so that the height of the first potential barrier $\phi_{BG}$ is increased, and if output is small, the application potential $\phi_{IG}$ to the second gate electrode IG (IGR, IGL (and IGF, IGB)) is controlled so that the height of the first potential barrier $\phi_{BG}$ is reduced. This makes it unnecessary to provide photo-detection means separately, so that downsizing of the device is enabled.

Figure 37:
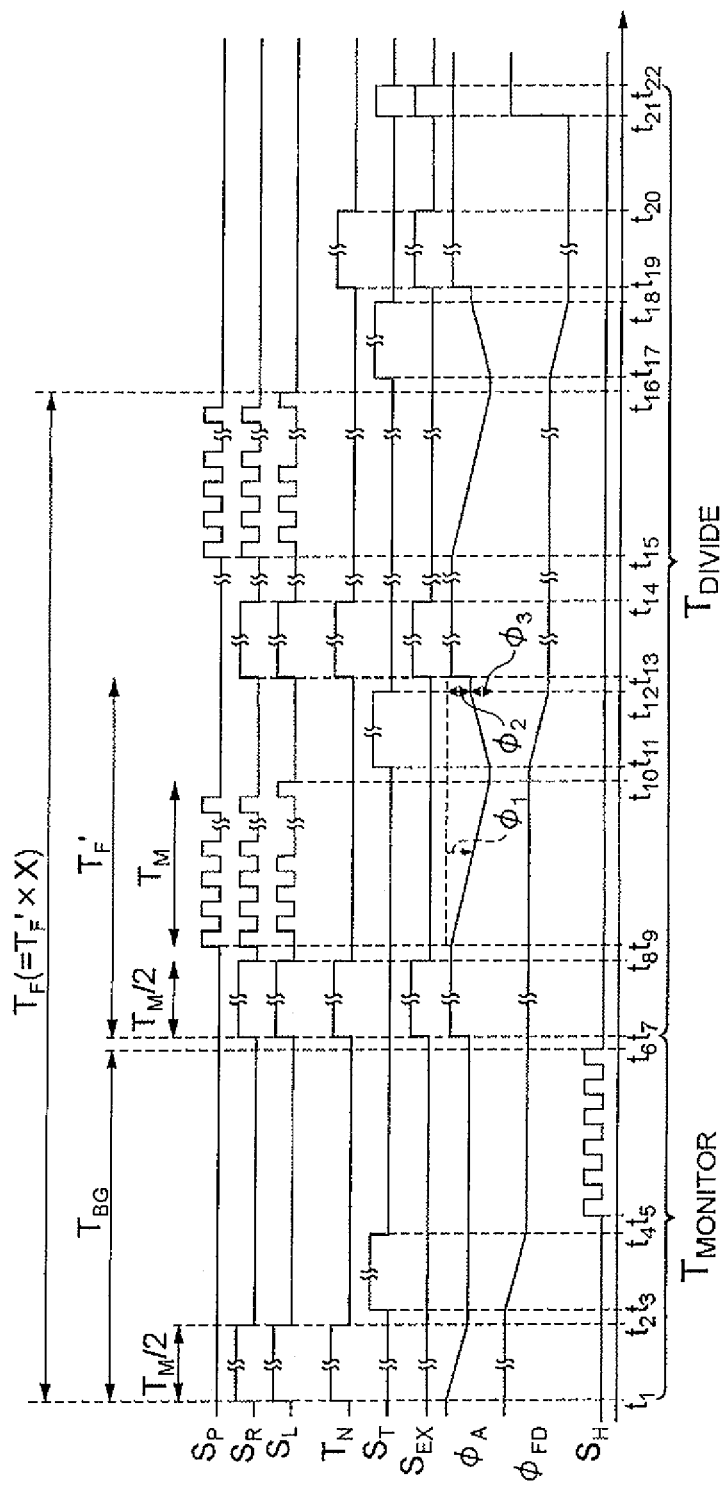
FIG. 37 is a timing chart of a solid state imaging device when self-reference type background light detection is performed.

FIG. 37 is a timing chart of a solid state imaging device when such self-reference type background light detection is performed. Description will be given of, as an example, a case of driving a pixel with the structure of FIG. 9.

Time $t_7$ onward in FIG. 37 is a pulse detection period $T_{DIVIDE}$ to perform a carrier distribution and transfer at pulse light irradiation, and although the timing of time $t_7$ onward in the figure is the same as the timing of $t_1$ onward in FIG. 16, a background light detection signal $T_N$ means to read-in, sample-hold, or calculates the value of a background light component detected in a background light detection period $T_{MONITOR}$ preceding the pulse detection period $T_{DIVIDE}$. In addition, time $t_1$ to $t_6$ in FIG. 37 is a background light detection period $T_{MONITOR}$.

In time $t_1$ to $t_2$ of the background light detection period $T_{MONITOR}$, a right pulse signal $S_R$, a left pulse signal $S_L$, and the background light detection signal $T_N$ are simultaneously made high level, and the potential $\phi_A$ of the first accumulation region is declined by electrons generated by photoelectric conversion. From time $t_3$ to time $t_5$, a normal transfer signal $S_T$ not depending on the light amount of a background light component is applied to the second gate electrode IG to transfer carriers to the second accumulation region so as to decline the potential $\phi_{FD}$ of the second accumulation region. Thereafter, in time $t_5$ to $t_6$, the transistor SEL serving as a selector switch is turned on by a readout signal $S_R$ to read out the potential $\phi_{FD}$ of the second accumulation region onto the horizontal line HLR, HLL. A plural number of pulses of the readout signal $S_H$ existing at this time means that a plural number of pixels are read out in time $t_5$ to $t_6$ by driving of the vertical shift register.

In the pulse detection period $T_{DIVIDE}$, according to the obtained background light component, the level of the transfer signal $S_T$ is adjusted to the application potential $\phi_{IG}$ calculated as described above, and this is applied to the second gate electrode IG (IGR, IGL) in time $t_{11}$ to time $t_{12}$. The background light component is thereby eliminated from the output signal. Because it suffices to perform this calculation by time $t_{11}$, a sufficient calculation time can be secured.

Thus, when self-reference type background light detection is performed, it suffices to sequentially generate a transfer signal $S_T$ of each pixel row from a background light component detected for each pixel row and turn on the switches SW1, SW2, SW3, and SW4 of FIG. 14 in order to thereby input the generated transfer signal $S_T$ to each corresponding pixel row. Thus performing a binning operation of a background light elimination allows shortening the measurement cycle of distance images. Moreover, this self-reference type background light detection can also be applied to another embodiment.

As in the above, in the foregoing distance image measurement device, which is a TOF type distance image measurement device that repeatedly irradiates light having a predetermined pulse width onto a subject and measures a three-dimensional distance image up to the subject based on a phase difference of the time of flight of the irradiated light, two outputs are obtained from one pixel by switching output lines at a predetermined timing to take a phase shift between emission timing of a irradiation light and reception timing of a reflected light as a difference of the two outputs, and a distance up to the subject is measured based on the two outputs. Further, because the influence of a background light component on a weak signal component can be simply eliminated at that time, it becomes possible to increase the number of pixels and lower the device price.

The invention claimed is:
1. A solid state imaging device comprising:
photo-detection means for detecting a background light; and
an imaging region comprising a plurality of pixels, the pixels receiving pulse light reflected by a surface of a target, the pulse light being emitted from a light source;
each of the pixels comprising:
a light-sensitive area provided in a semiconductor substrate;
a pair of first accumulation regions provided in the semiconductor substrate;
a pair of first gate electrodes provided on the semiconductor substrate so that potentials between the light-sensitive area and a pair of the first accumulation regions alternately ramp;
a pair of second accumulation regions provided in the semiconductor substrate, the second accumulation regions being floating diffusion regions; and
a pair of second gate electrodes that are provided on the semiconductor substrate so as to control the height of first potential barriers each interposed between the first accumulation region and the second accumulation region, and
the second gate electrode increases the height of the first potential barrier to carriers as a higher output of a background light is detected by the photo-detection means after the second accumulation region becomes a floating level by connecting the second accumulation region to a power supply potential,
the carriers flowing into the second accumulation region from the first accumulation region decreases when the height of the first potential barrier increases.

2. The solid state imaging device according to claim 1, comprising:

a pair of third accumulation regions provided in the semiconductor substrate; and a pair of third gate electrodes provided on the semiconductor substrate so as to control the height of second potential barriers each interposed between the second accumulation region and the third accumulation region, wherein by lowering the height of the second potential barrier to carriers, carriers accumulated in the second accumulation region are transferred to the third accumulation region, and then the height of the second potential barrier is increased, and with the carriers held in the third accumulation region, application potentials to the first, second, and third gate electrodes are controlled so that carriers are alternately accumulated in a pair of the first accumulation regions.

3. The solid state imaging device according to claim 1, wherein the light-sensitive area serves also as the photo-detection means, the solid state imaging device further comprising control means that outputs an application potential to the second gate electrode according to an output of the light-sensitive area.

4. A distance image measurement device comprising:

the solid state imaging device according to claim 1;

the light source for emitting the pulse light being in synchronization with applied potentials to the first gate electrodes; and a calculating circuit for calculating a distance up to the target according to a charge amount of carriers output from a pair of the second accumulation regions.

* * * * *